(12) United States Patent
Ohnishi et al.

(10) Patent No.: US 9,746,768 B2
(45) Date of Patent: Aug. 29, 2017

(54) RESIST OVERLAYER FILM FORMING COMPOSITION FOR LITHOGRAPHY AND METHOD FOR PRODUCING SEMICONDUCTOR DEVICE USING THE SAME

(71) Applicant: NISSAN CHEMICAL INDUSTRIES, LTD., Tokyo (JP)

(72) Inventors: Ryuji Ohnishi, Toyama (JP); Rikimaru Sakamoto, Toyama (JP); Noriaki Fujitani, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/761,140

(22) PCT Filed: Jan. 24, 2014

(86) PCT No.: PCT/JP2014/051517
§ 371 (c)(1),
(2) Date: Jul. 15, 2015

(87) PCT Pub. No.: WO2014/115843
PCT Pub. Date: Jul. 31, 2014

(65) Prior Publication Data
US 2015/0362835 A1     Dec. 17, 2015

(30) Foreign Application Priority Data

Jan. 24, 2013   (JP) .................................. 2013-011439
Aug. 9, 2013    (JP) .................................. 2013-166269

(51) Int. Cl.
| | |
|---|---|
| G03F 7/11 | (2006.01) |
| H01L 21/027 | (2006.01) |
| G03F 7/004 | (2006.01) |
| C08G 16/02 | (2006.01) |
| C08G 8/14 | (2006.01) |
| G03F 7/09 | (2006.01) |
| G03F 7/32 | (2006.01) |
| G03F 7/20 | (2006.01) |
| G03F 7/095 | (2006.01) |

(52) U.S. Cl.
CPC .............. *G03F 7/004* (2013.01); *C08G 8/14* (2013.01); *C08G 16/025* (2013.01); *C08G 16/0268* (2013.01); *G03F 7/0046* (2013.01); *G03F 7/091* (2013.01); *G03F 7/20* (2013.01); *G03F 7/322* (2013.01); *G03F 7/325* (2013.01); *H01L 21/0274* (2013.01); *G03F 7/095* (2013.01)

(58) Field of Classification Search
CPC .... C08G 8/14; C08G 16/025; C08G 16/0268; G03F 7/11; G03F 7/091; G03F 7/0046
See application file for complete search history.

(56) References Cited

U.S. PATENT DOCUMENTS

| | | | | |
|---|---|---|---|---|
| 2005/0277059 A1* | 12/2005 | Kanda | ................... | G03F 7/2041 430/273.1 |
| 2006/0029884 A1* | 2/2006 | Hatakeyama | ......... | G03F 7/0046 430/270.1 |
| 2006/0036005 A1* | 2/2006 | Kanda | ................... | G03F 7/2041 524/55 |
| 2007/0275326 A1* | 11/2007 | Hatakeyama | ......... | G03F 7/2041 430/270.1 |
| 2012/0142193 A1* | 6/2012 | Ogihara | ................... | G03F 7/091 438/703 |
| 2012/0171613 A1* | 7/2012 | Sugie | ........................ | G03F 7/11 430/273.1 |
| 2013/0059252 A1* | 3/2013 | Maruyama | .............. | G03F 7/091 430/296 |
| 2013/0143162 A1* | 6/2013 | Hatakeyama | ........... | C08L 65/00 430/296 |
| 2013/0209940 A1* | 8/2013 | Sakamoto | ................ | C08G 8/08 430/319 |

FOREIGN PATENT DOCUMENTS

| | | | |
|---|---|---|---|
| EP | 1 950 610 A1 | * | 7/2008 |
| EP | 2 204 392 A1 | * | 7/2010 |
| JP | 2004-348133 A | | 12/2004 |
| JP | 2006-070244 A | | 3/2006 |

(Continued)

OTHER PUBLICATIONS

English translation of JP, 2007-199653 a, A (2007) from machine translation from AIPN Japan Patent Office National Center for Industrial Property Information and Training, generated Aug. 20, 2016, 49 pages.*
Mar. 18, 2015 Written Opinion in International Patent Application PCT/JP2014/051517.
Shimizu et al., "Development of Chemically Amplified EUV resist for 22 nm half pitch and beyond", 2011 International Symposium on EUVL, Oct. 2011 pp. 1-16.
La Fontaine et al., Extreme Ultraviolet (EUV) Lithography II, Proceedings of Spie, Feb. 2011, vol. 7696, 2011, pp. 796916-1 to 796916-10.
Mar. 18, 2014 International Search Report in International Patent Application in PCT/JP2014/051517.

*Primary Examiner* — Cynthia Hamilton
(74) *Attorney, Agent, or Firm* — Oliff PLC

(57) ABSTRACT

There is provided a resist overlayer film forming composition for use in a lithography process in semiconductor device production, which does not intermix with a resist, blocks undesirable exposure light particularly in EUV exposure, for example, UV and DUV and selectively transmits EUV alone, and which can be developed with a developer after exposure. A resist overlayer film forming composition comprising: a polymer including an organic group including a linear or branched saturated alkyl group having a carbon atom number of 1 to 10, in which some or all of hydrogen atoms thereof are substituted with fluorine atoms, and an optionally substituted $C_{8-16}$ ether compound as a solvent.

4 Claims, No Drawings

(56) References Cited

FOREIGN PATENT DOCUMENTS

| | | | |
|---|---|---|---|
| JP | 2007-199653 A | * | 8/2007 |
| JP | 2007-241053 A | | 9/2007 |
| JP | 2008-003569 A | | 1/2008 |
| JP | 2008-198788 A | | 8/2008 |
| JP | 2008-532067 A | | 8/2008 |
| JP | 2008-268850 A | | 11/2008 |
| JP | 2010-160282 A | | 7/2010 |
| JP | 2012-103738 A | | 5/2012 |
| JP | 2013-120194 A | | 6/2013 |
| JP | 2013-228663 A | | 11/2013 |
| WO | WO-2006/091648 A2 | * | 8/2006 |
| WO | 2007/049637 A1 | | 5/2007 |
| WO | 2012/053302 A1 | | 4/2012 |

* cited by examiner

RESIST OVERLAYER FILM FORMING COMPOSITION FOR LITHOGRAPHY AND METHOD FOR PRODUCING SEMICONDUCTOR DEVICE USING THE SAME

TECHNICAL FIELD

The present invention relates to a resist overlayer film forming composition for lithography that is used in a process of producing a semiconductor device using photolithography and is effective in reducing adverse effects caused by exposure light and yielding a good resist pattern, a method for forming a resist pattern using the resist overlayer film forming composition for lithography, and a method for producing a semiconductor device using the method.

BACKGROUND ART

Microfabrication using photolithography techniques has conventionally been performed in producing semiconductor devices. The microfabrication is a method of forming a thin film of a photoresist composition on a substrate such as a silicon wafer, applying active rays such as ultraviolet rays thereon through a mask pattern having semiconductor device patterns, developing the pattern, and etching the substrate such as a silicon wafer using the resulting photoresist pattern as a protection film (mask). With the increasing density of semiconductor devices in recent years, the active rays used have been changed to those at shorter wavelengths, for example, from KrF excimer laser (wavelength of 248 nm) to ArF excimer laser (wavelength of 193 nm).

Accordingly, the effects of diffuse reflection or standing waves of active rays from the substrate have become a serious issue, and a method has been widely adopted in which Bottom Anti-Reflective Coating (BARC) is provided as a resist underlayer film between the photoresist and the substrate for serving the function of preventing reflection.

Known examples of the anti-reflective coatings include: inorganic anti-reflective coatings including, for example, titanium, titanium dioxide, titanium nitride, chromium oxide, carbon, and α-silicon; and organic anti-reflective coatings made from a light absorbing substance and a polymer compound. The former requires equipment for forming films such as a vacuum deposition system, a CVD system, and a sputtering system, whereas the latter requires no special equipment. In this respect, organic anti-reflective coatings are advantageous and have been elaborately examined.

ArF immersion lithography in which exposure is performed through water has been practiced as a next-generation photolithography technique that replaces the photolithography technique using ArF excimer laser (wavelength of 193 nm). The photolithography techniques using light, however, have been approaching their limits. EUV lithography technique using EUV (at a wavelength of 13.5 nm) has been attracting attention as a new lithography technique after the ArF immersion lithography. In the semiconductor device production process using EUV lithography, a substrate coated with an EUV resist is exposed by EUV radiation and developed to form a resist pattern.

An overlayer on an EUV resist is described, which includes a polymer including a group containing one or more of beryllium, boron, carbon, silicon, zirconium, niobium, and molybdenum in order to protect the EUV resist from contaminants and to block undesirable radiation, for example, such as UV and DUV (Out of Band/out-of-band radiation, OOB) (Patent Document 1, Patent Document 2).

There are examples in which, in order to block OOB, a topcoat formed of a polyhydroxystyrene (PHS)-based compound, an acrylic compound, or other substances is applied as an overlayer on an EUV resist to reduce OOB (Non Patent Document 1), or a film of an EUV resolution enhancement layer is applied as an overlayer on an EUV resist to absorb OOB and improve the EUV resist resolution (Non Patent Document 2). However, what composition is most suitable is not described. A novolac-based material including a naphthalene ring is described as a resist overlayer film forming composition for EUV lithography (Patent Document 3).

Resist overlayer protective films that have hydrophobicity suitable for immersion lithography and can be dissolved in an aqueous alkaline solution are disclosed as follows: a resist protecting film material including an acrylic polymer including a hexafluoroisopropyl alcohol group (Patent Document 4); a resist protecting film material including an ester compound having a fluoroalkyl group as a solvent (Patent Document 5); a photoresist overlayer film forming composition including a solvent having an ether structure (Patent Document 6); and a topcoat material including a hexafluoroalcohol unit and an alcohol-based solvent, which can be used as a topcoat for immersion process or a top anti-reflective coating (TARC) to be applied on the top surface of a photoresist (Patent Document 7).

However, it is unclear whether these materials have sufficient characteristics as resist overlayer films particularly for use in EUV lithography that can transmit EUV light and block OOB radiation and as materials excellent at blocking gas escaped from the resist.

PRIOR ART DOCUMENTS

Patent Documents

Patent Document 1: Japanese Patent Application Publication No. 2004-348133 (JP 2004-348133 A)
Patent Document 2: Japanese Patent Application Publication No. 2008-198788 (JP 2008-198788 A)
Patent Document 3: International Publication No. WO2012/053302 Pamphlet
Patent Document 4: Japanese Patent Application Publication No. 2006-70244 (JP 2006-70244 A)
Patent Document 5: Japanese Patent Application Publication No. 2007-241053 (JP 2007-241053 A)
Patent Document 6: Japanese Patent Application Publication No. 2012-103738 (JP 2012-103738 A)
Patent Document 7: Published Japanese Translation of PCT Application 2008-532067

Non Patent Documents

Non Patent Document 1: Shimizu, M., Maruyama, K., Kimura, T., Nakagawa, H., Sharma, S., "Development of Chemically Amplified EUV resist for 22 nm half pitch and beyond" Extreme Ultraviolet Lithography Symposium, Miami, (October, 2011) Non Patent Document 2: Proc. of SPIE Vol. 7969 796916-1

SUMMARY OF THE INVENTION

Problem to be Solved by the Invention

In view of the foregoing problems, the present invention is made to provide an optimum resist overlayer film forming composition. The present invention provides a resist overlayer film forming composition for use in a lithography process in semiconductor device production, which does not intermix with a resist, blocks undesirable exposure light particularly in EUV exposure, for example, UV and DUV and selectively transmits EUV alone as a resist overlayer film, in particular, as an overlayer film on an EUV resist, is excellent at blocking gas escaped from the resist, can be developed with a developer after exposure, and is applicable to either a positive resist or a negative resist.

Means for Solving the Problem

The present invention provides:

according to a first aspect, a resist overlayer film forming composition comprising a polymer including an organic group including a linear or branched saturated alkyl group having a carbon atom number of 1 to 10, in which some or all of its hydrogen atoms are substituted with fluorine atoms, and an optionally substituted $C_{8-16}$ ether compound as a solvent;

according to a second aspect, the resist overlayer film forming composition according to the first aspect, in which the polymer is a novolac polymer, an acrylic polymer, or a methacrylic polymer;

according to a third aspect, the resist overlayer film forming composition according to the first aspect or the second aspect, in which the polymer includes a unit structure of any one of (Formula 1-1-1) to (Formula 1-4-1) below:

(in (Formula 1-1-1) to (Formula 1-4-1), $Ar^1$ is an organic group including a $C_{6-18}$ aromatic ring; $Ar^2$ is an organic group including a $C_{6-18}$ aromatic ring bonded with $Ar^1$ through a methylene group or a tertiary carbon atom; the organic group including the aromatic ring included in $Ar^1$ or $Ar^2$ includes an organic group including a linear or branched saturated alkyl group having a carbon atom number of 1 to 10, in which some or all of its hydrogen atoms are substituted with fluorine atoms, where the number of the substituted organic group is an integer of 1 to 10; and a hydrogen atom of the aromatic ring in $Ar^1$ or $Ar^2$ is optionally substituted with a hydroxy group, a halogen atom, a carboxy group, a nitro group, a cyano group, a methylenedioxy group, an acetoxy group, a methylthio group, a $C_{1-9}$ alkoxy group, an amino group having a hydrogen atom optionally substituted with a $C_{1-3}$ linear alkyl group, a linear, branched, or cyclic saturated alkyl group having a carbon atom number of 1 to 6 or a linear or branched alkyl halide group having a carbon atom number of 1 to 6 in which a hydrogen atom is optionally substituted with a hydroxy group, or a combination of these groups, where the number of substituents is an integer of 0 to 10);

according to a fourth aspect, the resist overlayer film forming composition according to the third aspect, in which $Ar^1$ is an organic group of (Formula 2-a) to (Formula 2-e) below or a combination thereof, the aromatic ring included in $Ar^1$ is appropriately bonded with $Ar^2$, and $Ar^2$ is a methylene group, an organic group of (Formula 3) below or (Formula 3-1) below:

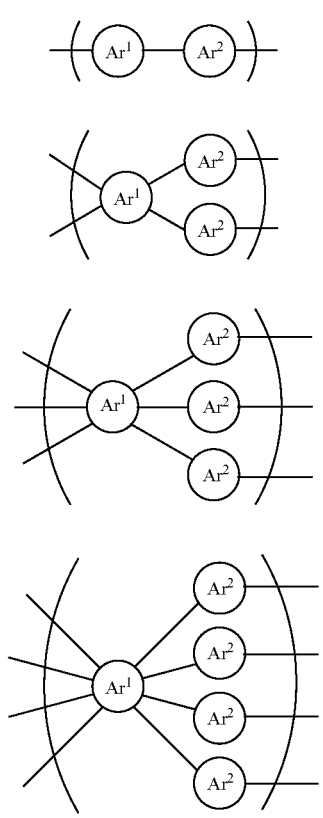

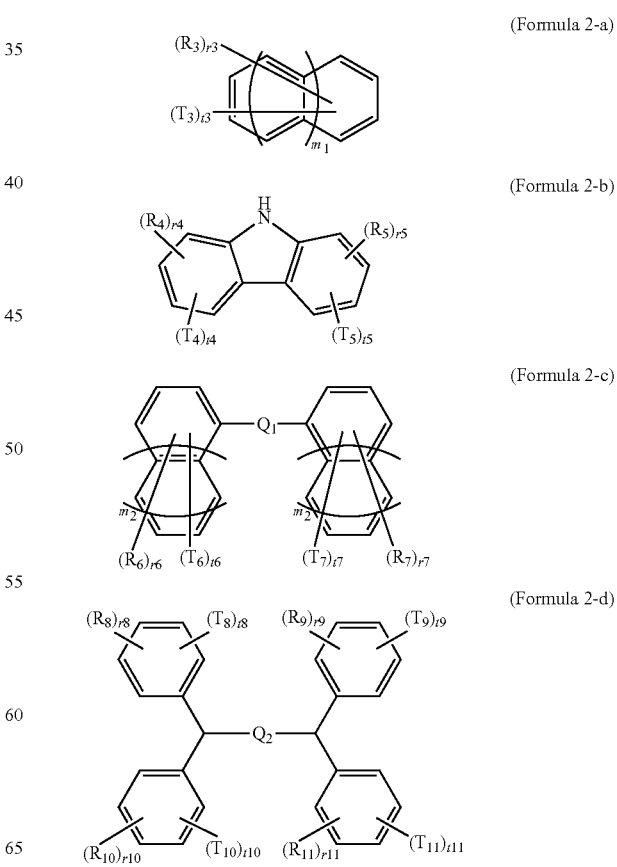

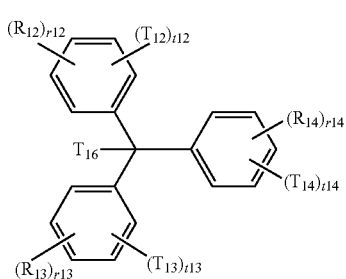

(Formula 2-e)

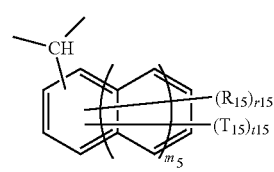

(Formula 3)

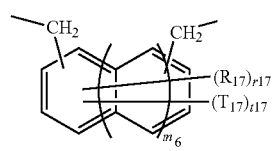

(Formula 3-1)

(in (Formula 2-a) to (Formula 2-e), (Formula 3), and (Formula 3-1), $R_3$ to $R_{15}$ and $R_{17}$ are independently an organic group including a linear or branched saturated alkyl group having a carbon atom number of 1 to 10, in which some or all of its hydrogen atoms are substituted with fluorine atoms; $T_3$ to $T_{17}$ are independently a hydroxy group, a halogen atom, a carboxy group, a nitro group, a cyano group, a methylenedioxy group, an acetoxy group, a methylthio group, a $C_{1-9}$ alkoxy group, an amino group having a hydrogen atom optionally substituted with a $C_{1-3}$ linear alkyl group, a linear, branched, or cyclic saturated alkyl group having a carbon atom number of 1 to 6 or a linear or branched alkyl halide group having a carbon atom number of 1 to 6 in which a hydrogen atom is optionally substituted with a hydroxy group, or a combination of these groups; $Q_1$ and $Q_2$ are a single bond, an oxygen atom, a sulfur atom, a sulfonyl group, a carbonyl group, an imino group, a $C_{6-40}$ arylene group, a linear or branched alkylene group having a carbon atom number of 1 to 10 in which a hydrogen atom is optionally substituted with a halogen atom, or a combination of these groups; the alkylene group optionally forms a ring; m1, m2, m5, m6, r4, r5, r8 to r14, t4, t5, and t8 to t14 are independently an integer of 0 to 2; r3, r6, r7, r17, t3, t6, t7, and t17 are independently an integer of 0 to 8; r15 and t15 are independently an integer of 0 to 9; the sum of r3 to r15 or r17 is an integer of 0 to 10; and if the sum of r3 to r15 or r17 is 0, at least one of $Q_1$ and $Q_2$ includes at least one linear or branched alkylene group having a carbon atom number of 1 to 10, in which some or all of hydrogen atoms are substituted with fluorine atoms);

according to a fifth aspect, the resist overlayer film forming composition according to the fourth aspect, in which in the unit structures of the polymer, any one of $T_3$ to $T_{17}$ includes one or more hydroxy groups;

according to a sixth aspect, the resist overlayer film forming composition according to the first aspect, in which the polymer is a polymer including a unit structure of (Formula 1-4):

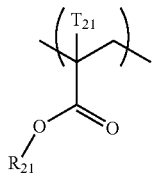

(Formula 1-4)

(in (Formula 1-4), $R_{21}$ is an organic group including a linear or branched saturated alkyl group having a carbon atom number of 1 to 10, in which some or all of its hydrogen atoms are substituted with fluorine atoms; and $T_{21}$ is a hydrogen atom, a hydroxy group, a halogen atom, a nitro group, a cyano group, a $C_{1-9}$ alkoxy group, a linear or branched saturated alkyl group having a carbon atom number of 1 to 6, or a combination thereof);

according to a seventh aspect, the resist overlayer film forming composition according to the sixth aspect, in which the polymer is a copolymer including the unit structure of (Formula 1-4) above and further including a unit structure including an optionally substituted aromatic ring;

according to an eighth aspect, the resist overlayer film forming composition according to the sixth aspect or the seventh aspect, in which the polymer is a copolymer including the unit stricture of (Formula 1-4) above and a unit structure of (Formula 1-5-a) below:

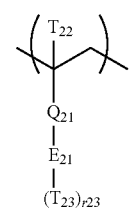

(Formula 1-5-a)

(in (Formula 1-5-a), $Q_{21}$ is a single bond, an ester bond (—C(=O)—O— or —O—C(=O)—) or an amide bond (—C(=O)—NH— or —NH—C(=O)—); and $E_{21}$ is a $C_{6-14}$ aromatic hydrocarbon group or heteroaromatic group; in (Formula 1-5-a), $T_{22}$ and $T_{23}$ are independently a hydrogen atom, a hydroxy group, a halogen atom, a carboxy group, a nitro group, a cyano group, an amino group, an organic group including a cyclic ester, a $C_{1-9}$ alkoxy group, a linear, branched, or cyclic saturated alkyl group having a carbon atom number of 1 to 10, or a combination thereof; and r23 is an integer of 1 or more and the largest value is the largest possible number of substituents of $E_{21}$);

according to a ninth aspect, the resist overlayer film forming composition according to the seventh aspect or the eighth aspect, in which the copolymer is a copolymer further including a unit stricture of (Formula 1-5-b) below, (Formula 1-5-c) below, or a combination thereof:

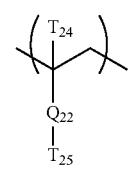

(Formula 1-5-b)

(Formula 1-5-c)

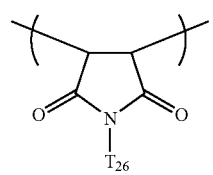

(Formula 1-7)

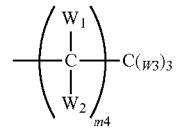

(in (Formula 1-5-b), $Q_{22}$ is a single bond, an ester bond (—C(=O)—O— or —O—C(=O)—) or an amide bond (—C(=O)—NH— or —NH—C(=O)—); in (Formula 1-5-b) and (Formula 1-5-c), $T_{24}$ to $T_{26}$ are independently a hydrogen atom, a hydroxy group, a halogen atom, a carboxy group, a nitro group, a cyano group, an amino group, an organic group including a cyclic ester, a $C_{1-9}$ alkoxy group, a linear, branched, or cyclic saturated alkyl group having a carbon atom number of 1 to 10, or a combination thereof, where a hydrogen atom of the linear, branched, or cyclic saturated alkyl group having a carbon atom number of 1 to 10 is optionally substituted with a hydroxy group, a linear, branched, or cyclic saturated alkyl group having a carbon atom number of 1 to 6, or a $C_{1-9}$ alkoxy group);

according to a tenth aspect, the resist overlayer film forming composition according to the eighth aspect or the ninth aspect, in which in (Formula 1-5-a) according to the eighth aspect, $E_{21}$ is a group of (Formula 1-6-a), (Formula 1-6-b), or (Formula 1-6-c) below:

(Formula 1-6-a)

(Formula 1-6-b)

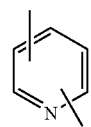

(Formula 1-6-c)

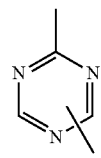

(in (Formula 1-6-a), m3 is an integer of 0 to 2);

according to an eleventh aspect, the resist overlayer film forming composition according to any one of the eighth to tenth aspects, in which in (Formula 1-5-a), $E_{21}$ is an aromatic hydrocarbon group of (Formula 1-6-a) above;

according to a twelfth aspect, the resist overlayer film forming composition according to any one of the fourth to eleventh aspects, in which $R_3$ to $R_{15}$, $R_{17}$, and $R_{21}$ are an organic group of (Formula 1-7) below:

(in (Formula 1-7), $W_1$ and $W_2$ are independently a hydrogen atom, a fluorine atom, a trifluoromethyl group, a difluoromethyl group, or a monofluoromethyl group; $w_3$ is a hydrogen atom, a fluorine atom, or a combination thereof; at least one of $W_1$, $W_2$ and $w_3$ is the organic group including fluorine or a fluorine atom; m4 is an integer of 0 to 9; and the largest value of the number of carbon atoms included in (Formula 1-7) is 10);

according to a thirteenth aspect, the resist overlayer film forming composition according to any one of the first to twelfth aspects, in which the polymer has a weight average molecular weight measured by GPC of 800 to 10000 in terms of polystyrene;

according to a fourteenth aspect, the resist overlayer film forming composition according to any one of the first to thirteenth aspects, in which the ether compound according to the first aspect includes dibutyl ether, diisoamyl ether, diisobutyl ether, or a combination thereof;

according to a fifteenth aspect, the resist overlayer film forming composition according to any one of the first to fourteenth aspects, in which the ether compound according to claim 1 has a proportion, in the solvent according to claim 1, of 87% by mass or more up to 100% by mass;

according to a sixteenth aspect, the resist overlayer film forming composition according to any one of the first to fifteenth aspects, further comprising a basic compound;

according to a seventeenth aspect, the resist overlayer film forming composition according to any one of the first to sixteenth aspects, further comprising an acid compound;

according to an eighteenth aspect, the resist overlayer film forming composition according to the seventeenth aspect, in which the acid compound is a sulfonic acid compound or a sulfonic acid ester compound;

according to a nineteenth aspect, the resist overlayer film forming composition according to the seventeenth aspect, in which the acid compound is an onium salt-based acid generator, a halogen-containing compound-based acid generator, or a sulfonic acid-based acid generator;

according to a twentieth aspect, the resist overlayer film forming composition according to any one of the first to nineteenth aspects, in which a resist used together with the composition is a resist for EUV (wavelength of 13.5 nm);

according to a twenty-first aspect, a method for producing a semiconductor device comprising the steps of: forming a resist film on a substrate; applying the resist overlayer film forming composition according to any one of the first to twentieth aspects on the resist film and baking the composition to form a resist overlayer film; exposing the semiconductor substrate covered with the resist overlayer film and the resist film; and performing development after exposure to remove the resist overlayer film and the resist film;

according to a twenty-second aspect, the method for producing a semiconductor device according to the twenty-first aspect, in which the exposure is performed with EUV (wavelength of 13.5 nm); and according to a twenty-third aspect, a method for forming a resist pattern for use in production of a semiconductor device, comprising the step of applying the resist overlayer film forming composition according to any one of the first to twentieth aspects on a resist formed on a semiconductor substrate and baking the composition to form a resist overlayer film.

Effects of the Invention

The present invention relates to a resist overlayer film forming composition that does not intermix with an EUV resist, blocks undesirable exposure light in EUV exposure, for example, UV and DUV, and selectively transmits EUV alone as a resist overlayer film forming composition, in particular, as an overlayer forming composition for an EUV resist, and can be developed with a developer after exposure.

In exposure of an EUV resist, in particular, UV light and DUV light are emitted together with EUV light. This EUV light includes about 5% of light having wavelengths of 300 nm or lower, in addition to EUV light. The wavelength region, for example, in the vicinity of 190 nm to 300 nm, in particular 220 nm to 260 nm has the highest intensity to lead to reduction in sensitivity of the EUV resist and deterioration of pattern shapes. The UV light and the DUV light (Out of Band/out-of-band radiation) start to affect when the line widths become 22 nm or smaller and have adverse effects on the resolution of the EUV resist.

In order to remove light of wavelengths in the vicinity of 220 nm to 260 nm, a filter may be installed in a lithography system. However, this method has a complicated process. In the present invention, of DUV lights (Out of Band/out-of-band radiation) included in EUV exposure light, undesirable DUV light having a wavelength of 220 nm to 260 nm is absorbed by the aromatic hydrocarbon ring included in the composition of the present invention, thereby improving the resolution of the EUV resist.

In order to prevent intermixing (layer mixing) with the EUV resist when the overlayer is applied on the EUV resist, it is preferable that the resist overlayer film forming composition include a solvent having a $C_{8-16}$ ether bond (ether-based solvent), rather than a solvent for use in the EUV resist.

The solubility in the ether-based solvent is low for the resin that forms the resist, irrespective of the resins (for example, methacrylate-based resins, PHS-based resins, hybrid resins containing both methacrylate and hydroxystyrene (HS)). The resist overlayer film forming composition of the present invention therefore can be applicable to various resists, irrespective of resists (either positive or negative).

In order to increase the solubility in the ether-based solvent, the resist overlayer film forming composition of the present invention includes a polymer including an organic group (hereinafter called "fluorine-based organic group") including a $C_{1-10}$ saturated alkyl group, in which some or all of its hydrogen atoms are substituted with fluorine atoms.

The polymer including the fluorine-based organic group can be dissolved in a development solvent (for example, butyl acetate or 2-heptanone) for use in a negative development process and therefore can be dissolved and removed by the developer. Such a development process for a negative resist is called Negative tone Development (NTD).

When the polymer included in the resist overlayer film forming composition of the present invention contains a hydroxy group, a carboxy group, a sulfonic acid group, or other substances, the polymer may be dissolved together with the EUV resist in an alkaline developer during development after exposure. In this case, the composition including the polymer can be dissolved and removed by an alkaline developer. Such a development process for a positive resist is called Positive tone Development (PTD).

The present invention is excellent at blocking gas escaped from the resist, in particular, during EUV exposure, thereby preventing contamination of exposure equipment caused by the escaping gas components.

MODES FOR CARRYING OUT THE INVENTION

The details of a resist overlayer film forming composition according to the present invention will be described below.

The present invention provides a resist overlayer film forming composition comprising a polymer including an organic group including a $C_{1-10}$ saturated alkyl group, in which some or all of its hydrogen atoms are substituted with fluorine atoms, and a solvent. The solvent is preferably a $C_{8-16}$ ether compound in order to prevent intermixing (layer mixing) with the resist. The present invention is suitable for a resist overlayer film, in particular, suitable as a resist overlayer film forming composition in an EUV lithography process using EUV as an exposure wavelength.

A novolac polymer, an acrylic polymer, or a methacrylic polymer is used as the polymer.

The novolac polymer is obtained by subjecting a known monomer including the fluorine-based organic group to a condensation reaction in the presence of an acid catalyst or a base catalyst. Typical examples of the novolac polymer include phenol resins including the fluorine-based organic group.

The acrylic polymer or the methacrylic polymer is preferably a meth(acrylic) polymer formed by polymerizing a (meth)acrylate compound including the fluorine-based organic group.

In the present invention, the (meth)acrylate compound refers to both an acrylate compound and a methacrylate compound. For example, (meth)acrylic acid refers to acrylic acid and methacrylic acid.

The general formulae of the particularly preferable novolac polymer including the fluorine-based organic group for use in the present invention are as follows.

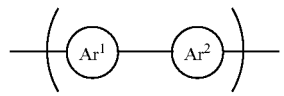

(Formula 1-1-1)

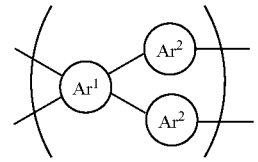

(Formula 1-2-1)

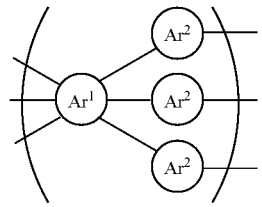

(Formula 1-3-1)

(Formula 1-4-1)

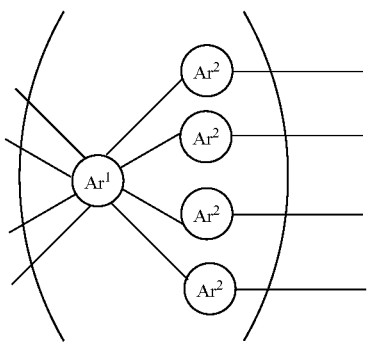

(Formula 1-7)

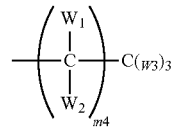

(In (Formula 1-7), $W_1$ and $W_2$ are independently a hydrogen atom, a fluorine atom, a trifluoromethyl group, a difluoromethyl group, or a monofluoromethyl group; $w_3$ is a hydrogen atom, a fluorine atom, or a combination thereof; at least one of $W_1$, $W_1$ and $w_3$ is the organic group including fluorine or a fluorine atom; m4 is an integer of 0 to 9; and the largest value of the number of carbon atoms included in (Formula 1-7) is 10.)

Specific preferable examples of the organic group are (Formula 1-7-1) to (Formula 1-7-20) below.

—$CF_3$ (Formula 1-7-1)
—$C(CF_3)_3$ (Formula 1-7-2)
—$CH_2CF_3$ (Formula 1-7-3)
—$CH(CF_3)_2$ (Formula 1-7-4)
—$CH_2(CF_2)_2CF_3$ (Formula 1-7-5)
—$(CH_2)_2(CF_2)_2CF_3$ (Formula 1-7-6)
—$(CH_2)_2(CF_2)_3CF_3$ (Formula 1-7-7)
—$(CH_2)_2(CF_2)_4CF_3$ (Formula 1-7-8)
—$(CH_2)_2(CF_2)_6CF_3$ (Formula 1-7-9)
—$(CH_2)_2(CF_2)_6CF_3$ (Formula 1-7-10)
—$C(CF_3)_2(CF_2)_2CF_3$ (Formula 1-7-11)
—$C(CF_3)_2(CF_2)_2CHF_2$ (Formula 1-7-12)
—$C(CF_3)_2(CF_2)_2CH_2F$ (Formula 1-7-13)
—$C(CH_3)(CF_3)_2$ (Formula 1-7-14)
—$CF_2CF_3$ (Formula 1-7-15)
—$(CF_2)_2CF_3$ (Formula 1-7-16)
—$(CF_2)_3CF_3$ (Formula 1-7-17)
—$(CF_2)_4CF_3$ (Formula 1-7-18)
—$(CF_2)_5CF_3$ (Formula 1-7-19)
—$(CF_2)_9CF_3$ (Formula 1-7-20)

Among these, particularly preferable examples of the organic group are a trifluoromethyl group (Formula 1-7-1) and an organic group of (Formula 1-7-2). A further preferable example of the organic group is a trifluoromethyl group (Formula 1-7-1).

Examples of the halogen atom include a fluorine atom, a chlorine atom, a bromine atom, and an iodine atom.

The aromatic ring refers to an aromatic hydrocarbon ring or a heteroaromatic ring.

Examples of the aromatic hydrocarbon ring in the polymer according to the present invention include benzene, naphthalene, anthracene, phenanthrene, naphthacene, triphenylene, pyrene, and chrysene. Preferred examples are benzene, naphthalene, anthracene, and pyrene.

Examples of the heteroaromatic ring in the polymer according to the present invention include furan, thiophene, pyrrole, imidazole, pyran, pyridine, pyrimidine, pyrazine, indole, purine, quinoline, isoquinoline, quinuclidine, chromene, thianthrene, phenothiazine, phenoxazine, xanthene, acridine, phenazine, and carbazole. A preferred example is carbazole.

Examples of the $C_{1-9}$ alkoxy group include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a (In (Formula 1-1-1) to (Formula 1-4-1), $Ar^1$ is an organic group including a $C_{6-18}$ aromatic ring. $Ar^2$ is an organic group including a $C_{6-18}$ aromatic ring bonded with $Ar^1$ through a methylene group or a tertiary carbon atom. The organic group including the aromatic ring included in $Ar^1$ or $Ar^2$ includes an organic group including a linear or branched saturated alkyl group having a carbon atom number of 1 to 10, in which some or all of its hydrogen atoms are substituted with fluorine atoms. The number of the substituted organic groups is an integer of 1 to 10, and the largest number may be an integer of 9 or less depending on the aromatic ring included in $Ar^1$ or $Ar^2$. For example, when both $Ar^1$ and $Ar^2$ are anthracene rings in (Formula 1-2-1), the largest possible number of substituents of $Ar^1$ is 6, and the largest possible number of substituents of $Ar^2$ is 8. In (Formula 1-4-1), when both $Ar^1$ and $Ar^2$ are an anthracene ring, the largest possible number of substituents of $Ar^1$ is 2, and the largest possible number of substituents of $Ar^2$ is 8. The preferred numbers of substituents of $Ar^1$ and $Ar^2$ are integers of 1 to 4.

A hydrogen atom of the aromatic ring in $Ar^1$ or $Ar^2$ is optionally substituted with a hydroxy group, a halogen atom, a carboxy group, a nitro group, a cyano group, a methylenedioxy group, an acetoxy group, a methylthio group, a saturated linear or branched alkoxy group having a carbon atom number of 1 to 6, an amino group having a hydrogen atom optionally substituted with a $C_{1-3}$ linear alkyl group, a linear, branched, or cyclic alkyl group having a carbon atom number of 1 to 6 or a linear or branched alkyl halide group having a carbon atom number of 1 to 6 in which a hydrogen atom is optionally substituted with a hydroxy group, or a combination of these groups. The number of the substituents is an integer of 0 to 10, and the largest number may be an integer of 9 or less depending on the aromatic ring included in $Ar^1$ or $Ar^2$. For example, when both $Ar^1$ and $Ar^2$ are anthracene rings in (Formula 1-2-1), the largest possible number of substituents of $Ar^1$ is 6, and the largest possible number of substituents of $Ar^2$ is 8. When both $Ar^1$ and $Ar^2$ are an anthracene ring in (Formula 1-4-1), the largest possible number of substituents of $Ar^1$ is 2, and the largest possible number of substituents of $Ar^2$ is 8. Preferred numbers of substituents of $Ar^1$ and $Ar^2$ are integers of 0 to 4.

The organic group including a linear or branched saturated alkyl group having a carbon atom number of 1 to 10, in which some or all of its hydrogen atoms are substituted with fluorine atoms, is expressed by the general formula below (Formula 1-7).

1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, a 1-ethyl-1-methyl-n-propoxy group, a 1-ethyl-2-methyl-n-propoxy group, an n-heptyloxy group, an n-octyloxy group, and an n-nonyloxy group.

Examples of the linear, branched, or cyclic saturated alkyl group having a carbon atom number of 1 to 6 include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the linear, branched, or cyclic saturated alkyl group having a carbon atom number of 1 to 10 include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, a cyclohexyl group, a cycloheptyl group, a cyclooctyl group, a cyclononyl group, a cyclodecanyl group, a norbornyl group, an adamantyl group, a bicyclo[2.1.0]pentyl group, a bicyclo[3.2.1]octyl group, and a tricyclo[3.2.1.0$^{2,7}$]octyl group.

In a further preferable structural formula of the novolac polymer, $Ar^1$ is an organic group of (Formula 2-a) to (Formula 2-e) below or a combination thereof, the aromatic ring included in $Ar^1$ is appropriately bonded with $Ar^2$, and $Ar^2$ is a methylene group, (Formula 3) below, or (Formula 3-1) below.

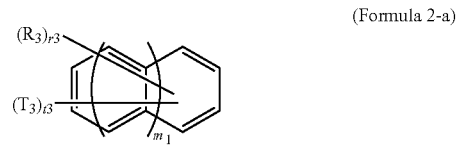

(Formula 2-a)

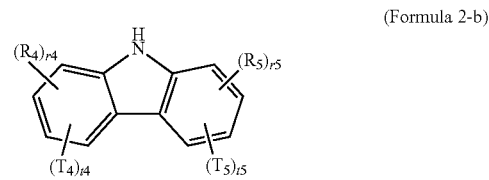

(Formula 2-b)

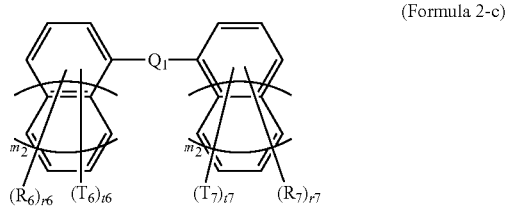

(Formula 2-c)

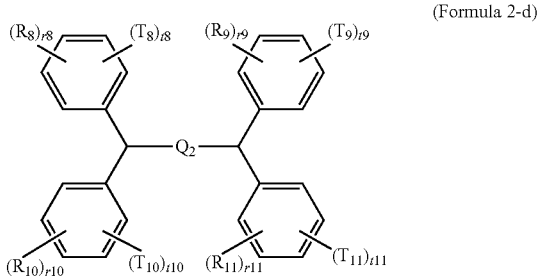

(Formula 2-d)

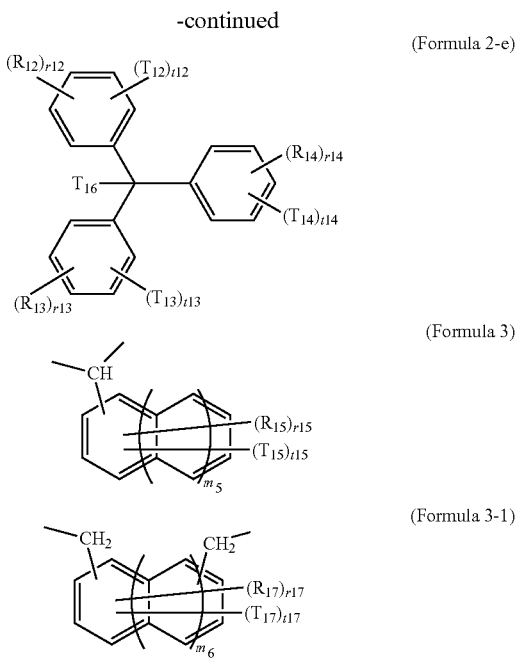

(Formula 2-e)

(Formula 3)

(Formula 3-1)

(In (Formula 2-a) to (Formula 2-e), (Formula 3), and (Formula 3-1), $R_3$ to $R_{15}$ and $R_{17}$ are independently an organic group including a linear or branched saturated alkyl group having a carbon atom number of 1 to 10, in which some or all of its hydrogen atoms are substituted with fluorine atoms; $T_3$ to $T_{17}$ are independently a hydroxy group, a halogen atom, a carboxy group, a nitro group, a cyano group, a methylenedioxy group, an acetoxy group, a methylthio group, a $C_{1-9}$ alkoxy group, an amino group having a hydrogen atom optionally substituted with a $C_{1-3}$ linear alkyl group, a linear, branched, or cyclic saturated alkyl group having a carbon atom number of 1 to 6 or a linear or branched alkyl halide group having a carbon atom number of 1 to 6 in which a hydrogen atom is optionally substituted with a hydroxy group, or a combination thereof; m1, m2, m5, m6, r4, r5, r8 to r14, t4, t5, and t8 to t14 are independently an integer of 0 to 2, more preferably an integer of 0 or 1; r3, r6, r7, r17, t3, t6, t7, and t17 are independently an integer of 0 to 8, more preferably an integer of 0 to 4, and even more preferably an integer of 0 to 3; r15 and t15 are independently an integer of 0 to 9, more preferably an integer of 0 to 3; the sum of r3 to r15 or r17 is an integer of 1 to 10, more preferably an integer of 1 to 4, even more preferably an integer of 1 to 3, and even more preferably an integer of 1 or 2;

$Q_1$ and $Q_2$ are a single bond, an oxygen atom, a sulfur atom, a sulfonyl group, a carbonyl group, an imino group, a $C_{6-40}$ arylene group, a linear or branched alkylene group having a carbon atom number of 1 to 10 in which a hydrogen atom is optionally substituted with a halogen atom, or a combination of these groups; and the alkylene group may form a ring.)

The tertiary carbon atom in (Formula 3) and the two methylene groups in (Formula 3-1) are associated with the bonding with $Ar^1$.

Examples of the $C_{6-40}$ arylene group include a phenylene group, an o-methylphenylene group, an m-methylphenylene group, a p-methylphenylene group, an o-chlorphenylene group, an m-chlorphenylene group, a p-chlorphenylene group, an o-fluorophenylene group, a p-fluorophenylene group, an o-methoxyphenylene group, a p-methoxyphenylene group, a p-nitrophenylene group, a p-cyanophenylene group, an α-naphthylene group, a β-naphthylene group, an o-biphenylylene group, an m-biphenylylene group, a p-biphenylylene group, a 1-anthrylene group, a 2-anthrylene group, a 9-anthrylene group, a 1-phenanthrylene group, a 2-phenanthrylene group, a 3-phenanthrylene group, a 4-phenanthrylene group, and a 9-phenanthrylene group.

Examples of the linear, branched, or cyclic alkylene group having a carbon atom number of 1 to 10 include a methylene group, an ethylene group, an n-propylene group, an isopropylene group, a cyclopropylene group, an n-butylene group, an isobutylene group, an s-butylene group, a t-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, an n-heptylene group, an n-octylene group, an n-nonylene group, and an n-decanylene group.

When the linear or branched alkylene group having a carbon atom number of 1 to 10 forms a ring, additional examples may include a cycloalkylene group and a cycloalkylidene group such as a 1,2-cyclopentylene group, a 1,3-cyclopentylene group, a 1,2-cyclohexylene group, a 1,3-cyclohexylene group, a 1,4-cyclohexylene group, a cyclopentylidene group, a cyclohexylidene group, and a cycloheptylidene group, and a $C_{1-10}$ alicyclic hydrocarbon.

Some or all of the hydrogen atoms of these linear, branched, or cyclic alkylene groups having a carbon atom number of 1 to 10 are optionally substituted with halogen atoms (fluorine atoms, chlorine atoms, bromine atoms, iodine atoms).

Particularly preferable specific examples of the monomer for constituting $Ar^1$ are (Formula 3-1) to (Formula 3-26), (Formula 4-1) to (Formula 4-10), (Formula 4-13) to (Formula 4-40), and (Formula 5-1) to (Formula 5-22) below.
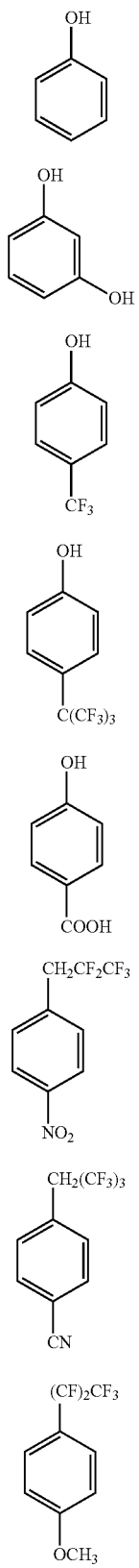
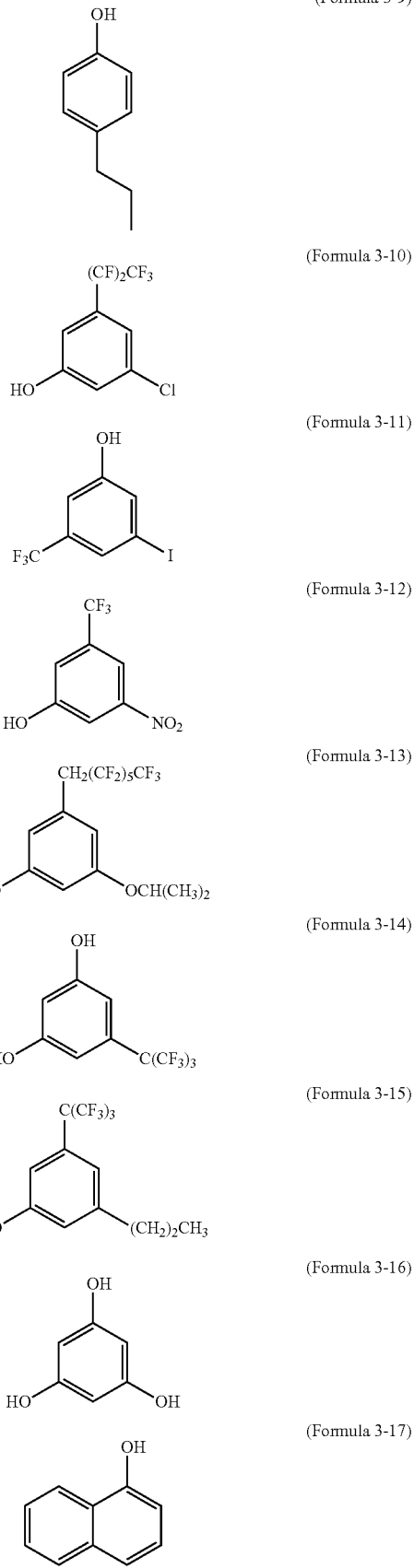

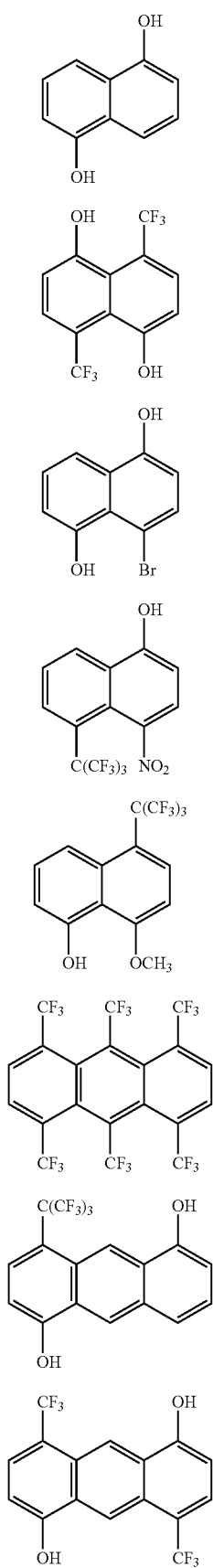
(Formula 3-18)
(Formula 3-19)
(Formula 3-20)
(Formula 3-21)
(Formula 3-22)
(Formula 3-23)
(Formula 3-24)
(Formula 3-25)
(Formula 3-26)
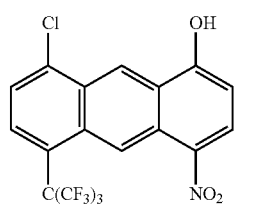
(Formula 4-1)
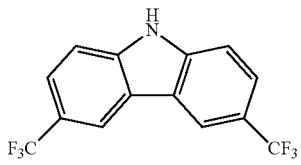
(Formula 4-2)
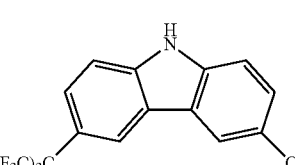
(Formula 4-3)
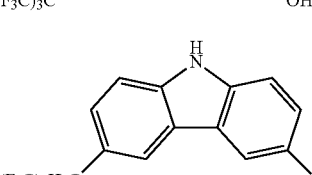
(Formula 4-4)
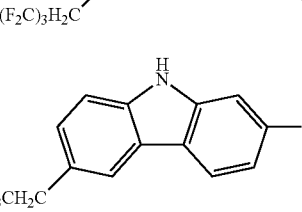
(Formula 4-5)
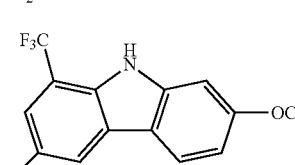
(Formula 4-6)
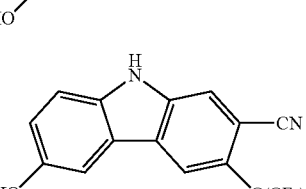
(Formula 4-7)
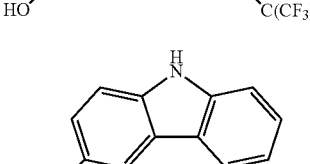
(Formula 4-8)
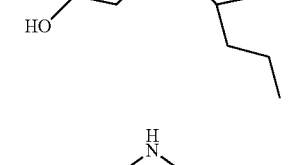
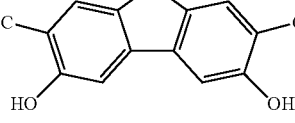

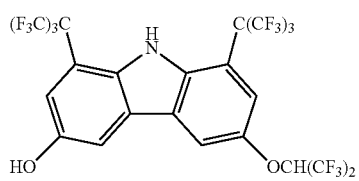 (Formula 4-9)
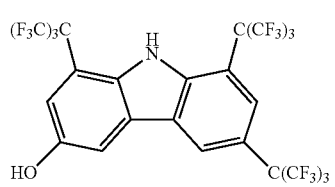 (Formula 4-10)
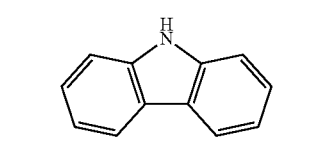 (Formula 4-13)
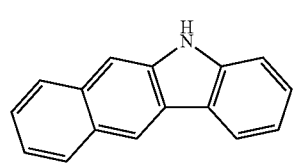 (Formula 4-14)
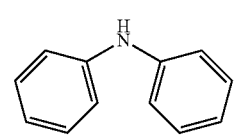 (Formula 4-15)
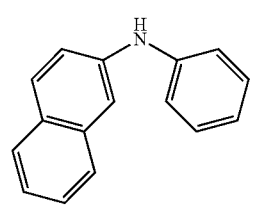 (Formula 4-16)
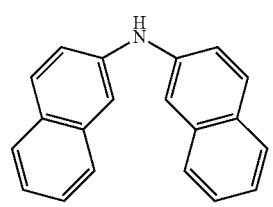 (Formula 4-17)
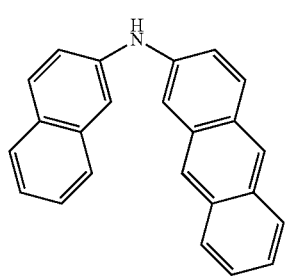 (Formula 4-18)
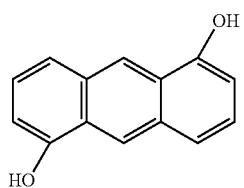 (Formula 4-19)
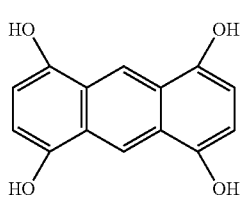 (Formula 4-20)
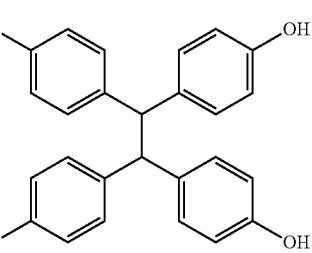 (Formula 4-21)
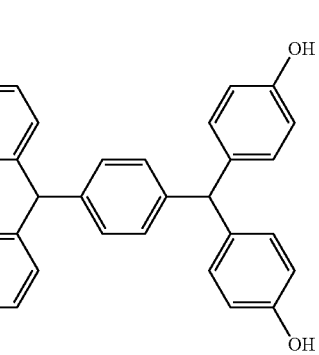 (Formula 4-22)
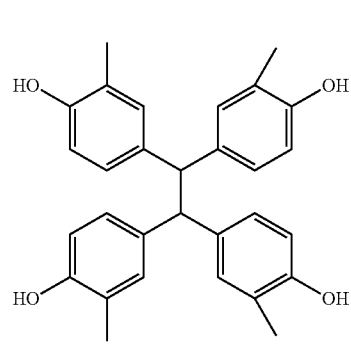 (Formula 4-23)

(Formula 4-24)
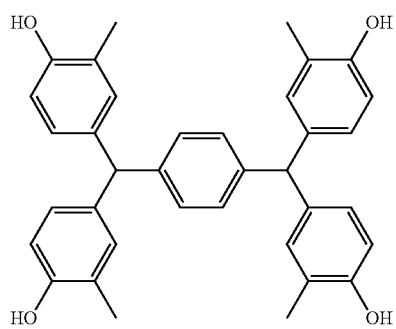
(Formula 4-25)
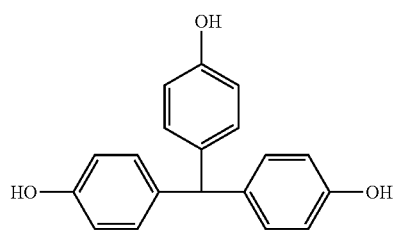
(Formula 4-26)
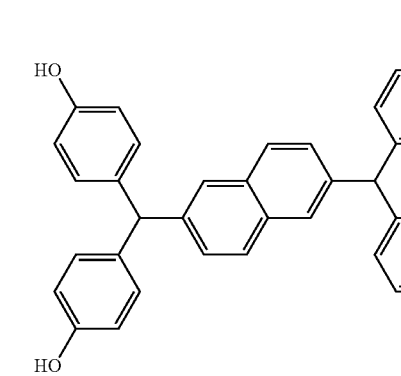
(Formula 4-27)
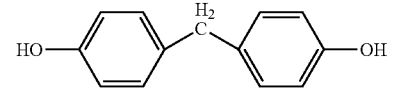
(Formula 4-28)
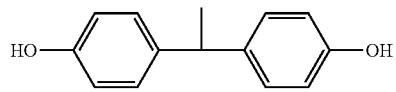
(Formula 4-29)
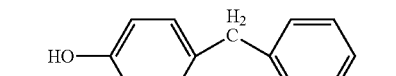
(Formula 4-30)
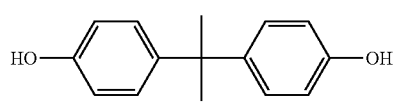
(Formula 4-31)
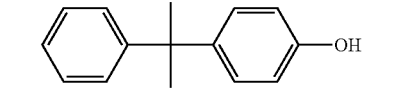
(Formula 4-32)
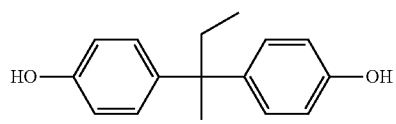
(Formula 4-33)
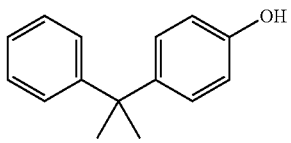
(Formula 4-34)
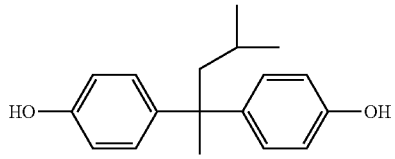
(Formula 4-35)
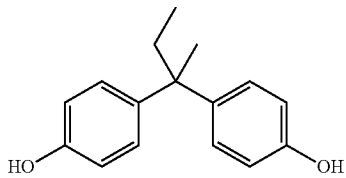
(Formula 4-36)
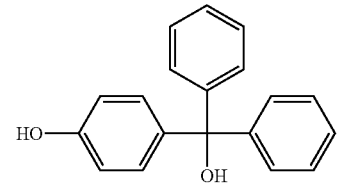
(Formula 4-37)
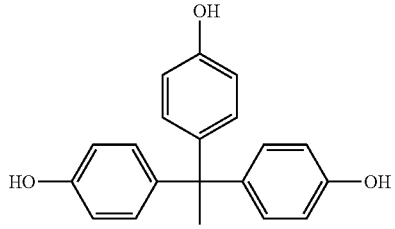
(Formula 4-38)
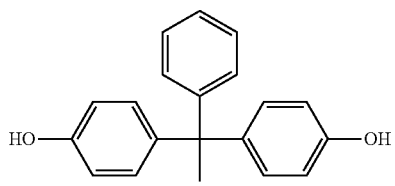
(Formula 4-39)
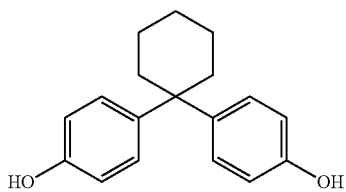
(Formula 4-40)
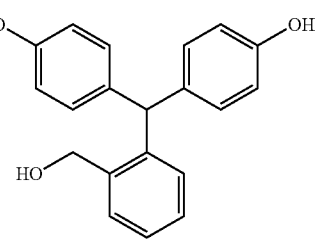

(Formula 5-1)
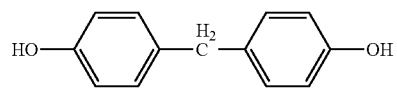
(Formula 5-2)
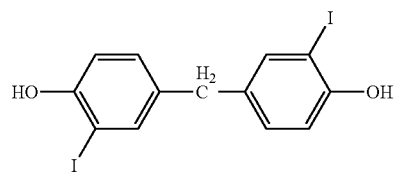
(Formula 5-3)
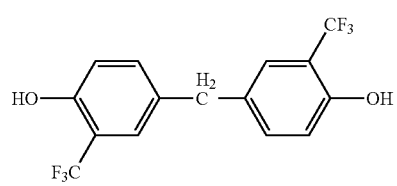
(Formula 5-4)
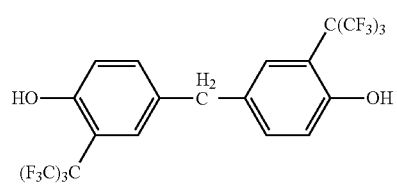
(Formula 5-5)
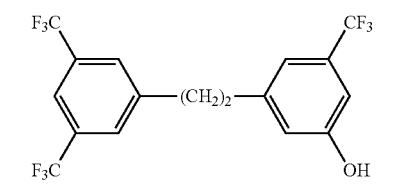
(Formula 5-6)
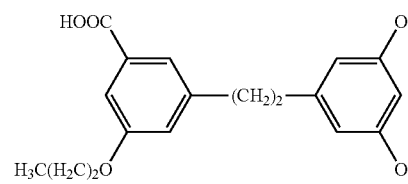
(Formula 5-7)
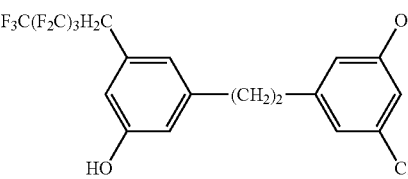
(Formula 5-8)
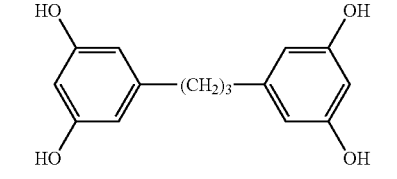
(Formula 5-9)
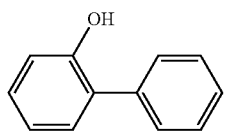
(Formula 5-10)
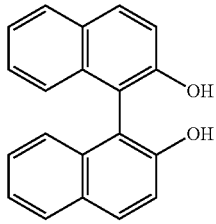
(Formula 5-11)
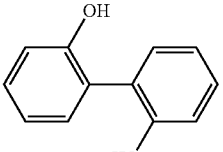
(Formula 5-12)
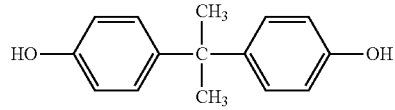
(Formula 5-13)
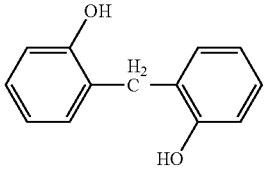
(Formula 5-14)
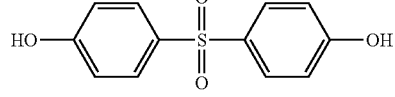
(Formula 5-15)
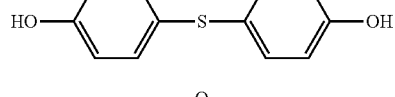
(Formula 5-16)
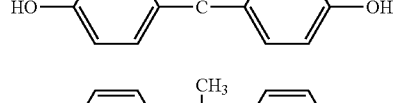
(Formula 5-17)
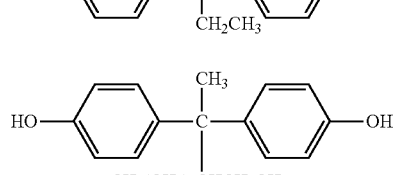
(Formula 5-18)
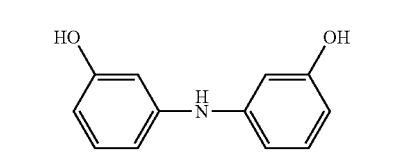
(Formula 5-19)

(Formula 5-20)
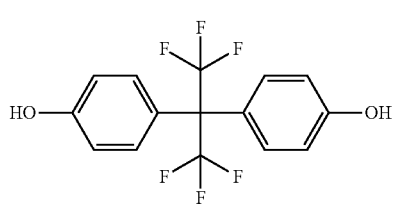

(Formula 5-21)
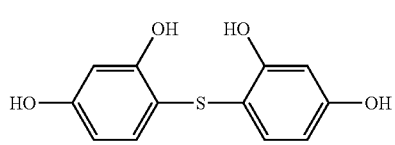

(Formula 5-22)
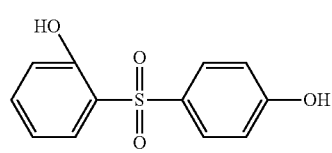

Particularly preferable specific examples of the monomer for constituting $Ar^2$ are (Formula 6-1) to (Formula 6-18) having an aldehyde group, the compounds of (Formula 5-25) to (Formula 5-46), and the compounds of (Formula 7-1) to (Formula 7-15) having a methylol group as shown below.

(Formula 6-1)
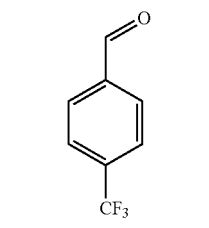

(Formula 6-2)
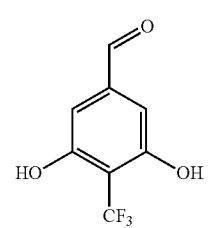

(Formula 6-3)
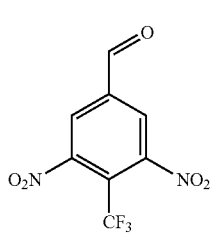

(Formula 6-4)
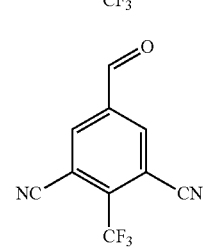

(Formula 6-5)
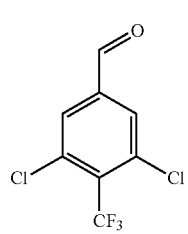

(Formula 6-6)
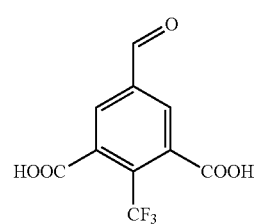

(Formula 6-7)
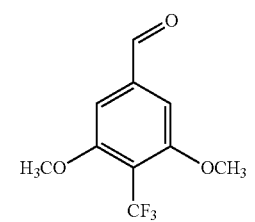

(Formula 6-8)
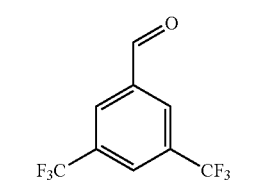

(Formula 6-9)
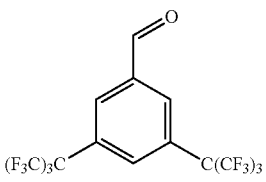

(Formula 6-10)
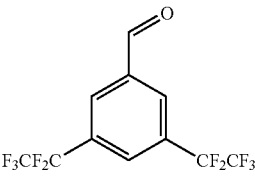

(Formula 6-11)
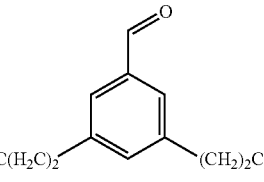

(Formula 6-12)
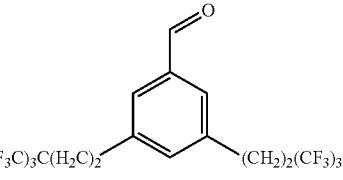

-continued
(Formula 6-13)
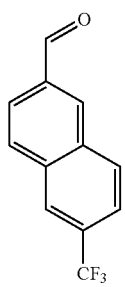
(Formula 6-14)
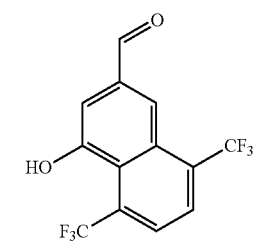
(Formula 6-15)
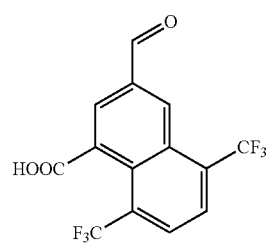
(Formula 6-16)
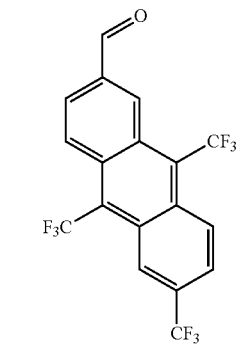
(Formula 6-17)
(Formula 6-18)
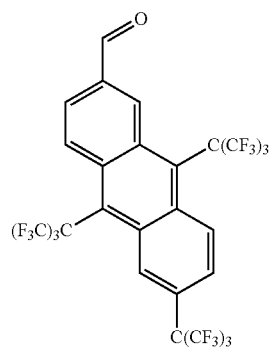
(Formula 5-25)
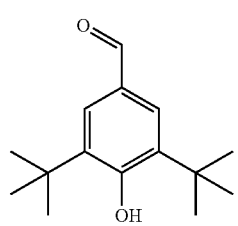
(Formula 5-26)
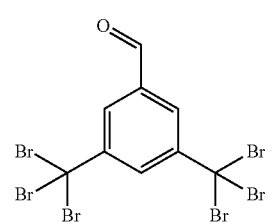
(Formula 5-27)
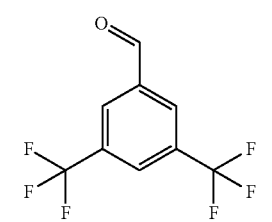
(Formula 5-28)
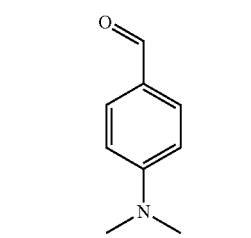
(Formula 5-29)
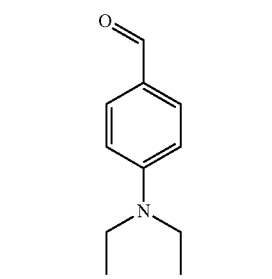

-continued
(Formula 5-30)
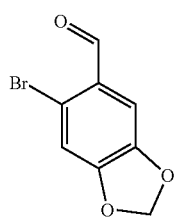
(Formula 5-31)
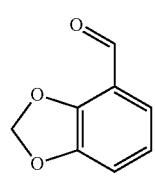
(Formula 5-32)
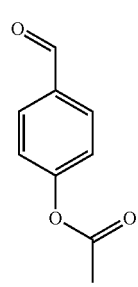
(Formula 5-33)
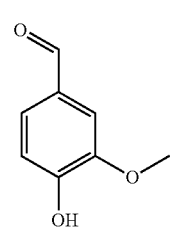
(Formula 5-34)
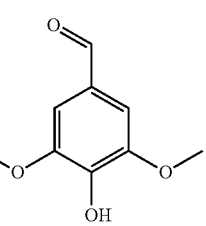
(Formula 5-35)
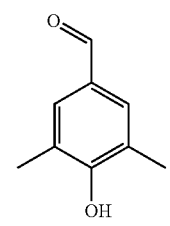
(Formula 5-37)
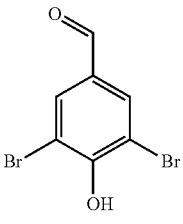
-continued
(Formula 5-38)
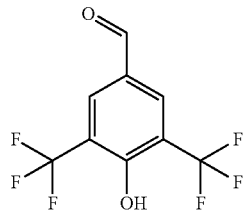
(Formula 5-39)
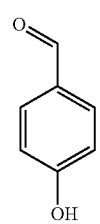
(Formula 5-40)
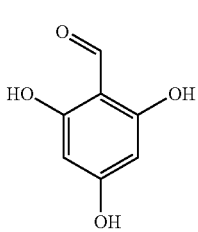
(Formula 5-41)
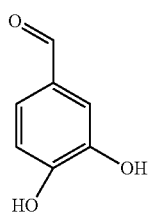
(Formula 5-42)
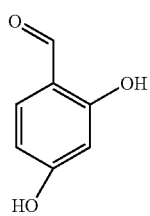
(Formula 5-43)
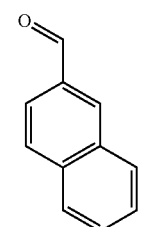
(Formula 5-44)
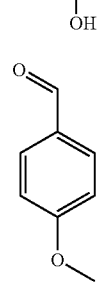

(Formula 5-45)

(Formula 5-46)

(Formula 7-1)

(Formula 7-2)

(Formula 7-3)

(Formula 7-4)

(Formula 7-5)

(Formula 7-6)

(Formula 7-7)

(Formula 7-8)

(Formula 7-9)

(Formula 7-10)

(Formula 7-11)

(Formula 7-12)

(Formula 7-13)

(Formula 7-14)
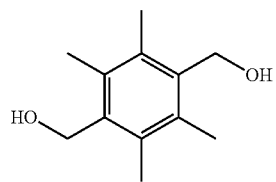
(Formula 7-15)
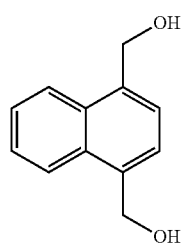
Examples of the unit structure of the synthesized novolac polymer include (Formula 10-1) to (Formula 10-37) below.
(Formula 10-1)
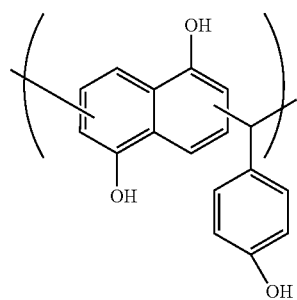
(Formula 10-2)
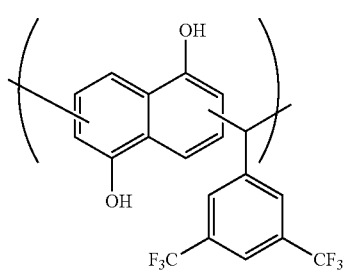
(Formula 10-3)
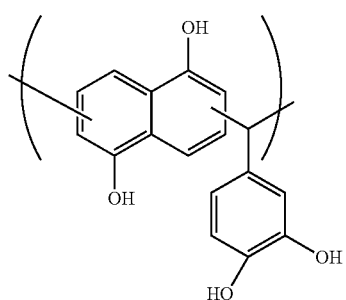
(Formula 10-4)
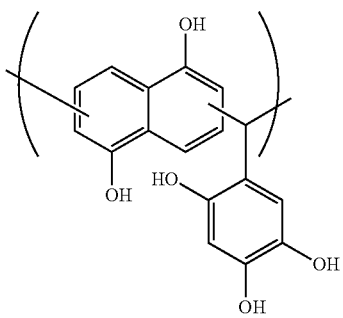
(Formula 10-5)
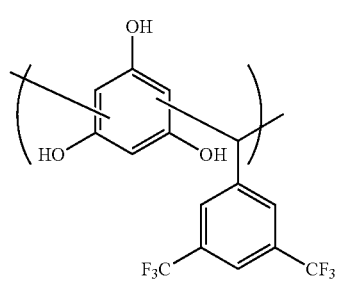
(Formula 10-5-1)
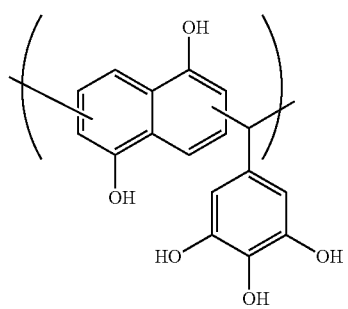
(Formula 10-6)
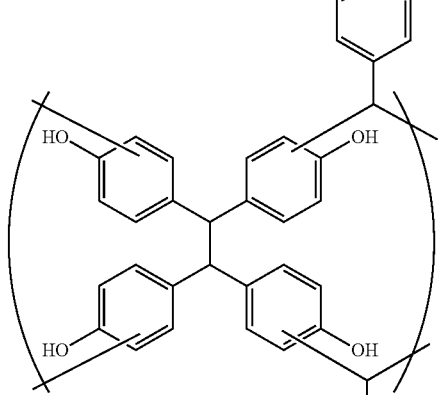

(Formula 10-7)
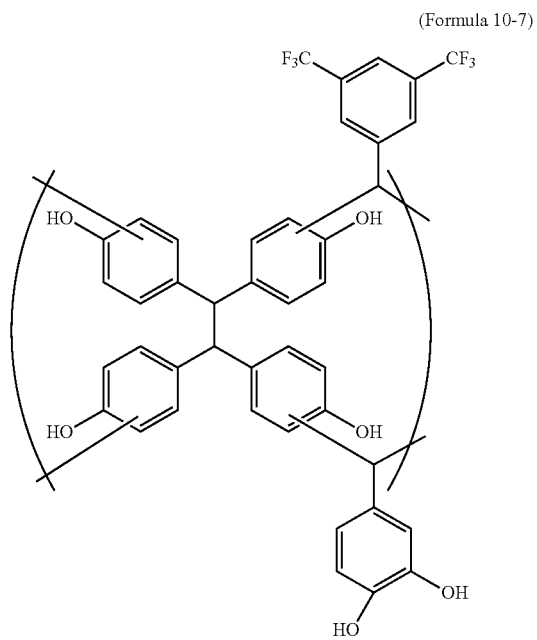
(Formula 10-8)
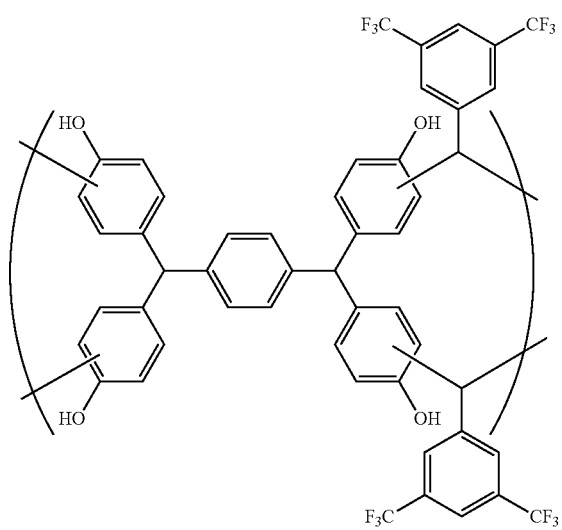
(Formula 10-9)
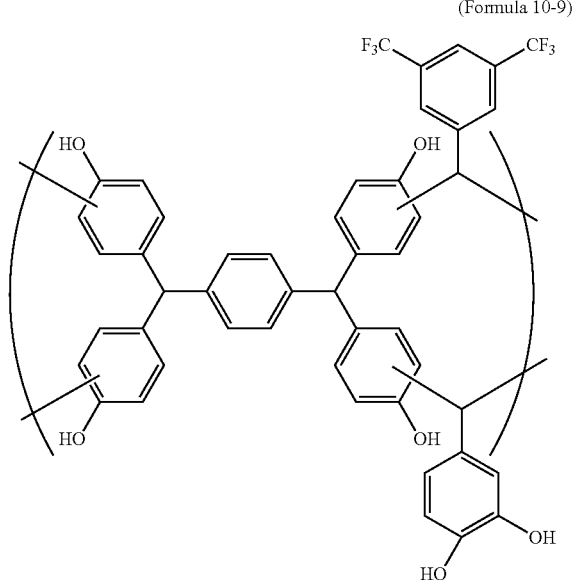
(Formula 10-10)
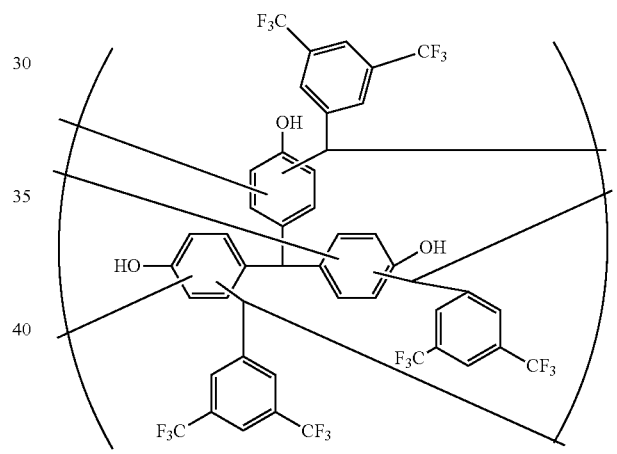
(Formula 10-11)
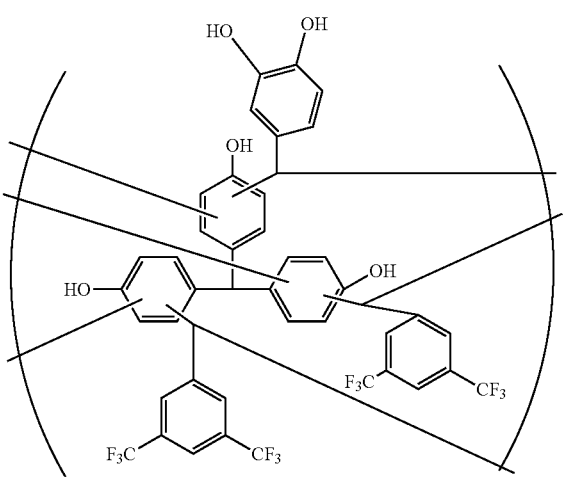

(Formula 10-12)
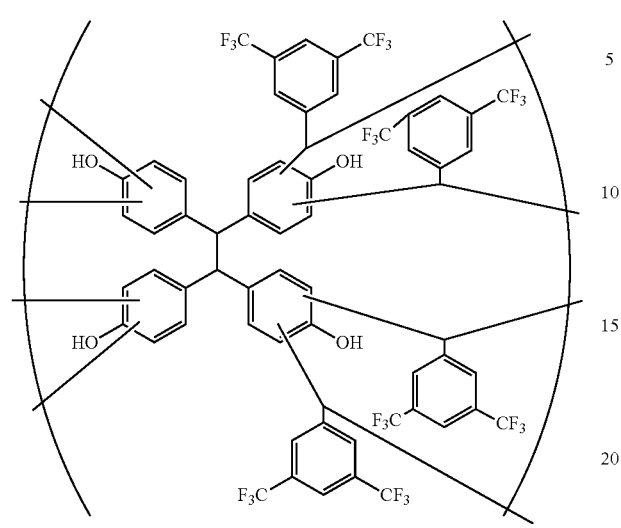
(Formula 10-13)
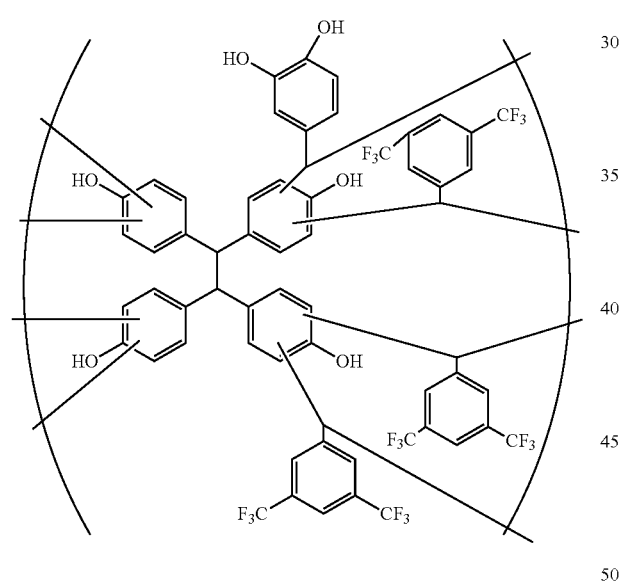
(Formula 10-14)
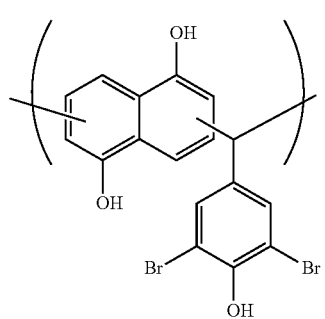
(Formula 10-15)
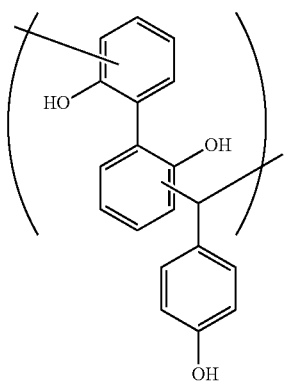
(Formula 10-16)
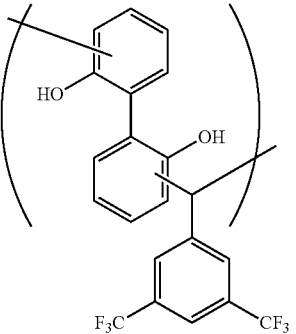
(Formula 10-17)
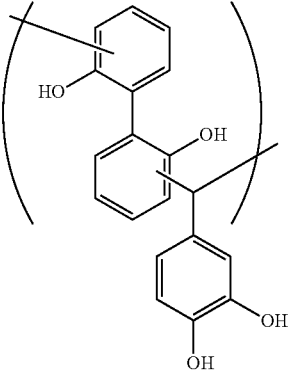
(Formula 10-18)
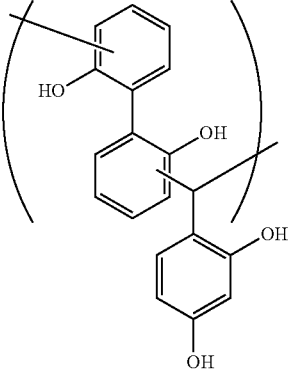

(Formula 10-19)
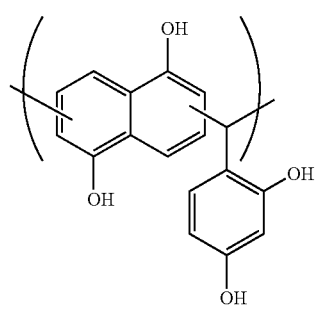
(Formula 10-20)
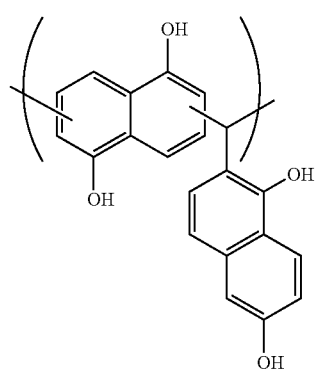
(Formula 10-21)
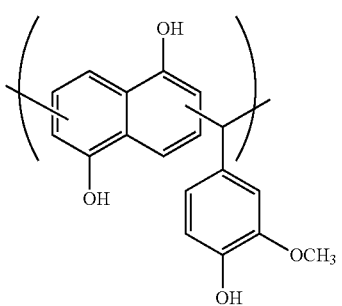
(Formula 10-22)
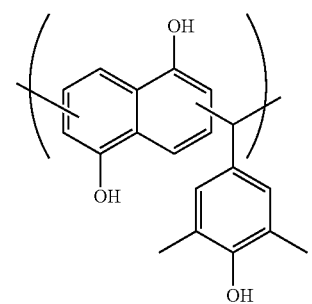
(Formula 10-23)
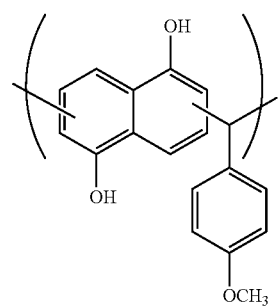
(Formula 10-24)
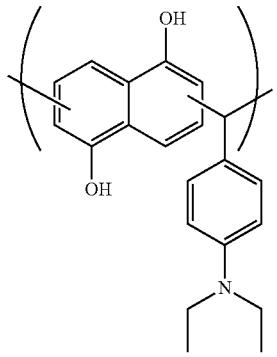
(Formula 10-25)
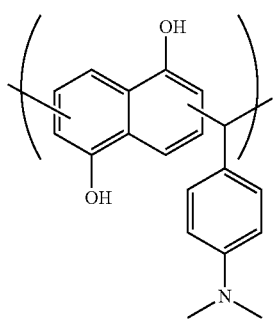
(Formula 10-26)
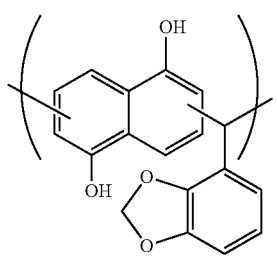
(Formula 10-27)
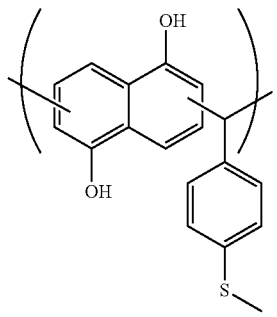
(Formula 10-28)
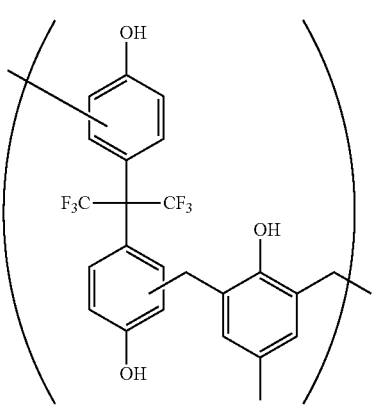

(Formula 10-29)
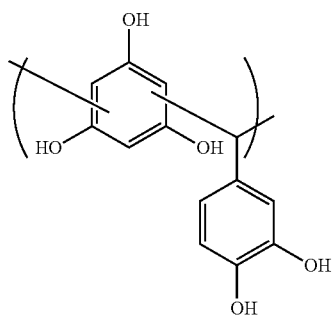

(Formula 10-30)
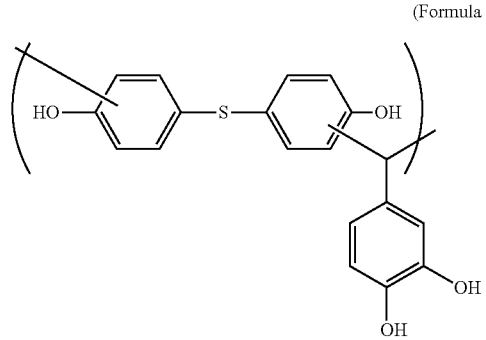

(Formula 10-31)
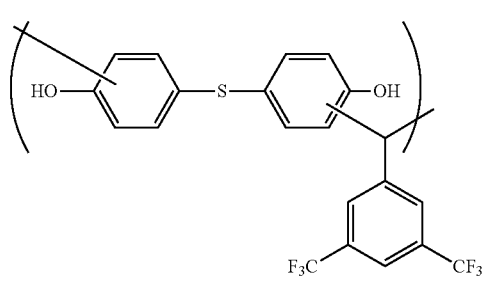

(Formula 10-32)
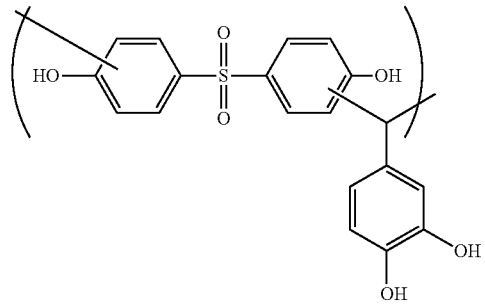

(Formula 10-33)
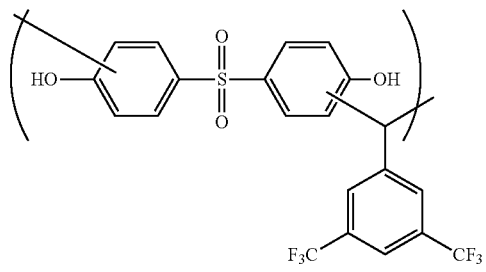

(Formula 10-34)
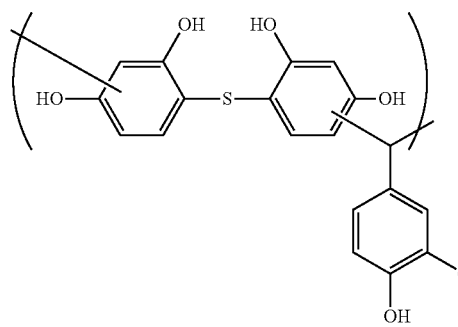

(Formula 10-35)
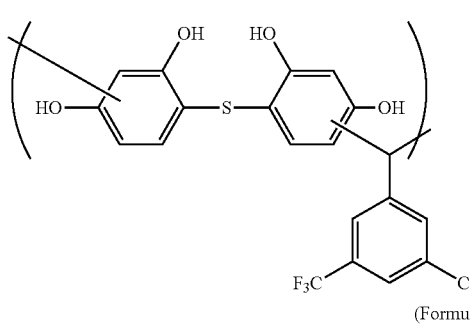

(Formula 10-36)
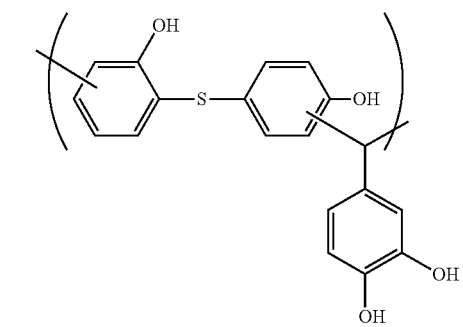

(Formula 10-37)
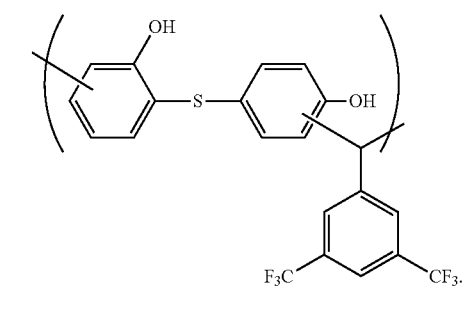

The novolac polymer including the fluorine-based organic group for use in the present invention is generally synthesized by condensation polymerization of "the monomer group A" that is the monomer group that constitutes $Ar^1$ with "the monomer group B" that is the monomer group that constitutes $Ar^2$ in the presence of an acid catalyst.

The monomer group A and the monomer group B are each made of one or two or more monomers, preferably three or less monomers, more preferably two or less monomers. The prepared molar ratio of the monomer group A to the monomer group B in polymer synthesis may be set such that monomer group A/monomer group B is not less than 20/100 and not more than 80/20, more preferably, not less than 20/80 and not more than 70/30.

When the monomer group A or monomer group B is made of two or more monomers, the prepared molar ratio of each monomer including the fluorine-based organic group in the group is not less than 1/10 and not more than 1 or less, more preferably not less than 1/5 and not more than 1.

The prepared molar ratio of each monomer to the monomer group A or monomer group B as a whole can be set to at least 1/20 or more, more preferably 1/10 or more.

In production of the novolac-based polymer including the fluorine-based organic group according to the present invention, the reaction between the monomer group A and the monomer group B is preferably performed in a nitrogen atmosphere. The reaction temperature can be selected from 50° C. to 200° C., preferably 80° C. to 180° C. A novolac-based polymer including the fluorine-based organic group with a high molecular weight can be obtained with a reaction time of 1 to 48 hours. In order to obtain a novolac-based polymer including the fluorine-based organic group with a low molecular weight and high storage-stability, the reaction time of 1 to 24 hours at 80° C. to 150° C. is more preferable.

The novolac polymer in the present invention may be copolymerized with a compound having a structure such as a $C_{4-8}$ cycloalkane compound (for example, cyclohexane), adamantane, and norbornene as a third component in order to control the absorption wavelength of OOB.

Examples of the compound that may be copolymerized with the novolac polymer in the present invention include compounds of (Formula 8-1) to (Formula 8-6) below.

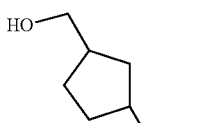
(Formula 8-1)

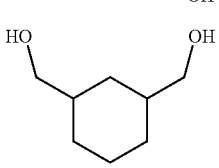
(Formula 8-2)

(Formula 8-3)

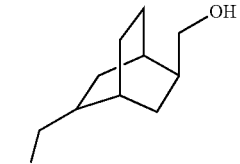
(Formula 8-4)

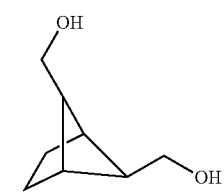
(Formula 8-5)

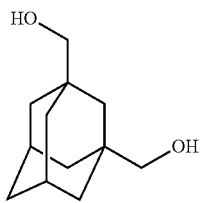
(Formula 8-6)

Particularly preferable examples of the polymer used in the present invention further include an acrylic or methacrylic polymer including the fluorine-based organic group having the unit structure of (Formula 1-4) above in order to increase the solubility in the ether-based solvent.

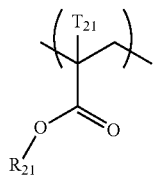
(Formula 1-4)

In (Formula 1-4), $R_{21}$ is an organic group including a linear or branched saturated alkyl group having a carbon atom number of 1 to 10, in which some or all of its hydrogen atoms are substituted with fluorine atoms. $T_{21}$ is a hydrogen atom, a hydroxy group, a halogen atom, a nitro group, a cyano group, a $C_{1-9}$ alkoxy group, a linear or branched saturated alkyl group having a carbon atom number of 1 to 6, or a combination thereof.

Even more preferably, in order to absorb undesirable OOB light, which is the feature of the composition of the present invention, the polymer used in the present invention is a copolymer including (Formula 1-4) above and a unit structure including an optionally substituted aromatic ring. The term "optionally substituted" means that a hydrogen atom of the aromatic ring may be substituted with any monovalent organic group.

The polymer having a more preferable structure for use in the present invention is a copolymer including (Formula 1-4) above and a unit structure of (Formula 1-5-a).

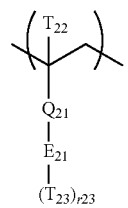
(Formula 1-5-a)

In (Formula 1-5-a), $Q_{21}$ is a single bond, an ester bond (—C(=O)—O— or —O—C(=O)—) or an amide bond (—C(=O)—NH— or —NH—C(=O)—); and $E_{21}$ is a $C_{6-14}$ aromatic hydrocarbon group or heteroaromatic group. In (Formula 1-5-a), $T_{22}$ and $T_{23}$ are independently a hydrogen atom, a hydroxy group, a halogen atom, a carboxy group, a nitro group, a cyano group, an amino group, an organic group including a cyclic ester, a $C_{1-9}$ alkoxy group, a linear, branched, or cyclic saturated alkyl group having a carbon atom number of 1 to 10, or a combination thereof; and $r_{23}$ is an integer of 1 or more, and the largest value is the largest possible number of substituents of $E_{21}$.

Examples of the $C_{6-14}$ aromatic hydrocarbon group include a phenyl group, an α-naphthyl group, a β-naphthyl group, an o-biphenylyl group, an m-biphenylyl group, a p-biphenylyl group, a 1-anthryl group, and a 2-anthryl group.

Examples of the heteroaromatic group include a triazinyl group, a pyridinyl group, a pyrrolyl group, an imidazolyl group, a pyrimidinyl group, and a pyrazinyl group.

The largest possible number of substituents of $E_{21}$ is, for example, 5 if $E_{21}$ is a phenyl group, 7 if $E_{21}$ is an α-naphthyl group or a β-naphthyl group, and 9 if $E_{21}$ is an o-biphenylyl group, an m-biphenylyl group, a p-biphenylyl group, a 1-anthryl group, or a 2-anthryl group.

The largest possible number of substituents of $E_{21}$ is, for example, 2 if $E_{21}$ is a triazinyl group or an imidazolyl group, 3 if $E_{21}$ is a pyrrolyl group, a pyrimidinyl group, or a pyrazinyl group, and 4 if $E_{21}$ is a pyridinyl group.

Even more preferably, the polymer is a polymer including the unit structures of (Formula 1-4) above and (Formula 1-5-a) above, or a copolymer further including a unit structure of (Formula 1-5-b), (Formula 1-5-c), or a combination thereof.

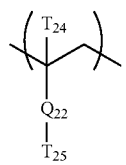

(Formula 1-5-b)

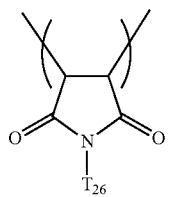

(Formula 1-5-c)

In (Formula 1-5-b), $Q_{22}$ is a single bond, an ester bond (—C(=O)—O— or —O—C(=O)—) or an amide bond (—C(=O)—NH— or —NH—C(=O)—). In (Formula 1-5-b) and (Formula 1-5-c), $T_{24}$ to $T_{26}$ are independently a hydrogen atom, a hydroxy group, a halogen atom, a carboxy group, a nitro group, a cyano group, an amino group, an organic group including a cyclic ester, a $C_{1-9}$ alkoxy group, a linear, branched, or cyclic saturated alkyl group having a carbon atom number of 1 to 10, or a combination thereof, where a hydrogen atom of the linear, branched, or cyclic saturated alkyl group having a carbon atom number of 1 to 10 is optionally substituted with a hydroxy group, a linear, branched, or cyclic saturated alkyl group having a carbon atom number of 1 to 6, or a $C_{1-9}$ alkoxy group.

Examples of the organic group including a cyclic ester include an α-acetolactonitrile group, a β-propiolactonitrile group, a γ-butyrolactonitrile group, and a δ-valerolactonitrile group.

The $C_{1-9}$ alkoxy group, the linear, branched, or cyclic saturated alkyl group having a carbon atom number of 1 to 6, and the linear, branched, or cyclic saturated alkyl group having a carbon atom number of 1 to 10 are the same as described above.

Even more preferably, $E_{21}$ has a structure of (Formula 1-6-a) to (Formula 1-6-c).

(Formula 1-6-a)

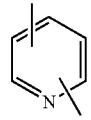

(Formula 1-6-b)

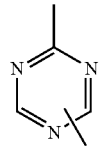

(Formula 1-6-c)

In (Formula 1-6-a), m3 is an integer of 0 to 2.

More preferable examples of the compound of (Formula 1-4) include compounds of (Formula 1-9-1) to (Formula 1-9-3) below.

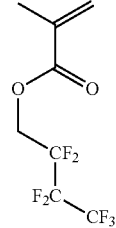

(Formula 1-9-1)

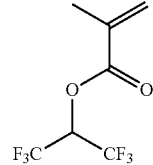

(Formula 1-9-2)

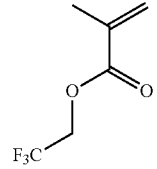

(Formula 1-9-3)

Specific examples of (Formula 1-5-a), (Formula 1-5-b), and (Formula 1-5-c) above include compounds of (Formula 1-10-1) to (Formula 1-10-29) below.

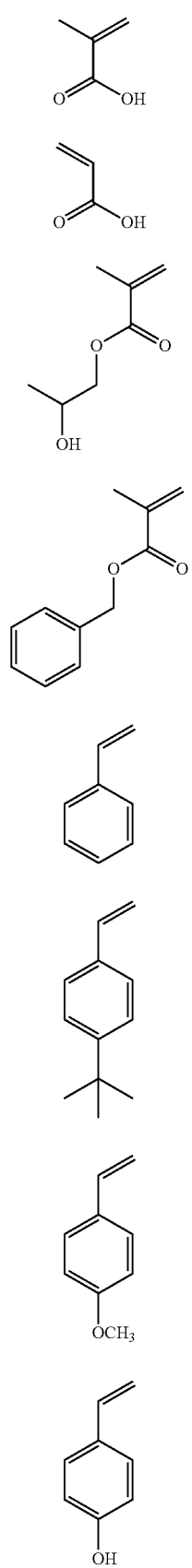
(Formula 1-10-1)
(Formula 1-10-2)
(Formula 1-10-3)
(Formula 1-10-4)
(Formula 1-10-5)
(Formula 1-10-6)
(Formula 1-10-7)
(Formula 1-10-8)
-continued
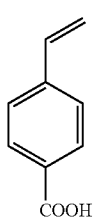
(Formula 1-10-9)
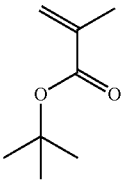
(Formula 1-10-10)
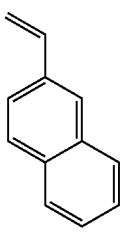
(Formula 1-10-11)
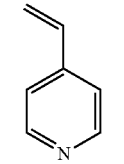
(Formula 1-10-12)
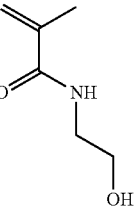
(Formula 1-10-13)
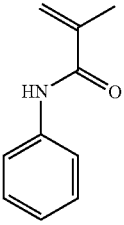
(Formula 1-10-14)
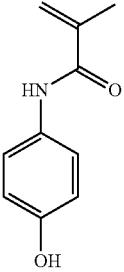
(Formula 1-10-15)

(Formula 1-10-16)
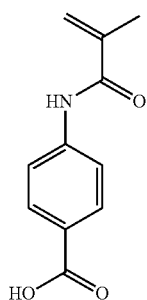
(Formula 1-10-17)
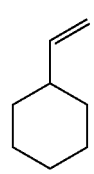
(Formula 1-10-18)
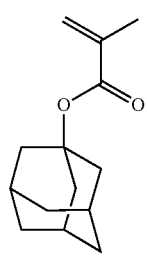
(Formula 1-10-19)
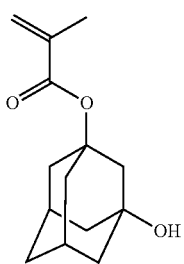
(Formula 1-10-20)
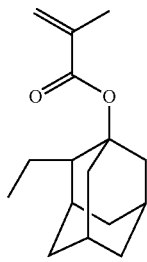
(Formula 1-10-21)
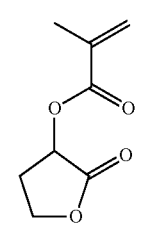
(Formula 1-10-22)
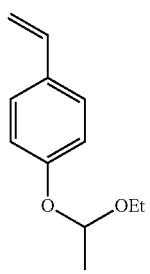
(Formula 1-10-23)
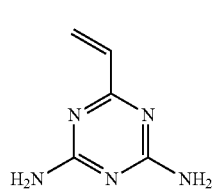
(Formula 1-10-24)
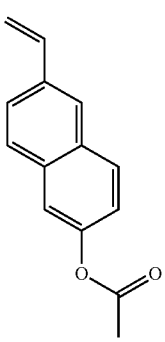
(Formula 1-10-25)
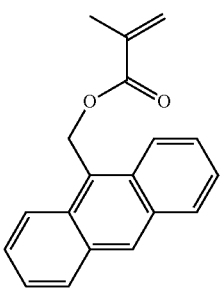
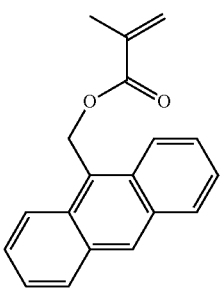
(Formula 1-10-26)
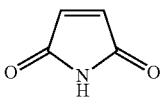
(Formula 1-10-27)
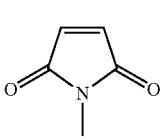
(Formula 1-10-28)
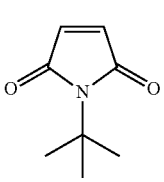

-continued (Formula 1-10-29)

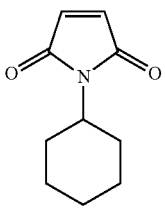

Examples of the unit structure of the synthesized meth(acrylic) polymer include (Formula 11-1) below.

(Formula 11-1)

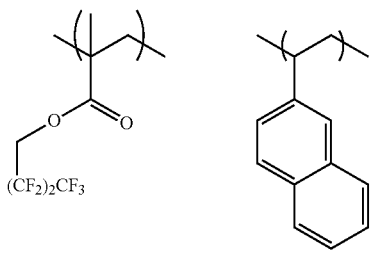

The acrylic or methacrylic polymer including the fluorine-based organic group can be synthesized by radical polymerization, anionic polymerization, cationic polymerization, or other methods, which are general methods for synthesizing acrylic polymers or methacrylic polymers. A variety of methods in such forms as solution polymerization, suspension polymerization, emulsion polymerization, and mass polymerization can be employed.

Examples of the polymerization initiator for use in polymerization include 2,2'-azobis(isobutyronitrile), 2,2'-azobis(2-methylbutyronitrile), 2,2'-azobis(2,4-dimethylvaleronitrile), 4,4'-azobis(4-cyanovaleric acid), 2,2'-azobis(2,4-dimethylvaleronitrile), 2,2'-azobis(4-methoxy-2,4-dimethylvaleronitrile), 2,2'-azobis(isobutyronitrile), 1,1'-azobis(cyclohexane-1-carbonitrile), 1-[(1-cyano-1-methylethyl)azo]formamide, 2,2'-azobis[2-(2-imidazoline-2-yl)propane]dihydrochloride, 2,2'-azobis[2-(2-imidazoline-2-yl)propane], and 2,2'-azobis(2-methylpropionamidine)dihydrochloride.

Examples of the solvent for use in polymerization include dioxane, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate.

The reaction is performed under the conditions of 50° C. to 200° C. for 1 to 48 hours by stirring to yield the acrylic or methacrylic polymer including the fluorine-based organic group.

The weight average molecular weight of the polymer used in the present invention as determined by Gel Permeation Chromatography (GPC) is, for example, 800 to 10000, preferably 900 to 8000 in terms of polystyrene, although varying depending on the applied solvent, the solution viscosity, and the like. When the weight average molecular weight is 800 or less, the resist overlayer film including the polymer having the fluorine-based organic group of the present invention may diffuse into the photoresist and deteriorate the lithography performance. When the weight average molecular weight is 10000 or more, the solubility of the formed resist overlayer film in the photoresist developer may be insufficient to cause residues after development.

The amount contained in the solid content of the polymer including the fluorine-based organic group in the resist overlayer film forming composition is 20% by mass or more, for example, 20% to 100% by mass, or 30% to 100% by mass, or 50% to 90% by mass, or 60% to 80% by mass.

The solid content of the resist overlayer film forming composition of the present invention is 0.1% to 50% by mass, preferably 0.3% to 30% by mass. The solid content is obtained by removing the solvent component from the resist overlayer film forming composition.

The reaction of the monomer for synthesizing the polymer including the fluorine-based organic group can be performed in a solvent. Examples of the solvent usable include dioxane, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate.

Other examples of the solvent include alcohol-based solvents including 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 2-methyl-2-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol, and cyclohexanol.

These solvents may be used singly or may be mixed. Even a solvent that does not dissolve the polymer having the fluorine-based organic group may be mixed in the solvents above as far as the polymer having the fluorine-based organic group generated through a polymerization reaction is not deposited.

The thus obtained solution including the polymer having the fluorine-based organic group can be used as it is in preparation of the resist overlayer film forming composition. The polymer having the fluorine-based organic group may be precipitated and isolated in a poor solvent such as methanol, ethanol, ethyl acetate, hexane, toluene, acetonitrile, and water, or a solvent mixture thereof, and collected therefrom.

After the polymer having the fluorine-based organic group is isolated, the polymer may be re-dissolved as it is in a solvent for use in the composition of the present invention or may be dried before use. If dried, the preferable drying conditions are 40° C. to 100° C. for 6 to 48 hours, for example, in an oven. After the polymer having the fluorine-based organic group is collected, the polymer may be re-dissolved in any solvent, preferably a solvent having a $C_{8-16}$ ether bond below and used as the resist overlayer film composition.

In the resist overlayer film forming composition of the present invention, a solvent having an optionally substituted $C_{8-16}$ ether bond as shown below is preferably used for the polymer including the fluorine-based organic group, in place of solvents generally used for resists, in order to prevent intermixing (layer mixing) when the composition is applied on the resist to form a film.

The term "optionally substituted" means that a hydrogen atom of the alkyl group described later may be substituted with any monovalent organic group or a halogen atom. If substituted, it is more preferable that the hydrogen atom be substituted with a halogen atom (a fluorine atom, a chlorine atom, a bromine atom, an iodine atom).

The solvent having a $C_{8-16}$ ether bond is (Formula 1-8) below in a general formula.

$A_1\text{-O-}A_2$ (Formula 1-8)

(In (Formula 1-8), $A_1$ and $A_2$ are independently an optionally substituted linear, branched, or cyclic saturated alkyl group having a carbon atom number of 1 to 15.)

Examples of the linear, branched, or cyclic saturated alkyl group having a carbon atom number of 1 to 15 include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, an n-hexyl group, an n-heptyl group, an n-octyl group, an n-nonyl group, an n-decanyl group, an n-undecanyl group, an n-dodecanyl group, an n-tridecanyl group, an n-tetradecanyl group, an n-pentadecanyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group. The optionally substituted linear, branched, or cyclic saturated alkyl group having a carbon atom number of 1 to 15 means that some or all of hydrogen atoms of these hydrocarbon groups may be substituted with halogen atoms (fluorine atoms, chlorine atoms, bromine atoms, iodine atoms).

Among these, preferable examples of the solvent include dibutyl ether, diisobutyl ether, di-tert-butyl ether, dipentyl ether, diisoamyl ether, dihexyl ether, dioctyl ether, and cyclopentyl methyl ether. More preferable solvents are dibutyl ether, diisobutyl ether, and diisoamyl ether. These ether solvents may be used singly or as a mixture.

The proportion of the ether solvent in the solvent in the composition of the present invention is preferably 100% by mass or may be 90% by mass or more to 100% by mass, or even 87% by mass or more to 100% by mass.

Alcohol-based solvents below or water may be mixed, if necessary, in addition to the solvent having a $C_{8-16}$ ether bond.

Examples of saturated alkyl alcohols include 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 2-methyl-2-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol, and cyclohexanol.

Examples of aromatic alcohols include 1-phenylpropanol, 2-phenylpropanol, 3-phenylpropanol, 2-phenoxyethanol, phenethyl alcohol, and styralyl alcohol.

T alcohol-based solvents and water may be used singly or in combination of two or more. The other solvents above may be added in the amount of 0.01% to 13% by mass to the solvent having a $C_{8-16}$ ether bond.

For convenience of synthesis of the polymer including the fluorine-based organic group for use in the present invention, for example, organic solvents below may be mixed together with the solvent having a $C_{8-16}$ ether bond. Examples of the solvents used include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used singly or in combination of two or more. The other solvents above can be contained in the amount of 0.01% to 13% by mass with respect to the solvent having a $C_{8-16}$ ether bond.

The resist overlayer film forming composition contains the polymer including the fluorine-based organic group and the ether-based solvent and may further include an acid compound, a basic compound, a cross-linking agent, a cross-linking catalyst, a surfactant, a rheology control agent, and the like.

The resist overlayer film forming composition of the present invention may further include an acid compound in order to match the acidity with that of the underlying resist in the lithography process. A sulfonic acid compound or a sulfonic acid ester compound may be used as the acid compound. For example, it is possible to blend an acid compound such as bis(4-hydroxyphenyl) sulfone, p-toluenesulfonic acid, trifluoromethanesulfonic acid, pyridinium p-toluenesulfonic acid, salicylic acid, sulfosalicylic acid, citric acid, benzoic acid, and hydroxybenzoic acid, and/or a thermal acid generator such as 2,4,4,6-tetrabromocyclohexadienone, benzoin tosylate, and 2-nitrobenzyl tosylate. The amount blended is 0.02% to 10% by mass, preferably 0.04% to 5% by mass relative to 100% by mass of the total solid content.

The resist overlayer film forming composition of the present invention may include an acid generator that generates an acid by exposure light (for example, ArF excimer laser, EUV radiation, and electron beam radiation) in order to match the acidity to that of the underlying resist in the lithography process.

Preferred examples of the acid generator include: onium salt-based acid generators such as bis(4-tert-butylphenyl) iodonium trifluoromethanesulfonate and triphenylsulfonium trifluoromethanesulfonate; halogen-containing compound-based acid generators such as phenyl-bis(trichloromethyl)-s-triazine; and sulfonic acid-based acid generators such as benzoin tosylate and N-hydroxysuccinimide trifluoromethanesulfonate.

The amount of the acid generator added is 0.02% to 10% by mass and preferably 0.04% to 5% by mass relative to 100% by mass of the total solid content.

The resist overlayer film forming composition of the present invention may include a basic compound. A basic compound can be added to control sensitivity during exposure of the resist. That is, the basic compound such as amine reacts with acids generated by a photo acid generator during exposure to reduce the sensitivity of the resist underlayer film, so that the top shape of the resist after exposure development can be controlled (the shape of the resist after exposure and development is preferably rectangular). The addition of the basic compound to the polymer including the fluorine-based organic group produces salt between the polymer including the fluorine-based organic group and the basic compound to achieve water solubility.

Examples of the basic compound include amines.

Examples of amine compounds include ammonia, tetramethylammonium hydroxide, tetraethylammonium hydroxide, tetrapropylammonium hydroxide, tetrabutylammonium hydroxide, 2-aminophenol, 3-aminophenol, 4-aminophenol, benzyltrimethylammonium hydroxide, benzyltriethylammonium hydroxide, benzyltripropylammonium hydroxide, benzyltributylammonium hydroxide, N-benzyldimethylamine, N-benzyldiethylamine, N-benzylmethylamine, N-benzylethylamine, N-benzylisopropylamine, N-tert-butylbenzylamine, pyridine, 4-methylpyridine, 4-ethylpyridine, 4-isopropylpyridine, 3-fluoropyridine, 4-bromopyridine, 4-fluoropyridine, 4-iodopyridine, 4-aminopyridine, 4-(bromomethyl)pyridine, 4-cyanopyridine, 4-methoxypyridine, N-(4-pyridyl)dimethylamine, 3,4-dimethylpyridine, 4-(methylamino)pyridine, 2-bromo-5-iodopyridine, 2-chloro-4-iodopyridine, 4-(aminomethyl)pyridine, 2,4,6-trimethylpyridine, 2,6-diaminopyridine, 1,5-naphthyridine, diethylamine, N-tert-butylethylamine, N,N-diethylmethylamine, N-ethylisopropylamine, N-ethylmethylamine, diisopropylamine, N,N-dimethylethylamine, triethylamine, N-diisopropylethylamine, N,N-diethylethylenediamine, ethylamine, 2-(dimethylamino)ethanol, N-methyldiethanolamine, 2-(methylamino)ethanol, triethanolamine, 2-diethylaminoethanol, N-ethyldiethanolamine, diethanolamine, N-tert-butyldiethanolamine, 1-dimethylamino-2-propanol, 2-(diisopropylamino)ethanol, 2-(dimethylamino)isobutanol, 2-(ethylamino)ethanol, 2,2,2-trifluoroethylamine, trifluoroacetamide, N-methyltrifluoroacetamide, bistrifluoroacetamide, N,N-bis(trifluoroacetyl)methylamine, N-methyl-N-trimethylsilyltrifluoroacetamide, pentadecafluorotriethylamine, 4-methylmorpholine, 4-ethylmorpholine, bis(2-morpholinoethyl) ether, 4-(2-aminoethyl)morpholine, N-cyanomethylmorpholine, 4-(2-hydroxyethyl)morpholine, 4-isobutylmorpholine, 4-acetylmorpholine, N-(2-cyanoethyl)morpholine, N-(3-aminopropyl)morpholine, 4-(3-chloropropyl)morpholine, N-(2-hydroxypropyl)morpholine, 4-(3-hydroxypropyl)morpholine, 3-morpholino-1,2-propanediol, 1-morpholino-1-cyclohexene, ethylenediamine, 1,2-propanediamine, 1,3-propanediamine, 2-methyl-1,2-propanediamine, 2,2-dimethyl-1,3-propanediamine, 1,3-butanediamine, 1,4-butanediamine, 1,3-pentanediamine (DAMP), 1,5-pentanediamine, 1,5-diamino-2-methylpentane (MPMD), 2-butyl-2-ethyl-1,5-pentanediamine (C11-neodiamine), 1,6-hexanediamine, 2,5-dimethyl-1,6-hexanediamine, 2,2,4-trimethylhexamethylenediamine (TMD), 2,4,4-trimethylhexamethylenediamine (TMD), 1,7-heptanediamine, 1,8-octanediamine, 1,9-nonanediamine, 1,10-decanediamine, 1,11-undecanediamine, 1,12-dodecanediamine, 1,2-diaminocyclohexane, 1,3-diaminocyclohexane, 1,4-diaminocyclohexane, bis(4-aminocyclohexyl)methane (H12-MDA), bis(4-amino-3-methylcyclohexyl)methane, bis(4-amino-3-ethylcyclohexyl)methane, bis(4-amino-3,5-dimethylcyclohexyl)methane, bis(4-amino-3-ethyl-5-methylcyclohexyl)methane (M-MECA), 1-amino-3-aminomethyl-3,5,5-trimethylcyclohexane (isophoronediamine or IPDA), 2-methyl-1,3-diaminocyclohexane, 4-methyl-1,3-diaminocyclohexane, 1,3-bis(aminomethyl)cyclohexane, 1,4-bis(aminomethyl)cyclohexane, 2,5(2,6)-bis(aminomethyl)bicyclo[2.2.1]heptane (NBDA), 3(4),8(9)-bis(aminomethyl)tricyclo[5.2.1.02,6]decane, 1,4-diamino-2,2,6-trimethylcyclohexane (TMCDA), 1,8-menthanediamine, 3,9-bis(3-aminopropyl)-2,4,8,10-tetraoxaspiro[5.5]undecane, 1,3-xylylenediamine, 1,4-xylylenediamine, bis(2-aminoethyl)ether, 3,6-dioxaoctane-1,8-diamine, 4,7-dioxadecane-1,10-diamine, 4,7-dioxadecane-2,9-diamine, 4,9-dioxadodecane-1,12-diamine, 5,8-dioxadodecane-3,10-diamine, 4-aminomethyl-1,8-octanediamine, 1,3,5-tris(aminomethyl)benzene, 1,3,5-tris(aminomethyl)cyclohexane, tris(2-aminoethyl)amine, tris(2-aminopropyl)amine, tris(3-aminopropyl)amine, diethylenetriamine (DETA), triethylenetetramine (TETA), tetraethylenepentamine (TEPA), pentaethylenehexamine (PEHA), dipropylenetriamine (DPTA), bishexamethylenetriamine (BHMT), 3-(2-aminoethyl)aminopropylamine (N3-amine), N,N'-bis(3-aminopropyl)ethylenediamine (N4-amine), N3-(3-aminopentyl)-1,3-pentanediamine, N5-(3-aminopropyl)-2-methyl-1,5-pentanediamine and N5-(3-amino-1-ethylpropyl)-2-methyl-1,5-pentanediamine, N,N'-bis(aminopropyl)piperazine, N,N-bis(3-aminopropyl)methylamine, N,N-bis(3-aminopropyl)ethylamine, N,N-bis(3-aminopropyl)propylamine, N,N-bis(3-aminopropyl)cyclohexylamine, N,N-bis(3-aminopropyl)-2-ethylhexylamine, N,N-bis(3-aminopropyl)dodecylamine, N,N-bis(3-aminopropyl)tallowalkylamine, methylamine, ethylamine, 1-propylamine, 2-propylamine, 1-butylamine, 2-butylamine, tert-butylamine, 3-methyl-1-butylamine, 3-methyl-2-butylamine, cyclopentylamine, hexylamine, cyclohexylamine, octylamine, 2-ethyl-1-hexylamine, benzylamine, 1-phenylethylamine, 2-phenylethylamine, decylamine, dodecylamine, tetradecylamine, hexadecylamine, octadecylamine, eicosylamine, docosylamine, cocoalkylamine, C16 to C22-alkylamine, soyaalkylamine, oleylamine, tallowalkylamine, 2-methoxyethylamine, 2-ethoxyethylamine, 3-methoxypropylamine, 3-ethoxypropylamine, 3-(2-ethylhexyloxyl)propylamine, 3-(2-methoxyethoxyl)propylamine, 2(4)-methoxyphenylethylamine N-methyl-1,2-ethanediamine, N-ethyl-1,2-ethanediamine, N-butyl-1,2-ethanediamine, N-hexyl-1,2-ethanediamine, N-butyl-1,6-hexanediamine, N-cyclohexyl-1,2-ethanediamine, 4-aminomethylpiperidine, 3-(4-aminobutyl)piperidine, N-(2-aminoethyl)piperazine (N-AEP), N-(2-aminopropyl)piperazine, N-methyl-1,3-propanediamine, N-ethyl-1,3-propanediamine, N-butyl-1,3-propanediamine, N-hexyl-1,3-propanediamine, N-(2-ethylhexyl)-1,3-propanediamine, N-dodecyl-1,3-propanediamine, N-cyclohexyl-1,3-propanediamine, 3-methylamino-1-pentylamine, 3-ethylamino-1-pentylamine, 3-butylamino-1-pentylamine, 3-hexylamino-1-pentylamine, 3-(2-ethylhexyl)amino-1-pentylamine, 3-dodecylamino-1-pentylamine, 3-cyclohexylamino-1-pentylamine, N-cocoalkyl-1,3-propanediamine, N-oleyl-1,3-propanediamine, N-soyaalkyl-1,3-propanediamine, N-tallowalkyl-1,3-propanediamine, cocoalkyldipropylenetriamine, oleyldipropylenetriamine, tallowalkyldipropylenetriamine, oleyltripropylenetetramine, tallowalkyltripropylenetetramine, N,N-diethyl-1,2-ethanediamine, N,N-dimethyl-1,3-propanediamine, N,N-diethyl-1,3-propanediamine, N,N-diethyl-1,4-pentanediamine, butylamine, pentylamine, hexylamine, cyclohexylamine, octylamine, decylamine, dodecylamine, tetradecylamine, hexadecylamine, octadecylamine, eicosylamine, docosylamine, 2-ethyl-1-hexylamine, benzylamine, 1-phenylethylamine, 2-phenylethylamine, N-hexyl-1,2-ethanediamine, N-(2-ethylhexyl)-1,2-ethanediamine, N-cyclohexyl-1,2-ethanediamine, N-butyl-1,3-propanediamine, N-hexyl-1,3-propanediamine, N-(2-ethylhexyl)-1,3-propanediamine, N-dodecyl-1,3-propanediamine, N-cyclohexyl-1,3-propanediamine, cocoalkylamine, soyaalkylamine, oleylamine, N-cocoalkyl-1,3-propanediamine, N-oleyl-1,3-propanediamine, and N-soyaalkyl-1,3-propanediamine, and more preferable examples include ammonia, tetramethylammonium hydroxide, tetraethylammonium hydroxide, tetrapropylammonium hydroxide, tetrabutylammonium hydroxide, 2-(dimethylamino)ethanol, 2,2,2-trifluoroethylamine, pyridine, and 4-methylmorpholine.

Another example is an aminobenzene compound of Formula (13-1).

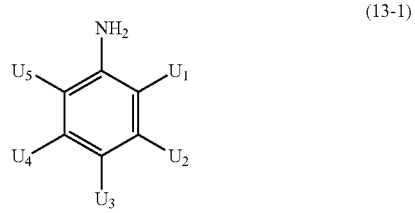

(13-1)

In Formula (13-1), $U_1$ to $U_5$ each are a hydrogen atom, a $C_{1-10}$ alkyl group, or an amino group.

Examples of the alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Among these, a linear $C_{1-5}$ alkyl group and a branched alkyl group are preferred. For example, preferred examples include a methyl group, an ethyl group, and an isopropyl group.

Examples of the compound are, for example, Formula (13-2) to Formula (13-47) below.

(13-2)

(13-3)

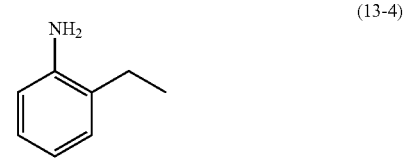

(13-4)

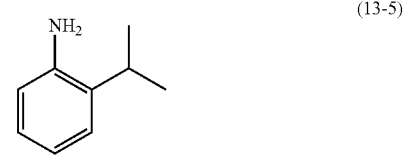

(13-5)

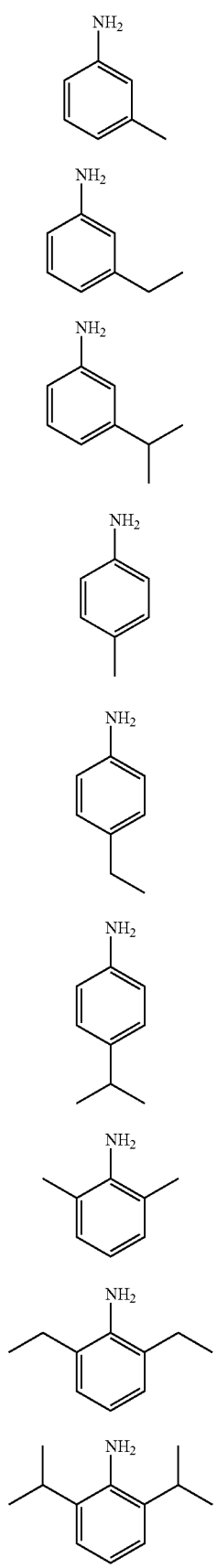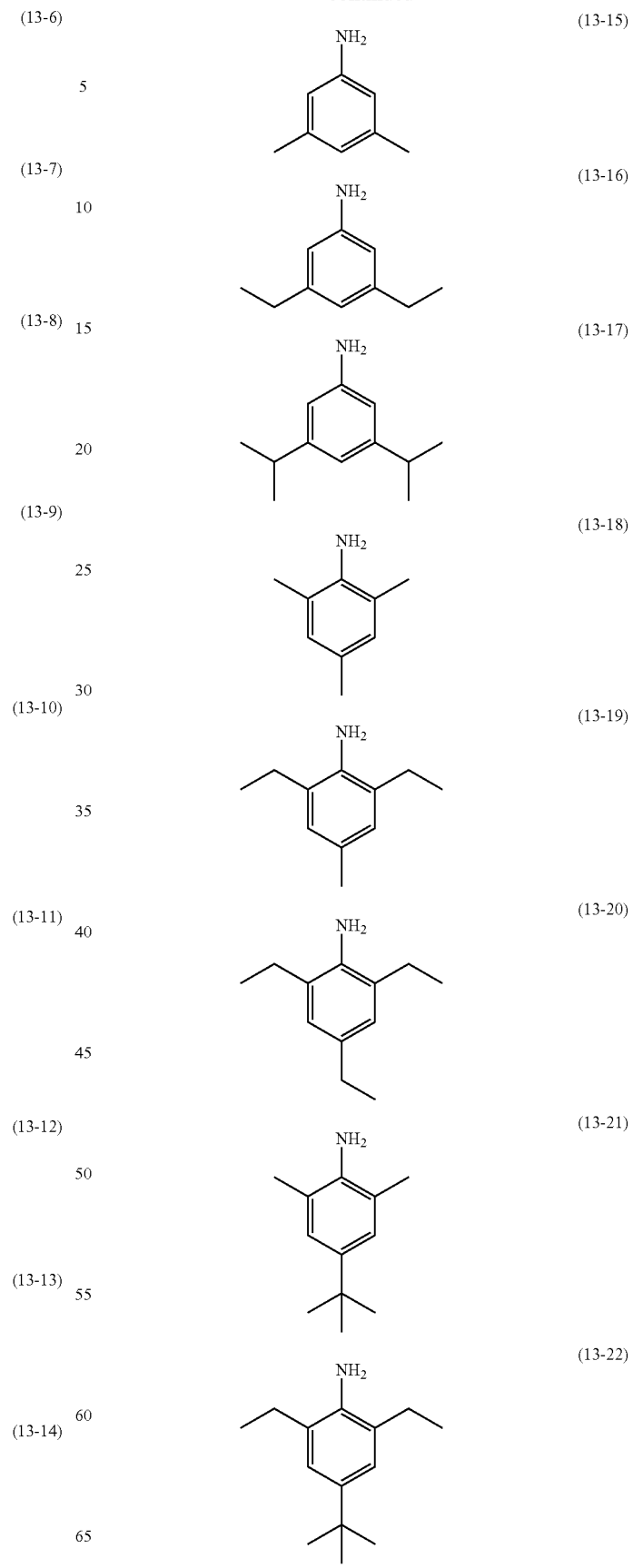

-continued (13-23) (13-30) (13-31) (13-32) (13-33) (13-34) (13-35) (13-36) (13-37) (13-38)
(13-24)
(13-25)
(13-26)
(13-27)
(13-28)
(13-29)

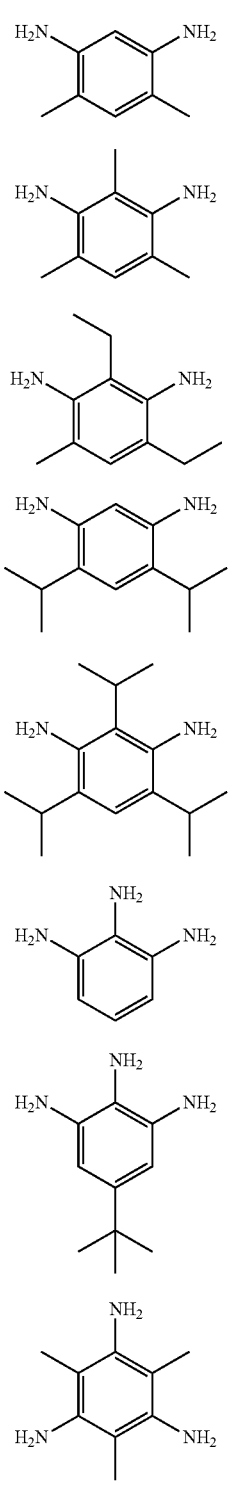

(13-39)
(13-40)
(13-41)
(13-42)
(13-43)
(13-44)
(13-46)
(13-47)

Examples include tertiary amines such as triethanolamine, tributanolamine, trimethylamine, triethylamine, trinormaipropylamine, triisopropylamine, trinormalbutylamine, tri-tert-butylamine, trinormaloctylamine, triisopropanolamine, phenyldiethanolamine, stearyldiethanolamine, and diazabicyclooctane, and aromatic amines such as pyridine and 4-dimethylaminopyridine. Other examples include primary amines such as benzylamine and normalbutylamine, and secondary amines such as diethylamine and dinormalbutylamine. These compounds may be used singly or in combination of two or more.

The resist overlayer film forming composition of the present invention may further include a rheology control agent, a surfactant, or the like as necessary in addition to the above components.

The rheology control agent is added mainly in order to improve flowability of the resist overlayer film forming composition. Specific examples include: phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate.

The ratio of these rheology control agents blended is generally less than 30% by mass with respect to 100% by mass of the total composition of the resist overlayer film forming composition.

The resist overlayer film forming composition of the present invention may further include a surfactant in order not to generate pinholes, striations, and other defects and to further improve the coating properties against surface irregularities. Examples of the surfactant include: nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants such as EFTOP EF301, EF303, and EF352 (manufactured by Tochem Products), MEGAFAC F171 and F173 (manufactured by DIC Corporation), Fluorad FC430 and FC431 (manufactured by Sumitomo 3M Ltd.), Asahiguard AG710, Surflon S-382, SC101, SC102, SC103, SC104, SC105, and SC106 (manufactured by Asahi Glass Co., Ltd.), and Fluorinated Mold Release Agents series (manufactured by NEOS COMPANY LIMITED); and organosiloxane polymer KP341 (manufactured by Shin-Etsu Chemical Co., Ltd.).

The amount of these surfactants blended is generally not more than 0.2% by mass and preferably not more than 0.1% by mass relative to 100% by mass of the total composition of the resist overlayer film forming composition of the present invention. These surfactants may be added singly or in combination of two or more.

In the present invention, EUV resists can be used. The EUV resist applied underneath the resist overlayer film in the present invention may be either negative or positive.

Examples include: a chemically amplified resist including an acid generator and a binder having a group that is decomposed by an acid to change the alkali dissolution rate; a chemically amplified resist including an alkali soluble binder, an acid generator, and a low molecular compound that is decomposed by an acid to change the alkali dissolution rate of the resist; a chemically amplified resist including an acid generator, a binder having a group that is decomposed by an acid to change the alkali dissolution rate, and a low molecular compound that is decomposed by an acid to change the alkali dissolution rate of the resist; a non-chemically amplified resist including a binder having a group that is decomposed by EUV to change the alkali dissolution rate; and a non-chemically amplified resist including a binder having a moiety that is broken by EUV to change the alkali dissolution rate. Examples of the EUV resist materials include methacrylate-based materials, PHS-based materials, and hybrid materials containing both methacrylate and hydroxystyrene (HS). In the case where these EUV resists are used, resist patterns can be formed in the same manner as in the case where resists are used with electron beams as a radiation source.

In the present invention, a KrF resist or an ArF resist can be used. The KrF resist or the ArF resist applied under the resist overlayer film in the present invention may be either a negative photoresist or a positive photoresist. Examples of the resist include a positive photoresist including a novolac resin and 1,2-naphthoquinonediazidesulfonic acid ester, a chemically amplified photoresist including a binder having a group decomposed by acids to increase the alkali dissolution rate and a photo acid generator, a chemically amplified photoresist including a low molecular weight compound decomposed by acids to increase the alkali dissolution rate of the photoresist, an alkali soluble binder, and a photo acid generator, and a chemically amplified photoresist including a binder having a group decomposed by acids to increase the alkali dissolution rate, a low molecular weight compound decomposed by acids to increase the alkali dissolution rate of the photoresist, and a photo acid generator. Examples include the trade name APEX-E manufactured by The Dow Chemical Company (ex-Rohm and Haas Electronic Materials), the trade name PAR710 manufactured by Sumitomo Chemical Industry Co., Ltd., and the trade name SEPR430 manufactured by Shin-Etsu Chemical Co., Ltd. Another example is a fluorine atom-containing polymer-based photoresist, for example, as described in ProC. SPIE, Vol. 3999, 330-334 (2000), ProC. SPIE, Vol. 3999, 357-364 (2000), and ProC. SPIE, Vol. 3999, 365-374 (2000).

In the present invention, an electron beam (EB) resist can be used. The electron beam resist applied under the resist overlayer film in the present invention may be either a negative photoresist or a positive photoresist. Examples of the resist include a chemically amplified resist including an acid generator and a binder having a group decomposed by acids to change the alkali dissolution rate, a chemically amplified resist including an alkali soluble binder, an acid generator, and a low molecular weight compound decomposed by acids to change the alkali dissolution rate of the resist, a chemically amplified resist including an acid generator, a binder having a group decomposed by acids to change the alkali dissolution rate, and a low molecular weight compound decomposed by acids to change the alkali dissolution rate of the resist, a non-chemically amplified resist including a binder having a group decomposed by electron beams to change the alkali dissolution rate, and a non-chemically amplified resist including a binder having a moiety broken by electron beams to change the alkali dissolution rate. The resist pattern can be formed using such electron beam resists in the same manner as when a photoresist is used with KrF or ArF light as a source of radiation.

Examples of the developer for a positive resist having a resist overlayer film formed with the resist overlayer film forming composition of the present invention include aqueous solutions of alkalis including: inorganic alkalis such as sodium hydroxide, potassium hydroxide, sodium carbonate, sodium silicate, sodium metasilicate, and aqueous ammonia; primary amines such as ethylamine and N-propylamine; secondary amines such as diethylamine and di-N-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. The aqueous solutions of alkalis may contain alcohols such as isopropyl alcohol or a surfactant such as a nonionic surfactant in an appropriate amount to be used. Among these developers, quaternary ammonium salts are preferred, and tetramethylammonium hydroxide and choline are more preferred.

In the present invention, a semiconductor device can be manufactured, for example, by forming an EUV resist film on a substrate having a target film onto which a transfer pattern is to be formed, with or without an EUV resist underlayer film; applying the EUV resist overlayer film forming composition onto the resist film and baking the composition to form an EUV resist overlayer film; exposing the semiconductor substrate coated with the resist overlayer film and the resist film; and performing development after exposure to remove the resist overlayer film and the resist film. The exposure is performed with EUV light (at a wavelength of 13.5 nm).

The resist overlayer film is generally formed by spin coating in the same manner as in formation of a resist film. For example, a substrate (for example, a silicon/silicon dioxide-coated substrate, a glass substrate, or an ITO substrate) is set on a spin coater manufactured by Tokyo Electron Limited, a resist film is formed on the substrate, and the resist overlayer film forming composition (varnish) is applied on the substrate with a spin rate of 700 rpm to 3000 rpm, followed by baking the composition on a hot plate at 50° C. to 150° C. for 30 to 300 seconds to form the resist overlayer film. The thickness of the resist overlayer film formed is 3 nm to 100 nm, 5 nm to 100 nm, or 5 nm to 50 nm.

The dissolution rate of the resist overlayer film in a photoresist developer is 1 nm or more per second, preferably 3 nm or more per second, more preferably 10 nm or more per second. If the dissolution rate is smaller than these values, the time required for removing the resist overlayer film is increased, resulting in lower productivity. After that, by pattern formation with appropriate exposure light followed by development using a resist developer to remove unnecessary parts of the resist and the resist overlayer film, a resist pattern is formed.

The semiconductor device to which the EUV resist overlayer film forming composition of the present invention is applied is configured such that a target film onto which a pattern is to be transferred, a resist film, and a resist overlayer film are successively formed on a substrate. The resist overlayer film reduces the adverse effects caused by the underlying substrate and EUV, so that a good resist pattern having a straight shape can be formed and a sufficient margin for EUV irradiance level can be obtained. The present resist overlayer film has a high wet etching rate equivalent to or greater than the underlying resist film and can be easily removed together with unnecessary parts of the resist film after exposure with an alkaline developer or the like.

The substrate of the semiconductor device can be processed either by a dry etching process or a wet etching process. The good resist pattern formed by using the resist overlayer film can be used as a mask to transfer a good shape on the substrate by dry etching or wet etching.

In the present invention, a semiconductor device can be produced, for example, by the steps comprising: forming a KrF resist film on a substrate having a target film onto which a transfer pattern is to be formed, with or without a KrF resist underlayer film; applying a KrF resist overlayer film forming composition on the resist film and baking the composition to form a KrF resist overlayer film; exposing the semiconductor substrate covered with the resist overlayer film and the resist film; and performing development after exposure to remove the resist overlayer film and the resist film. The exposure is performed with KrF. The resist overlayer film is formed in the same manner as in the EUV exposure.

In the present invention, a semiconductor device can be produced, for example, by the steps comprising: forming an ArF resist film on a substrate having a target film onto which a transfer pattern is to be formed, with or without an ArF resist underlayer film; applying an ArF resist overlayer film forming composition on the resist film and baking the composition to form an ArF resist overlayer film; exposing the semiconductor substrate covered with the resist overlayer film and the resist film; and performing development after exposure to remove the resist overlayer film and the resist film. The exposure is performed with ArF. The resist overlayer film is formed in the same manner as in the EUV exposure.

In the present invention, a semiconductor device can be produced, for example, by the steps comprising: forming an electron beam resist film on a substrate having a target film onto which a transfer pattern is to be formed, with or without an electron beam resist underlayer film; applying an electron beam resist overlayer film forming composition on the resist film and baking the composition to form an electron beam resist overlayer film; exposing the semiconductor substrate covered with the resist overlayer film and the resist film; and performing development after exposure to remove the resist overlayer film and the resist film. The exposure is performed with electron beams. The resist overlayer film is formed in the same manner as in the EUV exposure.

EXAMPLES

The weight average molecular weights (Mw) of the polymers shown in Synthesis Example 1 to Synthesis Example 59 below in the present description were measured by GPC (Gel Permeation Chromatography). In the measurement, a GPC apparatus manufactured by TOSOH CORPORATION was used under the measurement conditions below. The degree of distribution shown in each synthesis example below in the present description is calculated from the measured weight average molecular weight and number average molecular weight.

Measurement device: HLC-8320GPC [trade name] (manufactured by TOSOH CORPORATION)

GPC column: TSKgel SuperMultipore HZ-N (P0009) [trade name] (manufactured by TOSOH CORPORATION), TSKgel SuperMultipore HZ-N (P0010) [trade name] (manufactured by TOSOH CORPORATION)

Column temperature: 40° C.

Solvent: tetrahydrofuran (THF)

Flow rate: 0.35 ml/min

Standard sample: polystyrene (manufactured by TOSOH CORPORATION)

Synthesis Example 1

In 28.0 g of propyleneglycol monomethyl ether, 3.0 g of 1,5-dihydroxynaphthalene (the compound of Formula 3-18), 0.9 g of 4-hydroxybenzaldehyde (the compound of Formula 5-39), 2.7 g of 3,5-bis(trifluoromethyl)benzaldehyde (the compound of Formula 5-27), and 0.37 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a brown polymer. The main structural formulae of the resulting polymer are shown as (Formula 10-1) and (Formula 10-2). A GPC analysis was conducted to show that the resulting polymer had a weight average molecular weight of 2680.

Synthesis Example 2

In 28.9 g of propyleneglycol monomethyl ether, 3.0 g of 1,5-dihydroxynaphthalene (the compound of Formula 3-18), 0.68 g of 4-hydroxybenzaldehyde (the compound of Formula 5-39), 3.1 g of 3,5-bis(trifluoromethyl)benzaldehyde (the compound of Formula 5-27), and 0.37 g of p-toluenesulfonic acid monohydrate were added and dissolved. After nitrogen was introduced into the reactor, the reaction was allowed to proceed at 140° C. for four hours, yielding a polymer solution. The resulting solution was added into a solution of methanol:water=1:9, yielding a brown polymer. The main structural formulae of the resulting polymer are shown as (Formula 10-1) and (Formula 10-2). A GPC analysis was conducted to show that the resulting polymer had a weight average molecular weight of 2189.

Synthesis Example 3

In 29.8 g of propyleneglycol monomethyl ether, 3.0 g of 1,5-dihydroxynaphthalene (the compound of Formula 3-18), 0.45 g of 4-hydroxybenzaldehyde (the compound of Formula 5-39), 3.6 g of 3,5-bis(trifluoromethyl)benzaldehyde (the compound of Formula 5-27), and 0.37 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a brown polymer. The main structural formulae of the resulting polymer are shown as (Formula 10-1) and (Formula 10-2). A GPC analysis was conducted to show that the resulting polymer had a weight average molecular weight of 2311.

Synthesis Example 4

In 33.2 g of propyleneglycol monomethyl ether, 3.5 g of 1,5-dihydroxynaphthalene (the compound of Formula 3-18), 1.2 g of 3,4-dihydroxybenzaldehyde (the compound of Formula 5-41), 3.6 g of 3,5-bis(trifluoromethyl)benzaldehyde (the compound of Formula 5-27), and 0.43 g of p-toluenesulfonic acid monohydrate were added and dissolved. After nitrogen was introduced into the reactor, the reaction was allowed to proceed at 140° C. for four hours, yielding a polymer solution. The resulting solution was added into a solution of methanol:water=1:9, yielding a brown polymer. The main structural formulae of the resulting polymer are shown as (Formula 10-2) and (Formula 10-3). A GPC analysis was conducted to show that the resulting polymer had a weight average molecular weight of 2257.

Synthesis Example 5

In 35.0 g of propyleneglycol monomethyl ether, 3.5 g of 1,5-dihydroxynaphthalene (the compound of Formula 3-18), 0.6 g of 3,4-dihydroxybenzaldehyde (the compound of Formula 5-41), 4.2 g of 3,5-bis(trifluoromethyl)benzaldehyde (the compound of Formula 5-27), and 0.43 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a brown polymer. The main structural formulae of the resulting polymer are shown as (Formula 10-2) and (Formula 10-3). A GPC analysis was conducted to show that the resulting polymer had a weight average molecular weight of 2273.

Synthesis Example 6

In 33.8 g of propyleneglycol monomethyl ether, 3.5 g of 1,5-dihydroxynaphthalene (the compound of Formula 3-18), 1.3 g of 2,4,6-trihydroxybenzaldehyde (the compound of Formula 5-40), 3.2 g of 3,5-bis(trifluoromethyl)benzaldehyde (the compound of Formula 5-27), and 0.43 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a brown polymer. The main structural formulae of the resulting polymer are shown as (Formula 10-2) and (Formula 10-4). A GPC analysis was conducted to show that the resulting polymer had a weight average molecular weight of 1300.

Synthesis Example 7

In 35.3 g of propyleneglycol monomethyl ether, 3.5 g of 1,5-dihydroxynaphthalene (the compound of Formula 3-18), 0.67 g of 2,4,6-trihydroxybenzaldehyde (the compound of Formula 5-40), 4.2 g of 3,5-bis(trifluoromethyl)benzaldehyde (the compound of Formula 5-27), and 0.43 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a brown polymer. The main structural formulae of the resulting polymer are shown as (Formula 10-2) and (Formula 10-4). A GPC analysis was conducted to show that the resulting polymer had a weight average molecular weight of 1303.

Synthesis Example 8

In 31.6 g of propyleneglycol monomethyl ether, 3.0 g of 1,5-dihydroxynaphthalene (the compound of Formula 3-18), 4.5 g of 3,5-bis(trifluoromethyl)benzaldehyde (the compound of Formula 5-27), and 0.37 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a brown polymer. The main structural formula of the resulting polymer is shown as (Formula 10-2). A GPC analysis was conducted to show that the resulting polymer had a weight average molecular weight of 2702.

Synthesis Example 9

In 14.6 g of propyleneglycol monomethyl ether, 3.0 g of phloroglucinol (the compound of Formula 3-16), 5.7 g of 3,5-bis(trifluoromethyl)benzaldehyde (the compound of Formula 5-27), and 0.94 g of p-toluenesulfonic acid monohydrate were added and dissolved. After purging the reactor with nitrogen, the reaction was allowed to proceed at 140° C. for six hours, yielding a polymer solution. The resulting solution was added into a solution of methanol:water=1:9, yielding a brown polymer. The main structural formula of the resulting polymer is shown as (Formula 10-5). A GPC analysis was conducted to show that the resulting polymer had a weight average molecular weight of 4463.

Synthesis Example 10

In 16.5 g of propyleneglycol monomethyl ether, 2.5 g of 2,2,3,3,4,4,4-heptafluorobutyl methacrylate (the compound of Formula 1-9-1), 1.43 g of 2-vinylnaphthalene (the compound of Formula 1-10-11), and 0.19 g of 2,2'-azodiisobutyronitrile were added and dissolved. After purging the reactor with nitrogen, the reaction was allowed to proceed at 80° C. for six hours, yielding a polymer solution. The structural formula of the resulting polymer is shown as (Formula 11-1). A GPC analysis was conducted to show that the resulting polymer had a weight average molecular weight of 10232.

Synthesis Example 11

In 17.7 g of propyleneglycol monomethyl ether, 5.0 g of 1,1,2,2-tetrakis(4-hydroxyphenyl)ethane (product name: TEP-DF, manufactured by ASAHI ORGANIC CHEMICALS INDUSTRY CO., LTD.) (the compound of Formula 4-21), 0.34 g of 3,4-dihydroxybenzaldehyde (the compound of Formula 5-41), 5.46 g of 3,5-bis(trifluoromethyl)benzaldehyde (the compound of Formula 5-27), and 1.00 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a yellow polymer. The main structural formulae of the resulting polymer are shown as (Formula 10-6) and (Formula 10-7). A GPC analysis was conducted to show that the resulting polymer had a weight average molecular weight of 5052.

Synthesis Example 12

In 19.3 g of propyleneglycol monomethyl ether, 6.0 g of α,α,α',α'-tetrakis(4-hydroxyphenyl)-p-xylene (product name: TEP-TPA, manufactured by ASAHI ORGANIC CHEMICALS INDUSTRY CO., LTD.) (the compound of Formula 4-22), 0.34 g of 3,4-dihydroxybenzaldehyde (the compound of Formula 5-41), 5.51 g of 3,5-bis(trifluoromethyl)benzaldehyde (the compound of Formula 5-27), and 1.00 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a red polymer. The main structural formulae of the resulting polymer are shown as (Formula 10-8) and (Formula 10-9). A GPC analysis was conducted to show that the resulting polymer had a weight average molecular weight of 13315.

Synthesis Example 13

In 22.66 g of propyleneglycol monomethyl ether, 7.0 g of 1,1,2,2-tetrakis(4-hydroxyphenyl)ethane (product name:

TEP-DF, manufactured by ASAHI ORGANIC CHEMICALS INDUSTRY CO., LTD.) (the compound of Formula 4-21), 0.41 g of 3,4-dihydroxybenzaldehyde (the compound of Formula 5-41), 6.51 g of 3,5-bis(trifluoromethyl)benzaldehyde (the compound of Formula 5-27), and 1.19 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a yellow polymer. The main structural formulae of the resulting polymer are shown as (Formula 10-6) and (Formula 10-7). A GPC analysis was conducted to show that the resulting polymer had a weight average molecular weight of 4596.

Synthesis Example 14

In 17.7 g of propyleneglycol monomethyl ether, 5.0 g of 4,4',4"-trihydroxytriphenylmethane (the compound of Formula 4-25), 0.71 g of 3,4-dihydroxybenzaldehyde (the compound of Formula 5-41), 11.18 g of 3,5-bis(trifluoromethyl)benzaldehyde (the compound of Formula 5-27), and 2.04 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a red polymer. The main structural formulae of the resulting polymer are shown as (Formula 10-10) and (Formula 10-11). A GPC analysis was conducted to show that the resulting polymer had a weight average molecular weight of 4597.

Synthesis Example 15

In 28.72 g of propyleneglycol monomethyl ether, 5.0 g of 1,1,2,2-tetrakis(4-hydroxyphenyl)ethane (product name: TEP-DF, manufactured by ASAHI ORGANIC CHEMICALS INDUSTRY CO., LTD.) (the compound of Formula 4-21), 12.15 g of 3,5-bis(trifluoromethyl)benzaldehyde (the compound of Formula 5-27), and 1.99 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a yellow polymer. The main structural formula of the resulting polymer is shown as (Formula 10-12). A GPC analysis was conducted to show that the resulting polymer had a weight average molecular weight of 19773.

Synthesis Example 16

In 25.17 g of propyleneglycol monomethyl ether, 7.0 g of 1,1,2,2-tetrakis(4-hydroxyphenyl)ethane (product name: TEP-DF, manufactured by ASAHI ORGANIC CHEMICALS INDUSTRY CO., LTD.) (the compound of Formula 4-21), 0.97 g of 3,4-dihydroxybenzaldehyde (the compound of Formula 5-41), 7.66 g of 3,5-bis(trifluoromethyl)benzaldehyde (the compound of Formula 5-27), and 1.15 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a yellow polymer. The main structural formulae of the resulting polymer are shown as (Formula 10-6) and (Formula 10-7). A GPC analysis was conducted to show that the resulting polymer had a weight average molecular weight of 4866.

Synthesis Example 17

In 22.90 g of propyleneglycol monomethyl ether, 7.0 g of 1,1,2,2-tetrakis(4-hydroxyphenyl)ethane (product name: TEP-DF, manufactured by ASAHI ORGANIC CHEMICALS INDUSTRY CO., LTD.) (the compound of Formula 4-21), 0.437 g of 3,4-dihydroxybenzaldehyde (the compound of Formula 5-41), 6.89 g of 3,5-bis(trifluoromethyl)benzaldehyde (the compound of Formula 5-27), and 0.94 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a yellow polymer. The main structural formulae of the resulting polymer are shown as (Formula 10-6) and (Formula 10-7). A GPC analysis was conducted to show that the resulting polymer had a weight average molecular weight of 4631.

Synthesis Example 18

In 22.35 g of propyleneglycol monomethyl ether, 4.0 g of 1,1,2,2-tetrakis(4-hydroxyphenyl)ethane (product name: TEP-DF, manufactured by ASAHI ORGANIC CHEMICALS INDUSTRY CO., LTD.) (the compound of Formula 4-21), 0.55 g of 3,4-dihydroxybenzaldehyde (the compound of Formula 5-41), 8.75 g of 3,5-bis(trifluoromethyl)benzaldehyde (the compound of Formula 5-27), and 1.60 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a yellow polymer. The main structural formulae of the resulting polymer are shown as (Formula 10-12) and (Formula 10-13). A GPC analysis was conducted to show that the resulting polymer had a weight average molecular weight of 6695.

Synthesis Example 19

In 26.20 g of propyleneglycol monomethyl ether, 8.0 g of 1,1,2,2-tetrakis(4-hydroxyphenyl)ethane (product name: TEP-DF, manufactured by ASAHI ORGANIC CHEMICALS INDUSTRY CO., LTD.) (the compound of Formula 4-21), 8.75 g of 3,5-bis(trifluoromethyl)benzaldehyde (the compound of Formula 5-27), and 0.72 g of p-toluenesulfonic acid monohydrate were added and dissolved. After purging the reactor with nitrogen, the reaction was allowed to proceed at 140° C. for four hours, yielding a polymer solution. The resulting solution was added into a solution of methanol:water=1:9, yielding a yellow polymer. The main structural formula of the resulting polymer is shown as (Formula 10-6). A GPC analysis was conducted to show that the resulting polymer had a weight average molecular weight of 3333.

Synthesis Example 20

In 42.37 g of propyleneglycol monomethyl ether, 5.0 g of 1,5-dihydroxynaphthalene (the compound of Formula 3-18), 6.99 g of 3,5-dibromo-4-hydroxybenzaldehyde (the compound of Formula 5-37), 1.5 g of 3,5-bis(trifluoromethyl)benzaldehyde (the compound of Formula 5-27), and 0.62 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-14). A GPC analysis was conducted to show that the resulting novolac polymer had a weight average molecular weight of 4759.

Synthesis Example 21

In 41.66 g of propyleneglycol monomethyl ether, 5.0 g of 1,5-dihydroxynaphthalene (the compound of Formula 3-18), 5.24 g of 3,5-dibromo-4-hydroxybenzaldehyde (the compound of Formula 5-37), 3.02 g of 3,5-bis(trifluoromethyl)benzaldehyde (the compound of Formula 5-27), and 0.62 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-14). A GPC analysis was conducted to show that the resulting novolac polymer had a weight average molecular weight of 4526.

Synthesis Example 22

In 16.48 g of propyleneglycol monomethylether acetate, 5.0 g of 2,2'-biphenol (the compound of Formula 5-11), 1.31 g of 4-hydroxybenzaldehyde (the compound of Formula 5-39), 3.9 g of 3,5-bis(trifluoromethyl)benzaldehyde (the compound of Formula 5-27), and 0.774 g of methanesulfonic acid were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-15) and (Formula 10-16). A GPC analysis was conducted to show that the resulting novolac polymer had a weight average molecular weight of 2449.

Synthesis Example 23

In 16.35 g of propyleneglycol monomethyl ether, 3.0 g of 1,5-dihydroxynaphthalene (the compound of Formula 3-18), 0.9 g of 4-hydroxybenzaldehyde (the compound of Formula 5-39), 2.7 g of 3,5-bis(trifluoromethyl)benzaldehyde (the compound of Formula 5-27), and 0.37 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-1) and (Formula 10-2). A GPC analysis was conducted to show that the resulting novolac polymer had a weight average molecular weight of 3431.

Synthesis Example 24

In 41.58 g of propyleneglycol monomethyl ether, 7.5 g of 1,5-dihydroxynaphthalene (the compound of Formula 3-18), 2.58 g of 3,4-dihydroxybenzaldehyde (the compound of Formula 5-41), 6.8 g of 3,5-bis(trifluoromethyl)benzaldehyde (the compound of Formula 5-27), and 0.93 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 3186.

Synthesis Example 25

In 17.82 g of propyleneglycol monomethyl ether, 7.5 g of 1,5-dihydroxynaphthalene (the compound of Formula 3-18), 2.58 g of 2,4-dihydroxybenzaldehyde (the compound of Formula 5-42), 6.8 g of 3,5-bis(trifluoromethyl)benzaldehyde (the compound of Formula 5-27), and 0.93 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-19). A GPC analysis was conducted to show that the resulting novolac polymer had a weight average molecular weight of 2163.

Synthesis Example 26

In 11.69 g of propyleneglycol monomethyl ether, 2.0 g of 1,5-dihydroxynaphthalene (the compound of Formula 3-18), 2.58 g of 6-hydroxy-2-naphthaldehyde (the compound of Formula 5-43), 2.11 g of 3,5-bis(trifluoromethyl)benzaldehyde (the compound of Formula 5-27), and 0.24 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-20). A GPC analysis was conducted to show that the resulting novolac polymer had a weight average molecular weight of 7209.

Synthesis Example 27

In 22.50 g of propyleneglycol monomethyl ether, 4.0 g of 1,5-dihydroxynaphthalene (the compound of Formula 3-18), 1.52 g of vanillin (the compound of Formula 5-33), 3.62 g of 3,5-bis(trifluoromethyl)benzaldehyde (the compound of Formula 5-27), and 0.49 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-21). A GPC analysis was conducted to show that the resulting novolac polymer had a weight average molecular weight of 3216.

Synthesis Example 28

In 22.45 g of propyleneglycol monomethyl ether, 4.0 g of 1,5-dihydroxynaphthalene (the compound of Formula 3-18), 1.50 g of 4-hydroxy-3,5-dimethylbenzaldehyde (the compound of Formula 5-35), 3.62 g of 3,5-bis(trifluoromethyl)benzaldehyde (the compound of Formula 5-27), and 0.49 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-22). A GPC analysis was conducted to show that the resulting novolac polymer had a weight average molecular weight of 2818.

Synthesis Example 29

In 22.17 g of propyleneglycol monomethyl ether, 4.0 g of 1,5-dihydroxynaphthalene (the compound of Formula 3-18), 1.20 g of 3,4-dihydroxybenzaldehyde (the compound of Formula 5-41), 3.6 g of 3,5-bis(trifluoromethyl)benzaldehyde (the compound of Formula 5-27), 0.17 g of p-anisaldehyde (the compound of Formula 5-44), and 0.49 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-23). A GPC analysis was conducted to show that the resulting novolac polymer had a weight average molecular weight of 3280.

Synthesis Example 30

In 22.29 g of propyleneglycol monomethyl ether, 4.0 g of 1,5-dihydroxynaphthalene (the compound of Formula 3-18), 1.20 g of 3,4-dihydroxybenzaldehyde (the compound of Formula 5-41), 3.6 g of 3,5-bis(trifluoromethyl)benzaldehyde (the compound of Formula 5-27), 0.21 g of 4-diethylaminobenzaldehyde (the compound of Formula 5-29), and 0.49 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-24). A GPC analysis was conducted to show that the resulting novolac polymer had a weight average molecular weight of 2373.

Synthesis Example 31

In 22.40 g of propyleneglycol monomethyl ether, 4.0 g of 1,5-dihydroxynaphthalene (the compound of Formula 3-18), 1.20 g of 3,4-dihydroxybenzaldehyde (the compound of Formula 5-41), 3.6 g of 3,5-bis(trifluoromethyl)benzaldehyde (the compound of Formula 5-27), 0.44 g of 4-diethylaminobenzaldehyde (the compound of Formula 5-29), and 0.49 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-24). A GPC analysis was conducted to show that the resulting novolac polymer had a weight average molecular weight of 1973.

Synthesis Example 32

In 22.21 g of propyleneglycol monomethyl ether, 4.0 g of 1,5-dihydroxynaphthalene (the compound of Formula 3-18), 1.20 g of 3,4-dihydroxybenzaldehyde (the compound of Formula 5-41), 3.6 g of 3,5-bis(trifluoromethyl)benzaldehyde (the compound of Formula 5-27), 0.19 g of 4-dimethylaminobenzaldehyde (the compound of Formula 5-28), and 0.49 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-25). A GPC analysis was conducted to show that the resulting novolac polymer had a weight average molecular weight of 2646.

Synthesis Example 33

In 22.21 g of propyleneglycol monomethyl ether, 4.0 g of 1,5-dihydroxynaphthalene (the compound of Formula 3-18), 1.20 g of 3,4-dihydroxybenzaldehyde (the compound of Formula 5-41), 3.6 g of 3,5-bis(trifluoromethyl)benzaldehyde (the compound of Formula 5-27), 0.19 g of 2,3-(methylenedioxy)benzaldehyde (the compound of Formula 5-31), and 0.49 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-26). A GPC analysis was conducted to show that the resulting novolac polymer had a weight average molecular weight of 3311.

Synthesis Example 34

In 40.44 g of propyleneglycol monomethyl ether, 7.5 g of 1,5-dihydroxynaphthalene (the compound of Formula 3-18), 3.23 g of 3,4-dihydroxybenzaldehyde (the compound of Formula 5-41), 5.66 g of 3,5-bis(trifluoromethyl)benzaldehyde (the compound of Formula 5-27), and 0.93 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 2993.

Synthesis Example 35

In 46.40 g of propyleneglycol monomethyl ether, 7.5 g of 1,5-dihydroxynaphthalene (the compound of Formula 3-18), 3.1 g of 3,4-dihydroxybenzaldehyde (the compound of Formula 5-41), 8.16 g of 3,5-bis(trifluoromethyl)benzaldehyde (the compound of Formula 5-27), and 1.11 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 5684.

Synthesis Example 36

In 48.81 g of propyleneglycol monomethyl ether, 7.5 g of 1,5-dihydroxynaphthalene (the compound of Formula 3-18), 3.36 g of 3,4-dihydroxybenzaldehyde (the compound of Formula 5-41), 8.84 g of 3,5-bis(trifluoromethyl)benzaldehyde (the compound of Formula 5-27), and 1.21 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 6006.

Synthesis Example 37

In 42.78 g of propyleneglycol monomethyl ether, 7.5 g of 1,5-dihydroxynaphthalene (the compound of Formula 3-18), 2.71 g of 3,4-dihydroxybenzaldehyde (the compound of Formula 5-41), 7.14 g of 3,5-bis(trifluoromethyl)benzaldehyde (the compound of Formula 5-27), and 0.97 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 3615.

Synthesis Example 38

In 42.78 g of propyleneglycol monomethylether acetate, 7.5 g of 1,5-dihydroxynaphthalene (the compound of Formula 3-18), 2.71 g of 3,4-dihydroxybenzaldehyde (the compound of Formula 5-41), 7.14 g of 3,5-bis(trifluoromethyl) benzaldehyde (the compound of Formula 5-27), and 0.97 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 4923.

Synthesis Example 39

In 42.78 g of 4-methyl-2-pentanol, 7.5 g of 1,5-dihydroxynaphthalene (the compound of Formula 3-18), 2.71 g of 3,4-dihydroxybenzaldehyde (the compound of Formula 5-41), 7.14 g of 3,5-bis(trifluoromethyl)benzaldehyde (the compound of Formula 5-27), and 0.97 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 2958.

Synthesis Example 40

In 10.31 g of propyleneglycol monomethylether acetate, 3.0 g of 2,2'-biphenol (the compound of Formula 5-11), 0.93 g of 3,4-dihydroxybenzaldehyde (the compound of Formula 5-41), 2.4 g of 3,5-bis(trifluoromethyl)benzaldehyde (the compound of Formula 5-27), and 0.48 g of methanesulfonic acid were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-16) and (Formula 10-17). A GPC analysis was conducted to show that the resulting novolac polymer had a weight average molecular weight of 2451.

Synthesis Example 41

In 10.05 g of propyleneglycol monomethylether acetate, 3.0 g of 2,2'-biphenol (the compound of Formula 5-11), 1.16 g of 3,4-dihydroxybenzaldehyde (the compound of Formula 5-41), 2.04 g of 3,5-bis(trifluoromethyl)benzaldehyde (the compound of Formula 5-27), and 0.48 g of methanesulfonic acid were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-16) and (Formula 10-17). A GPC analysis was conducted to show that the resulting novolac polymer had a weight average molecular weight of 2395.

Synthesis Example 42

In 41.01 g of propyleneglycol monomethyl ether, 7.5 g of 1,5-dihydroxynaphthalene (the compound of Formula 3-18), 2.91 g of 3,4-dihydroxybenzaldehyde (the compound of Formula 5-41), 6.23 g of 3,5-bis(trifluoromethyl)benzaldehyde (the compound of Formula 5-27), and 0.93 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-3). A GPC analysis was conducted to show that the resulting novolac polymer had a weight average molecular weight of 3238.

Synthesis Example 43

In 19.59 g of propyleneglycol monomethyl ether, 2.0 g of 1,5-dihydroxynaphthalene (the compound of Formula 3-18), 0.64 g of 6-hydroxy-2-naphthaldehyde (the compound of Formula 5-43), 2.11 g of 3,5-bis(trifluoromethyl)benzaldehyde (the compound of Formula 5-27), and 0.12 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-20). A GPC analysis was conducted to show that the resulting novolac polymer had a weight average molecular weight of 3923.

Synthesis Example 44

In 36.20 g of propyleneglycol monomethyl ether, 7.5 g of 1,5-dihydroxynaphthalene (the compound of Formula 3-18), 1.83 g of 4-hydroxybenzaldehyde (the compound of Formula 5-39), 5.44 g of 3,5-bis(trifluoromethyl)benzaldehyde (the compound of Formula 5-27), and 0.74 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-1) and (Formula 10-2). A GPC analysis was conducted to show that the resulting novolac polymer had a weight average molecular weight of 2120.

Synthesis Example 45

In 19.28 g of propyleneglycol monomethyl ether, 2.0 g of 1,5-dihydroxynaphthalene (the compound of Formula 3-18), 1.12 g of 6-hydroxy-2-naphthaldehyde (the compound of Formula 5-43), 1.58 g of 3,5-bis(trifluoromethyl)benzaldehyde (the compound of Formula 5-27), and 0.10 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-20). A GPC analysis was conducted to show that the resulting novolac polymer had a weight average molecular weight of 3664.

Synthesis Example 46

In 9.9 g of propyleneglycol monomethylether acetate, 3.0 g of 2,2'-biphenol (the compound of Formula 5-11), 1.11 g of 3,4-dihydroxybenzaldehyde (the compound of Formula 5-41), 1.95 g of 3,5-bis(trifluoromethyl)benzaldehyde (the compound of Formula 5-27), and 0.54 g of methanesulfonic acid were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-16) and (Formula 10-17). A GPC analysis was conducted to show that the resulting novolac polymer had a weight average molecular weight of 1145.

Synthesis Example 47

In 31.05 g of propyleneglycol monomethyl ether, 7.5 g of phloroglucinol (the compound of Formula 3-16), 3.61 g of 3,4-dihydroxybenzaldehyde (the compound of Formula 5-41), 7.2 g of 3,5-bis(trifluoromethyl)benzaldehyde (the compound of Formula 5-27), and 2.36 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-5) and (Formula 10-29). A GPC analysis was conducted to show that the resulting novolac polymer had a weight average molecular weight of 1636.

Synthesis Example 48

In 27.96 g of propyleneglycol monomethyl ether, 7.5 g of 1,5-dihydroxynaphthalene (the compound of Formula 3-18), 3.61 g of 3,4,5-trihydroxybenzaldehyde (the compound of Formula 5-46), 5.66 g of 3,5-bis(trifluoromethyl)benzaldehyde (the compound of Formula 5-27), and 1.81 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2) and (Formula 10-5-1). A GPC analysis was conducted to show that the resulting novolac polymer had a weight average molecular weight of 2503.

Synthesis Example 49

In 29.16 g of propyleneglycol monomethyl ether, 4.0 g of 1,5-dihydroxynaphthalene (the compound of Formula 3-18), 1.38 g of 3,4-dihydroxybenzaldehyde (the compound of Formula 5-41), 3.6 g of 3,5-bis(trifluoromethyl)benzaldehyde (the compound of Formula 5-27), 0.19 g of 4-(methylthio)benzaldehyde (the compound of Formula 5-45), and 0.52 g of p-toluenesulfonic acid monohydrate were added and dissolved. After purging the reactor with nitrogen, the reaction was allowed to proceed at 140° C. for four hours, yielding a novolac polymer solution. The main structural formulae of the resulting polymer are shown as (Formula 10-2), (Formula 10-3), and (Formula 10-27). The resulting solution was added into a solution of methanol:water=1:9, yielding a black novolac polymer. A GPC analysis was conducted to show that the resulting novolac polymer had a weight average molecular weight of 3172.

Synthesis Example 50

In 2882 g of propyleneglycol monomethyl ether, 4.0 g of 1,5-dihydroxynaphthalene (the compound of Formula 3-18), 1.38 g of 3,4-dihydroxybenzaldehyde (the compound of Formula 5-41), 3.32 g of 3,5-bis(trifluoromethyl)benzaldehyde (the compound of Formula 5-27), 0.38 g of 4-(methylthio)benzaldehyde (the compound of Formula 5-45), and 0.52 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-27). A GPC analysis was conducted to show that the resulting novolac polymer had a weight average molecular weight of 3080.

Synthesis Example 51

In 28.48 g of propyleneglycol monomethyl ether, 4.0 g of 1,5-dihydroxynaphthalene (the compound of Formula 3-18), 1.38 g of 3,4-dihydroxybenzaldehyde (the compound of Formula 5-41), 3.02 g of 3,5-bis(trifluoromethyl)benzaldehyde (the compound of Formula 5-27), 0.57 g of 4-(methylthio)benzaldehyde (the compound of Formula 5-45), and 0.52 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-27). A GPC analysis was conducted to show that the resulting novolac polymer had a weight average molecular weight of 3286.

Synthesis Example 52

In 29.13 g of propyleneglycol monomethyl ether, 4.0 g of 1,5-dihydroxynaphthalene (the compound of Formula 3-18), 1.38 g of 3,4-dihydroxybenzaldehyde (the compound of Formula 5-41), 3.02 g of 3,5-bis(trifluoromethyl)benzaldehyde (the compound of Formula 5-27), 0.76 g of 4-(methylthio)benzaldehyde (the compound of Formula 5-45), and 0.54 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-2), (Formula 10-3), and (Formula 10-27). A GPC analysis was conducted to show that the resulting novolac polymer had a weight average molecular weight of 3308.

Synthesis Example 53

In 18.74 g of propyleneglycol monomethyl ether, 9.0 g of 2,2-bis(4-hydroxyphenyl)hexafluoropropane (the compound of Formula 5-20), 2.91 g of 2,6-bis(hydroxymethyl)-p-cresol (the compound of Formula 7-2), and 0.52 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a white novolac polymer. The main structural formula of the resulting polymer is shown as (Formula 10-28). A GPC analysis was conducted to show that the resulting novolac polymer had a weight average molecular weight of 4073.

Synthesis Example 54

In 17.47 g of propyleneglycol monomethyl ether, 9.0 g of 2,2-bis(4-hydroxyphenyl)hexafluoropropane (the compound of Formula 5-20), 2.25 g of 2,6-bis(hydroxymethyl)-p-cresol (the compound of Formula 7-2), and 0.399 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a white novolac polymer. The main structural formula of the resulting polymer is shown as (Formula 10-28). A GPC analysis was conducted to show that the resulting novolac polymer had a weight average molecular weight of 3019.

Synthesis Example 55

In 24.13 g of propyleneglycol monomethyl ether, 5.0 g of phloroglucinol (the compound of Formula 3-16), 0.96 g of bis(4-hydroxyphenyl)sulfide (the compound of Formula 5-15), 3.04 g of 3,4-dihydroxybenzaldehyde (the compound of Formula 5-41), 5.33 g of 3,5-bis(trifluoromethyl)benzaldehyde (the compound of Formula 5-27), and 1.75 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-5), (Formula 10-29), (Formula 10-30), and (Formula 10-31). A GPC analysis was conducted to show that the resulting novolac polymer had a weight average molecular weight of 2010.

Synthesis Example 56

In 24.34 g of propyleneglycol monomethyl ether, 5.0 g of phloroglucinol (the compound of Formula 3-16), 1.13 g of bis(4-hydroxyphenyl)sulfone (the compound of Formula 5-14), 3.04 g of 3,4-dihydroxybenzaldehyde (the compound of Formula 5-41), 5.33 g of 3,5-bis(trifluoromethyl)benzaldehyde (the compound of Formula 5-27), and 1.75 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-5), (Formula 10-29), (Formula 10-32), and (Formula 10-33). A GPC analysis was conducted to show that the resulting novolac polymer had a weight average molecular weight of 1992.

Synthesis Example 57

In 22.67 g of propyleneglycol monomethyl ether, 5.0 g of phloroglucinol (the compound of Formula 3-16), 0.52 g of 2,2',4,4'-tetrahydroxydiphenyl sulfide (the compound of Formula 5-21), 2.88 g of 3,4-dihydroxybenzaldehyde (the compound of Formula 5-41), 5.05 g of 3,5-bis(trifluoromethyl)benzaldehyde (the compound of Formula 5-27), and 1.66 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-5), (Formula 10-29), (Formula 10-34), and (Formula 10-35). A GPC analysis was conducted to show that the resulting novolac polymer had a weight average molecular weight of 1855.

Synthesis Example 58

In 24.34 g of propyleneglycol monomethyl ether, 5.0 g of phloroglucinol (the compound of Formula 3-16), 1.10 g of 2,2',4,4'-tetrahydroxydiphenyl sulfide (the compound of Formula 5-21), 3.04 g of 3,4-dihydroxybenzaldehyde (the compound of Formula 5-41), 5.33 g of 3,5-bis(trifluoromethyl)benzaldehyde (the compound of Formula 5-27), and 1.75 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-5), (Formula 10-29), (Formula 10-34), and (Formula 10-35). A GPC analysis was conducted to show that the resulting novolac polymer had a weight average molecular weight of 1831.

Synthesis Example 59

In 24.34 g of propyleneglycol monomethyl ether, 5.0 g of phloroglucinol (the compound of Formula 3-16), 1.10 g of 2,4'-dihydroxydiphenyl sulfone (the compound of Formula 5-22), 3.04 g of 3,4-dihydroxybenzaldehyde (the compound of Formula 5-41), 5.33 g of 3,5-bis(trifluoromethyl)benzaldehyde (the compound of Formula 5-27), and 1.75 g of p-toluenesulfonic acid monohydrate were added and dissolved. After purging the reactor with nitrogen, the reaction was allowed to proceed at 140° C. for four hours, yielding a novolac polymer solution. The resulting solution was added into a solution of methanol:water=1:9, yielding a black novolac polymer. The main structural formulae of the resulting polymer are shown as (Formula 10-5), (Formula 10-29), (Formula 10-36), and (Formula 10-37). A GPC analysis was conducted to show that the resulting novolac polymer had a weight average molecular weight of 1758.

Example 1

In 0.6 g of the polymer obtained in Synthesis Example 1, 19.4 g of diisoamyl ether was added and dissolved. Then, the solution was filtered using a polyethylene microfilter having a pore diameter of 0.05 μm to prepare a resist overlayer film forming composition to be used for lithography.

Example 2

In 0.6 g of the polymer obtained in Synthesis Example 1, 19.4 g of dibutyl ether was added and dissolved. Then, the solution was filtered using a polyethylene microfilter having a pore diameter of 0.05 μm to prepare a resist overlayer film forming composition to be used for lithography.

Example 3

In 0.6 g of the polymer obtained in Synthesis Example 2, 19.4 g of diisoamyl ether was added and dissolved. Then, the solution was filtered using a polyethylene microfilter having a pore diameter of 0.05 μm to prepare a resist overlayer film forming composition to be used for lithography.

Example 4

In 0.6 g of the polymer obtained in Synthesis Example 3, 19.4 g of diisoamyl ether was added and dissolved. Then, the solution was filtered using a polyethylene microfilter having a pore diameter of 0.05 μm to prepare a resist overlayer film forming composition to be used for lithography.

Example 5

In 0.6 g of the polymer obtained in Synthesis Example 4, 19.4 g of diisoamyl ether was added and dissolved. Then, the solution was filtered using a polyethylene microfilter having a pore diameter of 0.05 μm to prepare a resist overlayer film forming composition to be used for lithography.

Example 6

In 0.6 g of the polymer obtained in Synthesis Example 5, 19.4 g of diisoamyl ether was added and dissolved. Then, the solution was filtered using a polyethylene microfilter having a pore diameter of 0.05 μm to prepare a resist overlayer film forming composition to be used for lithography.

Example 7

In 0.6 g of the polymer obtained in Synthesis Example 6, 19.4 g of diisoamyl ether was added and dissolved. Then, the solution was filtered using a polyethylene microfilter having a pore diameter of 0.05 μm to prepare a resist overlayer film forming composition to be used for lithography.

Example 8

In 0.6 g of the polymer obtained in Synthesis Example 7, 19.4 g of diisoamyl ether was added and dissolved. Then, the solution was filtered using a polyethylene microfilter having a pore diameter of 0.05 μm to prepare a resist overlayer film forming composition to be used for lithography.

Example 9

In 0.6 g of the polymer obtained in Synthesis Example 8, 19.4 g of diisoamyl ether was added and dissolved. Then, the solution was filtered using a polyethylene microfilter having a pore diameter of 0.05 μm to prepare a resist overlayer film forming composition to be used for lithography.

Example 10

In 0.6 g of the polymer obtained in Synthesis Example 9, 19.4 g of diisoamyl ether was added and dissolved. Then, the solution was filtered using a polyethylene microfilter having a pore diameter of 0.05 μm to prepare a resist overlayer film forming composition to be used for lithography.

Example 11

In 3.0 g of the polymer solution obtained in Synthesis Example 10, 27.0 g of dibutyl ether was added and dissolved. Then, the solution was filtered using a polyethylene microfilter having a pore diameter of 0.05 µm to prepare a resist overlayer film forming composition to be used for lithography.

Example 12

In 0.6 g of the polymer obtained in Synthesis Example 1, 18.4 g of diisoamyl ether and 0.97 g of 4-methyl-2-pentanol was added and dissolved. Then, the solution was filtered using a polyethylene microfilter having a pore diameter of 0.05 µm to prepare a resist overlayer film forming composition to be used for lithography.

Example 13

In 0.6 g of the polymer obtained in Synthesis Example 1, 17.4 g of diisoamyl ether and 1.97 g of 4-methyl-2-pentanol was added and dissolved. Then, the solution was filtered using a polyethylene microfilter having a pore diameter of 0.05 µm to prepare a resist overlayer film forming composition to be used for lithography.

Example 14

In 0.6 g of the polymer obtained in Synthesis Example 1, 19.4 g of diisobutyl ether was added and dissolved. Then, the solution was filtered using a polyethylene microfilter having a pore diameter of 0.05 µm to prepare a resist overlayer film forming composition to be used for lithography.

Example 15

In 0.6 g of the polymer obtained in Synthesis Example 1, 16.5 g of diisoamyl ether and 2.91 g of 4-methyl-2-pentanol was added and dissolved. Then, the solution was filtered using a polyethylene microfilter having a pore diameter of 0.05 µm to prepare a resist overlayer film forming composition to be used for lithography.

Example 16

In 3.0 g of the polymer obtained in Synthesis Example 11, 27.0 g of diisoamyl ether was added and dissolved. Then, the solution was filtered using a polyethylene microfilter having a pore diameter of 0.05 µm to prepare a resist overlayer film forming composition to be used for lithography.

Example 17

In 3.0 g of the polymer obtained in Synthesis Example 12, 27.0 g of diisoamyl ether was added and dissolved. Then, the solution was filtered using a polyethylene microfilter having a pore diameter of 0.05 µm to prepare a resist overlayer film forming composition to be used for lithography.

Example 18

In 3.0 g of the polymer obtained in Synthesis Example 13, 27.0 g of diisoamyl ether was added and dissolved. Then, the solution was filtered using a polyethylene microfilter having a pore diameter of 0.05 µm to prepare a resist overlayer film forming composition to be used for lithography.

Example 19

In 3.0 g of the polymer obtained in Synthesis Example 14, 27.0 g of diisoamyl ether was added and dissolved. Then, the solution was filtered using a polyethylene microfilter having a pore diameter of 0.05 µm to prepare a resist overlayer film forming composition to be used for lithography.

Example 20

In 3.0 g of the polymer obtained in Synthesis Example 15, 27.0 g of diisoamyl ether was added and dissolved. Then, the solution was filtered using a polyethylene microfilter having a pore diameter of 0.05 µm to prepare a resist overlayer film forming composition to be used for lithography.

Example 21

In 3.0 g of the polymer obtained in Synthesis Example 16, 27.0 g of diisoamyl ether was added and dissolved. Then, the solution was filtered using a polyethylene microfilter having a pore diameter of 0.05 µm to prepare a resist overlayer film forming composition to be used for lithography.

Example 22

In 3.0 g of the polymer obtained in Synthesis Example 17, 27.0 g of diisoamyl ether was added and dissolved. Then, the solution was filtered using a polyethylene microfilter having a pore diameter of 0.05 µm to prepare a resist overlayer film forming composition to be used for lithography.

Example 23

In 3.0 g of the polymer obtained in Synthesis Example 18, 27.0 g of diisoamyl ether was added and dissolved. Then, the solution was filtered using a polyethylene microfilter having a pore diameter of 0.05 µm to prepare a resist overlayer film forming composition to be used for lithography.

Example 24

In 3.0 g of the polymer obtained in Synthesis Example 19, 27.0 g of diisoamyl ether was added and dissolved. Then, the solution was filtered using a polyethylene microfilter having a pore diameter of 0.05 µm to prepare a resist overlayer film forming composition to be used for lithography.

Example 25

In 3.0 g of the polymer obtained in Synthesis Example 20, 27.0 g of diisoamyl ether was added and dissolved. Then, the solution was filtered using a polyethylene microfilter having a pore diameter of 0.05 µm to prepare a resist overlayer film forming composition to be used for lithography.

Example 26

In 3.0 g of the polymer obtained in Synthesis Example 21, 27.0 g of diisoamyl ether was added and dissolved. Then, the solution was filtered using a polyethylene microfilter having a pore diameter of 0.05 µm to prepare a resist overlayer film forming composition to be used for lithography.

Example 27

In 3.0 g of the polymer obtained in Synthesis Example 22, 27.0 g of diisoamyl ether was added and dissolved. Then, the solution was filtered using a polyethylene microfilter having a pore diameter of 0.05 µm to prepare a resist overlayer film forming composition to be used for lithography.

Example 28

In 3.0 g of the polymer obtained in Synthesis Example 23, 27.0 g of diisoamyl ether was added and dissolved. Then, the solution was filtered using a polyethylene microfilter having a pore diameter of 0.05 µm to prepare a resist overlayer film forming composition to be used for lithography.

Example 29

In 3.0 g of the polymer obtained in Synthesis Example 24, 27.0 g of diisoamyl ether was added and dissolved. Then, the solution was filtered using a polyethylene microfilter having a pore diameter of 0.05 µm to prepare a resist overlayer film forming composition to be used for lithography.

Example 30

In 3.0 g of the polymer obtained in Synthesis Example 25, 27.0 g of diisoamyl ether was added and dissolved. Then, the solution was filtered using a polyethylene microfilter having a pore diameter of 0.05 µm to prepare a resist overlayer film forming composition to be used for lithography.

Example 31

In 3.0 g of the polymer obtained in Synthesis Example 26, 27.0 g of diisoamyl ether was added and dissolved. Then, the solution was filtered using a polyethylene microfilter having a pore diameter of 0.05 µm to prepare a resist overlayer film forming composition to be used for lithography.

Example 32

In 3.0 g of the polymer obtained in Synthesis Example 27, 27.0 g of diisoamyl ether was added and dissolved. Then, the solution was filtered using a polyethylene microfilter having a pore diameter of 0.05 µM to prepare a resist overlayer film forming composition to be used for lithography.

Example 33

In 3.0 g of the polymer obtained in Synthesis Example 28, 27.0 g of diisoamyl ether was added and dissolved. Then, the solution was filtered using a polyethylene microfilter having a pore diameter of 0.05 µm to prepare a resist overlayer film forming composition to be used for lithography.

Example 34

In 3.0 g of the polymer obtained in Synthesis Example 29, 27.0 g of diisoamyl ether was added and dissolved. Then, the solution was filtered using a polyethylene microfilter having a pore diameter of 0.05 µm to prepare a resist overlayer film forming composition to be used for lithography.

Example 35

In 3.0 g of the polymer obtained in Synthesis Example 30, 27.0 g of diisoamyl ether was added and dissolved. Then, the solution was filtered using a polyethylene microfilter having a pore diameter of 0.05 µm to prepare a resist overlayer film forming composition to be used for lithography.

Example 36

In 3.0 g of the polymer obtained in Synthesis Example 31, 27.0 g of diisoamyl ether was added and dissolved. Then, the solution was filtered using a polyethylene microfilter having a pore diameter of 0.05 µm to prepare a resist overlayer film forming composition to be used for lithography.

Example 37

In 3.0 g of the polymer obtained in Synthesis Example 32, 27.0 g of diisoamyl ether was added and dissolved. Then, the solution was filtered using a polyethylene microfilter having a pore diameter of 0.05 µm to prepare a resist overlayer film forming composition to be used for lithography.

Example 38

In 3.0 g of the polymer obtained in Synthesis Example 33, 27.0 g of diisoamyl ether was added and dissolved. Then, the solution was filtered using a polyethylene microfilter having a pore diameter of 0.05 µm to prepare a resist overlayer film forming composition to be used for lithography.

Example 39

In 3.0 g of the polymer obtained in Synthesis Example 34, 27.0 g of diisoamyl ether was added and dissolved. Then, the solution was filtered using a polyethylene microfilter having a pore diameter of 0.05 µm to prepare a resist overlayer film forming composition to be used for lithography.

Example 40

In 3.0 g of the polymer obtained in Synthesis Example 35, 27.0 g of diisoamyl ether was added and dissolved. Then, the solution was filtered using a polyethylene microfilter having a pore diameter of 0.05 µm to prepare a resist overlayer film forming composition to be used for lithography.

Example 41

In 3.0 g of the polymer obtained in Synthesis Example 36, 27.0 g of diisoamyl ether was added and dissolved. Then, the solution was filtered using a polyethylene microfilter having a pore diameter of 0.05 µm to prepare a resist overlayer film forming composition to be used for lithography.

Example 42

In 3.0 g of the polymer obtained in Synthesis Example 37, 27.0 g of diisoamyl ether was added and dissolved. Then, the solution was filtered using a polyethylene microfilter having a pore diameter of 0.05 µm to prepare a resist overlayer film forming composition to be used for lithography.

Example 43

In 3.0 g of the polymer obtained in Synthesis Example 38, 27.0 g of diisoamyl ether was added and dissolved. Then, the solution was filtered using a polyethylene microfilter having a pore diameter of 0.05 µm to prepare a resist overlayer film forming composition to be used for lithography.

Example 44

In 3.0 g of the polymer obtained in Synthesis Example 39, 27.0 g of diisoamyl ether was added and dissolved. Then, the solution was filtered using a polyethylene microfilter having a pore diameter of 0.05 μm to prepare a resist overlayer film forming composition to be used for lithography.

Example 45

In 3.0 g of the polymer obtained in Synthesis Example 40, 27.0 g of diisoamyl ether was added and dissolved. Then, the solution was filtered using a polyethylene microfilter having a pore diameter of 0.05 μm to prepare a resist overlayer film forming composition to be used for lithography.

Example 46

In 3.0 g of the polymer obtained in Synthesis Example 41, 27.0 g of diisoamyl ether was added and dissolved. Then, the solution was filtered using a polyethylene microfilter having a pore diameter of 0.05 μm to prepare a resist overlayer film forming composition to be used for lithography.

Example 47

In 3.0 g of the polymer obtained in Synthesis Example 42, 27.0 g of diisoamyl ether was added and dissolved. Then, the solution was filtered using a polyethylene microfilter having a pore diameter of 0.05 μm to prepare a resist overlayer film forming composition to be used for lithography.

Example 48

In 3.0 g of the polymer obtained in Synthesis Example 43, 27.0 g of diisoamyl ether was added and dissolved. Then, the solution was filtered using a polyethylene microfilter having a pore diameter of 0.05 μm to prepare a resist overlayer film forming composition to be used for lithography.

Example 49

In 3.0 g of the polymer obtained in Synthesis Example 44, 27.0 g of diisoamyl ether was added and dissolved. Then, the solution was filtered using a polyethylene microfilter having a pore diameter of 0.05 μm to prepare a resist overlayer film forming composition to be used for lithography.

Example 50

In 3.0 g of the polymer obtained in Synthesis Example 45, 27.0 g of diisoamyl ether was added and dissolved. Then, the solution was filtered using a polyethylene microfilter having a pore diameter of 0.05 μm to prepare a resist overlayer film forming composition to be used for lithography.

Example 51

In 3.0 g of the polymer obtained in Synthesis Example 46, 27.0 g of diisoamyl ether was added and dissolved. Then, the solution was filtered using a polyethylene microfilter having a pore diameter of 0.05 μm to prepare a resist overlayer film forming composition to be used for lithography.

Example 52

In 3.0 g of the polymer obtained in Synthesis Example 47, 27.0 g of diisoamyl ether was added and dissolved. Then, the solution was filtered using a polyethylene microfilter having a pore diameter of 0.05 μm to prepare a resist overlayer film forming composition to be used for lithography.

Example 53

In 3.0 g of the polymer obtained in Synthesis Example 48, 27.0 g of diisoamyl ether was added and dissolved. Then, the solution was filtered using a polyethylene microfilter having a pore diameter of 0.05 μm to prepare a resist overlayer film forming composition to be used for lithography.

Example 54

In 3.0 g of the polymer obtained in Synthesis Example 49, 27.0 g of diisoamyl ether was added and dissolved. Then, the solution was filtered using a polyethylene microfilter having a pore diameter of 0.05 μm to prepare a resist overlayer film forming composition to be used for lithography.

Example 55

In 3.0 g of the polymer obtained in Synthesis Example 50, 27.0 g of diisoamyl ether was added and dissolved. Then, the solution was filtered using a polyethylene microfilter having a pore diameter of 0.05 μM to prepare a resist overlayer film forming composition to be used for lithography.

Example 56

In 3.0 g of the polymer obtained in Synthesis Example 51, 27.0 g of diisoamyl ether was added and dissolved. Then, the solution was filtered using a polyethylene microfilter having a pore diameter of 0.05 μm to prepare a resist overlayer film forming composition to be used for lithography.

Example 57

In 3.0 g of the polymer obtained in Synthesis Example 52, 27.0 g of diisoamyl ether was added and dissolved. Then, the solution was filtered using a polyethylene microfilter having a pore diameter of 0.05 μm to prepare a resist overlayer film forming composition to be used for lithography.

Example 58

In 3.0 g of the polymer obtained in Synthesis Example 53, 27.0 g of diisoamyl ether was added and dissolved. Then, the solution was filtered using a polyethylene microfilter having a pore diameter of 0.05 μm to prepare a resist overlayer film forming composition to be used for lithography.

Example 59

In 3.0 g of the polymer obtained in Synthesis Example 54, 27.0 g of diisoamyl ether was added and dissolved. Then, the solution was filtered using a polyethylene microfilter having a pore diameter of 0.05 μm to prepare a resist overlayer film forming composition to be used for lithography.

Example 60

In 3.0 g of the polymer obtained in Synthesis Example 55, 27.0 g of diisoamyl ether was added and dissolved. Then, the solution was filtered using a polyethylene microfilter having a pore diameter of 0.05 μm to prepare a resist overlayer film forming composition to be used for lithography.

Example 61

In 3.0 g of the polymer obtained in Synthesis Example 56, 27.0 g of diisoamyl ether was added and dissolved. Then, the solution was filtered using a polyethylene microfilter having a pore diameter of 0.05 μm to prepare a resist overlayer film forming composition to be used for lithography.

Example 62

In 3.0 g of the polymer obtained in Synthesis Example 57, 27.0 g of diisoamyl ether was added and dissolved. Then, the solution was filtered using a polyethylene microfilter having a pore diameter of 0.05 μm to prepare a resist overlayer film forming composition to be used for lithography.

Example 63

In 3.0 g of the polymer obtained in Synthesis Example 58, 27.0 g of diisoamyl ether was added and dissolved. Then, the solution was filtered using a polyethylene microfilter having a pore diameter of 0.05 μm to prepare a resist overlayer film forming composition to be used for lithography.

Example 64

In 3.0 g of the polymer obtained in Synthesis Example 59, 27.0 g of diisoamyl ether was added and dissolved. Then, the solution was filtered using a polyethylene microfilter having a pore diameter of 0.05 μm to prepare a resist overlayer film forming composition to be used for lithography.

Comparative Example 1

A resist overlayer film forming composition solution was obtained by dissolving 1 g of polyhydroxystyrene resin (commercially available product, weight average molecular weight of 8,000) in 99 g of 4-methyl-2-pentanol.

[Test for Confirming Insolubility of Resist in Ether-based Solvent]

An EUV resist solution (hydroxystyrene (HS)-containing resist) was applied using a spinner. The solution was heated on a hot plate at 100° C. for one minute to form a resist film, and the film thickness was measured.

After the solvents for the resist overlayer film forming compositions (dibutyl ether, diisoamyl ether, diisobutyl ether) and the resist overlayer film compositions of Example 1, Example 12, Example 13, and Example 15 were each applied on the resist film using a spinner and heated on a hot plate at 100° C. for one minute, a puddle of a commercially available alkaline developer (manufactured by Tokyo Ohka Kogyo Co., Ltd., product name: NMD-3) was formed on the resist (in the case of the solvents for the resist overlayer film forming compositions) or on the resist overlayer film (in the case of Example 1, Example 12, Example 13, and Example 15) and left for 60 seconds, followed by rinsing with pure water for 30 seconds while being rotated at 3000 rpm. After rinsing, baking was performed at 100° C. for 60 seconds, and the film thickness was measured.

The degree of film loss of the resist was determined as shown in Table 1. Almost no film loss is shown by ⊙, and the film loss that is slightly greater than ⊙ as the resist overlayer film but poses no problem in practice is shown by ○.

TABLE 1

| Resist Insolubility Confirming Test | |
|---|---|
| Dibutyl ether | ⊙ |
| Diisoamyl ether | ⊙ |
| Diisobutyl ether | ⊙ |
| Example 1 | ⊙ |
| Example 12 | ⊙ |
| Example 13 | ⊙ |
| Example 15 | ○ |

[Intermixing Test with Resist (Positive tone Development (PTD)]

An EUV resist solution (methacrylic resist) was applied using a spinner. The solution was heated on a hot plate at 100° C. for one minute to form a resist film, and the film thickness was measured (film thickness A: resist film thickness).

The resist overlayer film forming composition solutions prepared in Example 1 to Example 64 of the present invention and Comparative Example 1 were each applied on the resist film using a spinner and heated on a hot plate at 100° C. for one minute to form a resist overlayer film, and the film thickness was measured (film thickness B: the sum of the film thicknesses of the resist and the resist overlayer film).

A puddle of a commercially available alkaline developer (manufactured by Tokyo Ohka Kogyo Co., Ltd., product name: NMD-3) was formed on the resist overlayer film and left for 60 seconds, followed by rinsing with pure water for 30 seconds while being rotated at 3000 rpm. After rinsing, baking was performed at 100° C. for 60 seconds, and the film thickness was measured (film thickness C).

If film thickness A is equal to film thickness C, it shows that there is no intermixing with the resist and the product is applicable as a resist overlayer film for a PTD process.

TABLE 2

| Film Thickness Measurement | | | |
|---|---|---|---|
| | Film thickness A (nm) | Film thickness B (nm) | Film thickness C (nm) |
| Example 1 | 56 | 86 | 56 |
| Example 2 | 56 | 86 | 56 |
| Example 3 | 56 | 86 | 56 |
| Example 4 | 56 | 86 | 56 |
| Example 5 | 56 | 86 | 56 |
| Example 6 | 56 | 86 | 56 |
| Example 7 | 56 | 86 | 56 |
| Example 8 | 56 | 86 | 56 |
| Example 9 | 56 | 86 | 86 |
| Example 10 | 56 | 86 | 86 |
| Example 11 | 56 | 86 | 86 |
| Example 12 | 56 | 86 | 56 |
| Example 13 | 56 | 86 | 56 |
| Example 14 | 56 | 86 | 56 |
| Example 15 | 56 | 86 | 56 |
| Example 16 | 56 | 86 | 56 |
| Example 17 | 56 | 86 | 56 |
| Example 18 | 56 | 86 | 56 |
| Example 19 | 56 | 86 | 56 |
| Example 20 | 56 | 86 | 56 |
| Example 21 | 56 | 86 | 56 |
| Example 22 | 56 | 86 | 56 |
| Example 23 | 56 | 86 | 56 |
| Example 24 | 56 | 86 | 56 |
| Example 25 | 56 | 86 | 56 |
| Example 26 | 56 | 86 | 56 |
| Example 27 | 56 | 86 | 56 |
| Example 28 | 56 | 86 | 56 |
| Example 29 | 56 | 86 | 56 |

TABLE 2-continued

Film Thickness Measurement

|  | Film thickness A (nm) | Film thickness B (nm) | Film thickness C (nm) |
|---|---|---|---|
| Example 30 | 56 | 86 | 56 |
| Example 31 | 56 | 86 | 56 |
| Example 32 | 56 | 86 | 56 |
| Example 33 | 56 | 86 | 56 |
| Example 34 | 56 | 86 | 56 |
| Example 35 | 56 | 86 | 56 |
| Example 36 | 56 | 86 | 56 |
| Example 37 | 56 | 86 | 56 |
| Example 38 | 56 | 86 | 56 |
| Example 39 | 56 | 86 | 56 |
| Example 40 | 56 | 86 | 56 |
| Example 41 | 56 | 86 | 56 |
| Example 42 | 56 | 86 | 56 |
| Example 43 | 56 | 86 | 56 |
| Example 44 | 56 | 86 | 56 |
| Example 45 | 56 | 86 | 56 |
| Example 46 | 56 | 86 | 56 |
| Example 47 | 56 | 86 | 56 |
| Example 48 | 56 | 86 | 56 |
| Example 49 | 56 | 86 | 56 |
| Example 50 | 56 | 86 | 56 |
| Example 51 | 56 | 86 | 56 |
| Example 52 | 56 | 86 | 56 |
| Example 53 | 56 | 86 | 56 |
| Example 54 | 56 | 86 | 56 |
| Example 55 | 56 | 86 | 56 |
| Example 56 | 56 | 86 | 56 |
| Example 57 | 56 | 86 | 56 |
| Example 58 | 56 | 86 | 56 |
| Example 59 | 56 | 86 | 56 |
| Example 60 | 56 | 86 | 56 |
| Example 61 | 56 | 86 | 56 |
| Example 62 | 56 | 86 | 56 |
| Example 63 | 56 | 86 | 56 |
| Example 64 | 56 | 86 | 56 |
| Comparative Example 1 | 56 | 86 | 56 |

[Application Test to Negative tone Development (NTD) Process]

The resist overlayer film forming composition solutions prepared in Example 1 to Example 64 of the present invention and Comparative Example 1 were each applied on a wafer using a spinner and heated on a hot plate at 100° C. for one minute to form a resist overlayer film, and the film thickness was measured (film thickness A: the film thickness of the resist overlayer film).

A puddle of butyl acetate (solvent developer), which is often used in an NTD process, was formed on the resist overlayer film, left for 60 seconds, and rotated at 3000 rpm. After that, baking was performed at 100° C. for 60 seconds, and the film thickness was measured (film thickness B).

If film thickness B is 0 nm, it can be said that the resist overlayer film was able to be removed by the developer. This suggests that the composition of the present invention is also applicable as a resist overlayer film for an NTD process.

TABLE 3

Film Thickness Measurement

|  | Film thickness A (nm) | Film thickness B (nm) |
|---|---|---|
| Example 1 | 30 | 0 |
| Example 2 | 30 | 0 |
| Example 3 | 30 | 0 |
| Example 4 | 30 | 0 |
| Example 5 | 30 | 0 |
| Example 6 | 30 | 0 |
| Example 7 | 30 | 0 |
| Example 8 | 30 | 0 |
| Example 9 | 30 | 0 |
| Example 10 | 30 | 0 |
| Example 11 | 30 | 0 |
| Example 12 | 30 | 0 |
| Example 13 | 30 | 0 |
| Example 14 | 30 | 0 |
| Example 15 | 30 | 0 |
| Example 16 | 30 | 0 |
| Example 17 | 30 | 0 |
| Example 18 | 30 | 0 |
| Example 19 | 30 | 0 |
| Example 20 | 30 | 0 |
| Example 21 | 30 | 0 |
| Example 22 | 30 | 0 |
| Example 23 | 30 | 0 |
| Example 24 | 30 | 0 |
| Example 25 | 30 | 0 |
| Example 26 | 30 | 0 |
| Example 27 | 30 | 0 |
| Example 28 | 30 | 0 |
| Example 29 | 30 | 0 |
| Example 30 | 30 | 0 |
| Example 31 | 30 | 0 |
| Example 32 | 30 | 0 |
| Example 33 | 30 | 0 |
| Example 34 | 30 | 0 |
| Example 35 | 30 | 0 |
| Example 36 | 30 | 0 |
| Example 37 | 30 | 0 |
| Example 38 | 30 | 0 |
| Example 39 | 30 | 0 |
| Example 40 | 30 | 0 |
| Example 41 | 30 | 0 |
| Example 42 | 30 | 0 |
| Example 43 | 30 | 0 |
| Example 44 | 30 | 0 |
| Example 45 | 30 | 0 |
| Example 46 | 30 | 0 |
| Example 47 | 30 | 0 |
| Example 48 | 30 | 0 |
| Example 49 | 30 | 0 |
| Example 50 | 30 | 0 |
| Example 51 | 30 | 0 |
| Example 52 | 30 | 0 |
| Example 53 | 30 | 0 |
| Example 54 | 30 | 0 |
| Example 55 | 30 | 0 |
| Example 56 | 30 | 0 |
| Example 57 | 30 | 0 |
| Example 58 | 30 | 0 |
| Example 59 | 30 | 0 |
| Example 60 | 30 | 0 |
| Example 61 | 30 | 0 |
| Example 62 | 30 | 0 |
| Example 63 | 30 | 0 |
| Example 64 | 30 | 0 |
| Comparative Example 1 | 30 | 30 |

[Optical Parameter Test]

The resist overlayer film forming composition solutions prepared in Example 1 to Example 64 of the present invention and Comparative Example 1 were each applied on a quartz substrate using a spinner. The solution was heated on a hot plate at 100° C. for one minute to form a resist overlayer film (film thickness of 30 nm). For these 60 kinds of resist overlayer films, the absorptance at wavelengths of 190 nm to 260 nm was measured using a spectrophotometer.

The transmissivity at 13.5 nm was calculated by simulation based on the relation between the element composition ratio and the film density.

The property of blocking DUV light is considered to be good if the largest value of absorptance is 40% or higher and to be poor if lower than 40%, in a wavelength band of 220 nm to 260 nm. The transmissivity of EUV light (13.5 nm) is considered to be good if the transmittance is 80% or higher and to be poor if lower than 80%.

The resist overlayer film obtained from the resist overlayer film forming composition in each Example is superior in blocking DUV light to the resist overlayer film obtained from the resist overlayer film forming composition of Comparative Example 1.

TABLE 4

EUV Transmissivity and DUV Blocking Property

| | Film thickness (nm) | EUV Light Transmissivity | DUV light Blocking |
|---|---|---|---|
| Example 1 | 30 | good | good |
| Example 2 | 30 | good | good |
| Example 3 | 30 | good | good |
| Example 4 | 30 | good | good |
| Example 5 | 30 | good | good |
| Example 6 | 30 | good | good |
| Example 7 | 30 | good | good |
| Example 8 | 30 | good | good |
| Example 9 | 30 | good | good |
| Example 10 | 30 | good | good |
| Example 11 | 30 | good | good |
| Example 12 | 30 | good | good |
| Example 13 | 30 | good | good |
| Example 14 | 30 | good | good |
| Example 15 | 30 | good | good |
| Example 16 | 30 | good | good |
| Example 17 | 30 | good | good |
| Example 18 | 30 | good | good |
| Example 19 | 30 | good | good |
| Example 20 | 30 | good | good |
| Example 21 | 30 | good | good |
| Example 22 | 30 | good | good |
| Example 23 | 30 | good | good |
| Example 24 | 30 | good | good |
| Example 25 | 30 | good | good |
| Example 26 | 30 | good | good |
| Example 27 | 30 | good | good |
| Example 28 | 30 | good | good |
| Example 29 | 30 | good | good |
| Example 30 | 30 | good | good |
| Example 31 | 30 | good | good |
| Example 32 | 30 | good | good |
| Example 33 | 30 | good | good |
| Example 34 | 30 | good | good |
| Example 35 | 30 | good | good |
| Example 36 | 30 | good | good |
| Example 37 | 30 | good | good |
| Example 38 | 30 | good | good |
| Example 39 | 30 | good | good |
| Example 40 | 30 | good | good |
| Example 41 | 30 | good | good |
| Example 42 | 30 | good | good |
| Example 43 | 30 | good | good |
| Example 44 | 30 | good | good |
| Example 45 | 30 | good | good |
| Example 46 | 30 | good | good |
| Example 47 | 30 | good | good |
| Example 48 | 30 | good | good |
| Example 49 | 30 | good | good |
| Example 50 | 30 | good | good |
| Example 51 | 30 | good | good |
| Example 52 | 30 | good | good |
| Example 53 | 30 | good | good |
| Example 54 | 30 | good | good |
| Example 55 | 30 | good | good |

TABLE 4-continued

EUV Transmissivity and DUV Blocking Property

| | Film thickness (nm) | EUV Light Transmissivity | DUV light Blocking |
|---|---|---|---|
| Example 56 | 30 | good | good |
| Example 57 | 30 | good | good |
| Example 58 | 30 | good | good |
| Example 59 | 30 | good | good |
| Example 60 | 30 | good | good |
| Example 61 | 30 | good | good |
| Example 62 | 30 | good | good |
| Example 63 | 30 | good | good |
| Example 64 | 30 | good | good |
| Comparative Example 1 | 30 | 30 | poor |

INDUSTRIAL APPLICABILITY

The present invention provides a composition for forming an EUV resist overlayer film for use in an EUV lithography process or a resist overlayer film for a lithography process in other exposure wavelengths, which does not intermix with a resist, blocks undesirable exposure light, for example, UV and DUV and selectively transmits EUV alone, for example, in EUV exposure, and can be developed with a developer after exposure.

The invention claimed is:

1. A resist overlayer film forming composition comprising:

a polymer including an organic group including a linear or branched saturated alkyl group having a carbon atom number of 1 to 10, in which some or all of hydrogen atoms thereof are substituted with fluorine atoms, and an optionally substituted $C_{8-16}$ ether compound as a solvent, wherein the polymer includes a unit structure of any one of (Formula 1-1-1) to (Formula 1-4-1) below:

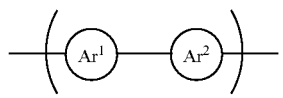

(Formula 1-1-1)

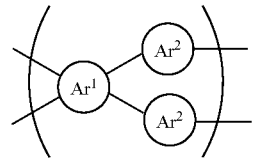

(Formula 1-2-1)

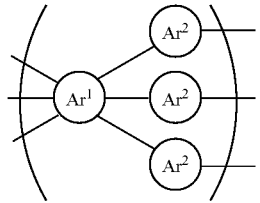

(Formula 1-3-1)

-continued (Formula 1-4-1)

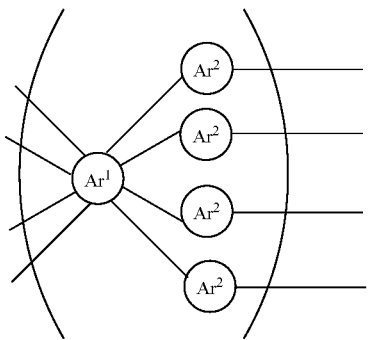

in (Formula 1-1-1) to (Formula 1-4-1), $Ar^1$ is an organic group including a $C_{6-18}$ aromatic ring; $Ar^2$ is a methylene group, a tertiary carbon atom, or an organic group including a $C_{6-18}$ aromatic ring optionally bonded with $Ar^1$ through a methylene group or a tertiary carbon atom; the organic group including the aromatic ring included in $Ar^1$ or $Ar^2$ includes an organic group including a linear or branched saturated alkyl group having a carbon atom number of 1 to 10, in which some or all of hydrogen atoms thereof are substituted with fluorine atoms, where the number of the organic group including a linear or branched saturated alkyl group having a carbon atom number of 1 to 10 included in Ar1 or $Ar^2$ is an integer of 1 to 10; and a hydrogen atom of the aromatic ring in $Ar^1$ or $Ar^2$ is optionally substituted with a hydroxy group, a halogen atom, a carboxy group, a nitro group, a cyano group, a methylenedioxy group, an acetoxy group, a methylthio group, a $C_{1-9}$ alkoxy group, an amino group having a hydrogen atom optionally substituted with a $C_{1-3}$ linear alkyl group, a linear, branched, or cyclic saturated alkyl group having a carbon atom number of 1 to 6 or a linear or branched alkyl halide group having a carbon atom number of 1 to 6 in which a hydrogen atom is optionally substituted with a hydroxy group, or a combination of these groups, where the number of substituents for the hydrogen atom of the aromatic ring in $Ar^1$ or $Ar^2$ is an integer of 0 to 10.

2. The resist overlayer film forming composition according to claim 1, wherein $Ar^1$ is an organic group of (Formula 2-a) to (Formula 2-e) below or a combination thereof, the aromatic ring included in $Ar^1$ is bonded with $Ar^2$, and $Ar^2$ is a methylene group, an organic group of (Formula 3) below or (Formula 3-1) below:

(Formula 2-a)

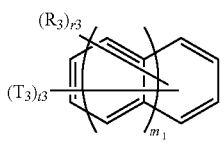

(Formula 2-b)

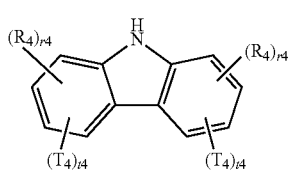

(Formula 2-c)

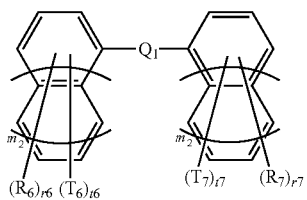

(Formula 2-d)

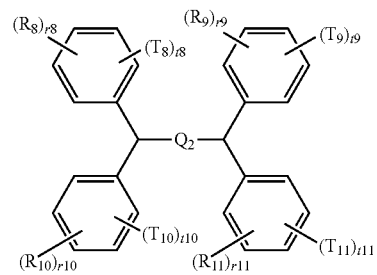

(Formula 2-e)

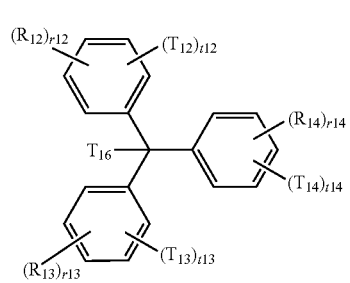

(Formula 3)

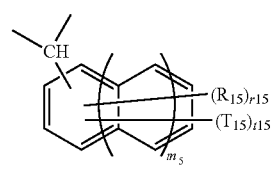

(Formula 3-1)

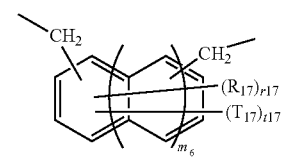

in (Formula 2-a) to (Formula 2-e), (Formula 3), and (Formula 3-1), $R_3$ to $R_{15}$ and $R_{17}$ are independently an organic group including a linear or branched saturated alkyl group having a carbon atom number of 1 to 10, in which some or all of hydrogen atoms thereof are substituted with fluorine atoms; $T_3$ to $T_{17}$ are independently a hydroxy group, a halogen atom, a carboxy group, a nitro group, a cyano group, a methylenedioxy group, an acetoxy group, a methylthio group, a $C_{1-9}$ alkoxy group, an amino group having a hydrogen atom optionally substituted with a $C_{1-3}$ linear alkyl group, a linear, branched, or cyclic saturated alkyl group having a carbon atom number of 1 to 6 or a linear or branched alkyl halide group having a carbon atom number of 1 to 6 in which a hydrogen atom is optionally substituted with a hydroxy group, or a combination of these groups; $Q_1$ and $Q_2$ are a single bond, an oxygen atom, a sulfur atom, a sulfonyl group, a carbonyl group, an imino group, a $C_{6-40}$ arylene group, a linear or branched alkylene group having a carbon atom number of 1 to 10 in which a hydrogen atom is optionally substituted with a halogen atom, or a combination of these groups; the alkylene group optionally forms a ring; m1, m2, m5, m6, r4, r5, r8 to r14, t4, t5, and t8 to t14 are independently an integer of 0 to 2; r3, r6, r7, r17, t3, t6, t7, and t17 are independently an integer of 0 to 8; r15 and t15 are independently an integer of 0 to 9; in (Formula 2-a), (Formula 2-b), and (Formula 2-e), the sum of r3 to r15 or r17 that are present in the polymer is an integer of 1 to 10, in which some or all of hydrogen atoms are substituted with fluorine atoms; and in (Formula 2-c) and (Formula 2-d), the sum of r3 to r15 or r17 that are present in the polymer is an integer of 0 to 10; and if the sum of r3 to r15 or r17 in (Formula 2-c) and (Formula 2-d) is 0, at least one of $Q_1$ and $Q_2$ includes at least one linear or branched alkylene group having a carbon atom number of 1 to 10, in which some or all of hydrogen atoms are substituted with fluorine atoms.

3. The resist overlayer film forming composition according to claim 2, wherein in the unit structures of the polymer, any one of $T_3$ to $T_{17}$ includes one or more hydroxy groups.

4. The resist overlayer film forming composition according to claim 2, wherein $R_3$ to $R_{15}$, and $R_{17}$ are an organic group of (Formula 1-7) below:

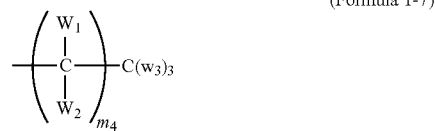

(Formula 1-7)

(in (Formula 1-7), $W_1$ and $W_2$ are independently a hydrogen atom, a fluorine atom, a trifluoromethyl group, a difluoromethyl group, or a monofluoromethyl group; $w_3$ is a hydrogen atom, a fluorine atom, or a combination thereof; at least one of $W_1$, $W_2$ and $w_3$ is the organic group including fluorine or a fluorine atom; m4 is an integer of 0 to 9; and the largest value of the number of carbon atoms included in (Formula 1-7) is 10).

* * * * *